US012712028B2

(12) United States Patent
Tachi

(10) Patent No.: US 12,712,028 B2
(45) Date of Patent: Aug. 18, 2026

(54) SEMICONDUCTOR MEMORY DEVICE

(71) Applicant: Kioxia Corporation, Tokyo (JP)

(72) Inventor: Kiichi Tachi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 86 days.

(21) Appl. No.: 18/586,360

(22) Filed: Feb. 23, 2024

(65) Prior Publication Data

US 2024/0321363 A1 Sep. 26, 2024

(30) Foreign Application Priority Data

Mar. 23, 2023 (JP) ................................ 2023-047415

(51) Int. Cl.

| | |
|---|---|
| ***G11C 16/26*** | (2006.01) |
| ***G11C 5/06*** | (2006.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(Continued)

(52) U.S. Cl.

CPC ................ *G11C 16/26* (2013.01); *G11C 5/06* (2013.01); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 80/00* (2023.02); *H10W 90/00* (2026.01); *H10W 90/752* (2026.01)

(58) Field of Classification Search

CPC ....... G11C 5/063; G11C 7/18; G11C 11/4097; G11C 5/025; G11C 5/04; G11C 16/26; G11C 5/06; G11C 16/0483; H10B 41/10; H10B 41/27; H10B 41/35; H10B 43/10; H10B 43/27; H10B 43/35; H10B 80/00; H10B 43/40; H10W 90/00; H10W 90/752

USPC ..................................................... 365/63, 51

See application file for complete search history.

(56) References Cited

U.S. PATENT DOCUMENTS 11,309,394 B2 4/2022 Haraguchi
2009/0161433 A1 * 6/2009 Lee ....................... G11C 16/30 365/185.12

(Continued)

*Primary Examiner* — Khamdan N. Alrobaie
*Assistant Examiner* — Elizabeth Rose Agger
(74) *Attorney, Agent, or Firm* — Kim & Stewart LLP

(57) ABSTRACT

A semiconductor memory device includes conductive layers stacked in a stacking direction and extending in a first direction intersecting the stacking direction, semiconductor columns extending in the stacking direction and facing the conductive layers, charge storage films provided between the conductive layers and the semiconductor columns, first and second wirings provided on one side in the stacking direction with respect to the conductive layers, arranged in the first direction, and electrically connected to the semiconductor columns, sense amplifier units electrically connected to the first wirings, and a node electrically and commonly connected to the second wirings. One of the sense amplifier units is electrically connected to K1 number of first wirings (where K1 is an integer of 1 or more). The node is electrically connected to K number of second wirings (where K2 is an integer of 2 or more and is greater than K1).

19 Claims, 36 Drawing Sheets

(51) Int. Cl.

| | |
|---|---|
| ***H10B 80/00*** | (2026.01) |
| ***H10W 90/00*** | (2026.01) |
| *H10B 43/40* | (2023.01) |

(56) References Cited

U.S. PATENT DOCUMENTS

| | | | | |
|---|---|---|---|---|
| 2011/0013454 | A1* | 1/2011 | Hishida .................. | H10B 43/40 365/185.11 |
| 2022/0052071 | A1* | 2/2022 | Hashimoto ............ | H10B 43/10 |
| 2023/0056494 | A1* | 2/2023 | Moriyama ............. | G11C 16/16 |
| 2024/0099033 | A1* | 3/2024 | Sato ....................... | H10B 43/27 |

* cited by examiner

ST
ST
HR
$L_{B1}$
$L_{B2}$
120
$R_{DMH}$
$R_{MH}$
$R_{DMH}$
$R_{PTN}$
SU
SU
SU
SU
SU
SU
SU
SU
SU
SU
FS
FS
X
Y
Z

MCA
Z
X
Y
110(SGD)
110(SGD)
110(SGD)
110(SGD)
110(WL)
110(WL)
110(WL)
110(WL)
110(WL)
110(WL)
110(SGS)
110(SGS)
110(SGS)
110(SGS)
112(SL)
BL
120
SHE
SU
FS
142
141
ST

X
Y
Z
ST
OST
110A
OST
$110_{C4}$(SGD)
$110_{C4}$(SGD)
$110_{C4}$(SGD)
ST
$R_{C4A}$
OST
110A
$R_{C4B}$
OST
HR
$R_{C4A}$
$110_{C4}$(SGD)
$110_{C4}$(SGD)
C4
C4
$R_{C4}$
$R_{DMH}$
$R_{MH}$
SU
SU
SU
SU
SU
SU
SU
SU
SU
SU
FS
FS

FS
FS
FS
$R_{MCA9}$
$R_{DMH}$
$R_{MH}$
$R_{DMH}$
$R_{HU}$
$R_{HU}$
$R_{DMH}$
$R_{MH}$
$R_{DMH}$
$R_{PTN}$
$R_{PTN}$
Y
Z
X

SEMICONDUCTOR MEMORY DEVICE

CROSS-REFERENCE TO RELATED APPLICATION(S)

This application is based upon and claims the benefit of priority from Japanese Patent Application No. 2023-047415, filed Mar. 23, 2023, the entire contents of which are incorporated herein by reference.

FIELD

Embodiments described herein relate generally to a semiconductor memory device.

BACKGROUND

A semiconductor memory device including a substrate, a plurality of conductive layers stacked in a direction intersecting a surface of the substrate, a semiconductor column facing the plurality of conductive layers, and a charge storage film provided between the plurality of conductive layers and the semiconductor column is known.

DETAILED DESCRIPTION

Figure 1:
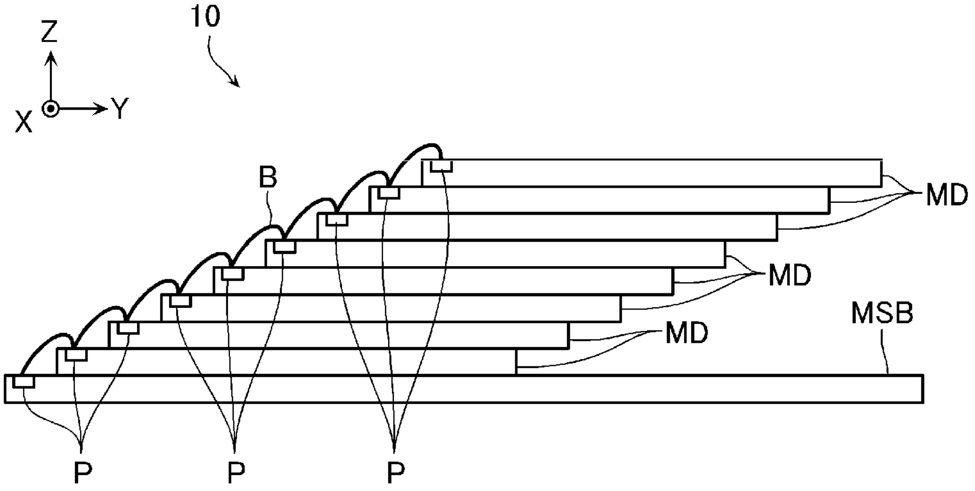
FIG. 1 is a side view schematically showing a structure of a package.

In general, according to one embodiment, a semiconductor memory device includes a substrate, a plurality of conductive layers stacked in a stacking direction intersecting a surface of the substrate, and extending in a first direction intersecting the stacking direction, a plurality of semiconductor columns extending in the stacking direction and facing the plurality of conductive layers, a plurality of charge storage films provided between the plurality of conductive layers and the plurality of semiconductor columns, a plurality of first and second wirings provided on one side in the stacking direction with respect to the plurality of conductive layers, arranged in the first direction, and electrically connected to the plurality of semiconductor columns, a plurality of sense amplifier units electrically connected to the plurality of first wirings, and a node electrically and commonly connected to the plurality of second wirings. One of the plurality of sense amplifier units is electrically connected to K1 number of first wirings (where K1 is an integer of 1 or more). The node is electrically connected to K2 number of second wirings (where K2 is an integer of 2 or more greater than K1).

Next, the semiconductor memory device according to the embodiment will be described in detail with reference to the drawings. The following embodiments are only examples, and are not intended to limit the scope of the present disclosure. In addition, the drawings below are schematic, and for convenience of explanation, some configurations and the like may be omitted. Moreover, the parts which are common to a plurality of embodiments may be given the same reference numerals, and the description thereof may not be repeated.

The term "semiconductor memory device" used in the present specification may mean a memory die, or mean a memory system including a controller die such as a memory chip, a memory card, or a solid state drive (SSD). The term "semiconductor memory device" may mean a configuration including a host computer such as a smartphone, a tablet terminal, and a personal computer.

In the present specification, when a first configuration is said to be "electrically connected" to a second configuration, the first configuration may be directly connected to the second configuration, or the first configuration may be connected to the second configuration through a wiring, a semiconductor member, a transistor, or the like. For example, when three transistors are connected in series, the first transistor is "electrically connected" to the third transistor even though the second transistor is in an OFF state.

In the present specification, when the first configuration is said to be "connected between" the second configuration and the third configuration, it may mean that the first configuration, the second configuration, and the third configuration are connected in series and the second configuration is connected to the third configuration through the first configuration.

In the present specification, when a circuit or the like is said to cause two wirings and the like to be "conductive", it may mean, for example, that the circuit or the like includes a transistor and the like, the transistor and the like are provided on a current path between the two wirings, and the transistor and the like are turned into an ON state.

In the present specification, a predetermined direction parallel to an upper surface of a substrate is referred to as an X direction, a direction which is parallel to the upper surface of the substrate and is perpendicular to the X direction is referred to as a Y direction, and a direction perpendicular to the upper surface of the substrate is referred to as a Z direction.

In the present specification, a direction along a predetermined surface is referred to as a first direction, a direction intersecting the first direction along the predetermined surface is referred to as a second direction, and a direction intersecting the predetermined surface is referred to as a third direction, or the like. The first direction, the second direction, and the third direction may or may not correspond to any of the X direction, the Y direction, and the Z direction.

In the present specification, expressions such as "up" and "down" are based on the substrate. For example, a direction away from the substrate along the Z direction is referred to as up, and a direction toward the substrate along the Z direction is referred to as down. Further, when referring to a lower surface or a lower end of a certain component, it means a surface or an end portion on a substrate side of this component. When referring to an upper surface or an upper end, it means a surface or an end portion of this component on a farther side from the substrate. A surface intersecting the X direction or the Y direction is referred to as a side surface or the like.

First Embodiment

Package 10

Figure 2:
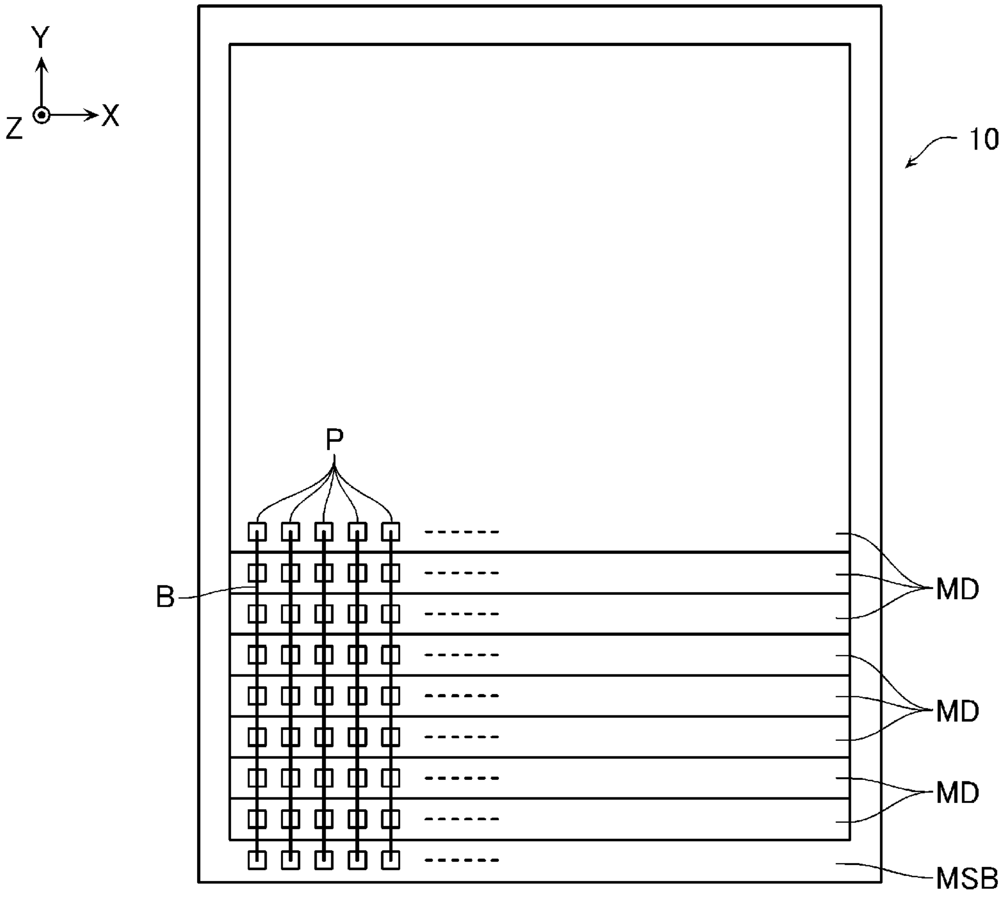
FIG. 2 is a plan view schematically showing the structure of the package.

FIG. 1 is a side view schematically showing a structure of a package 10 including a plurality of memory dies MD. FIG. 2 is a plan view schematically showing the structure of the package 10. For convenience of description, a part of the configuration is not shown in FIGS. 1 and 2.

As shown in FIG. 1, the package 10 includes a mounting substrate MSB and a plurality of memory dies MD. The external pad electrode P is provided in a region of the end portion of the upper surface of the mounting substrate MSB in the Y direction. A part of the region of the upper surface of the mounting substrate MSB other than the end portion in the Y direction is attached to the lower surface of the memory die MD through an adhesive or the like. The plurality of memory dies MD are stacked on the mounting substrate MSB. The external pad electrode P is provided in a region of the upper surface of the memory die MD at an end portion in the Y direction. A region of the upper surface of the memory die MD other than the end portion in the Y direction is attached to the lower surface of the other memory die MD through an adhesive or the like.

As shown in FIG. 2, the mounting substrate MSB and the plurality of memory dies MD each include a plurality of external pad electrodes P arranged in the X direction. For example, the power supply voltage $V_{CC}$ is supplied to a part of the plurality of external pad electrodes P, and therefrom the power supply voltage $V_{CC}$ is supplied to the inside of the memory die MD. In addition, for example, the ground voltage $V_{SS}$ is supplied to the other part of the plurality of external pad electrodes P, and therefrom the ground voltage $V_{SS}$ is supplied to the inside of the memory die MD. The plurality of external pad electrodes P provided in the mounting substrate MSB and the plurality of memory dies MD are connected to each other through the bonding wires B.

The configurations shown in FIGS. 1 and 2 are merely an example, and the specific configurations may be modified as appropriate. For example, the plurality of memory dies MD may be connected to each other not by the bonding wire B but through a through via or the like. In addition, the package 10 may include a controller that controls the memory die MD.

Memory Die MD

Figure 3:
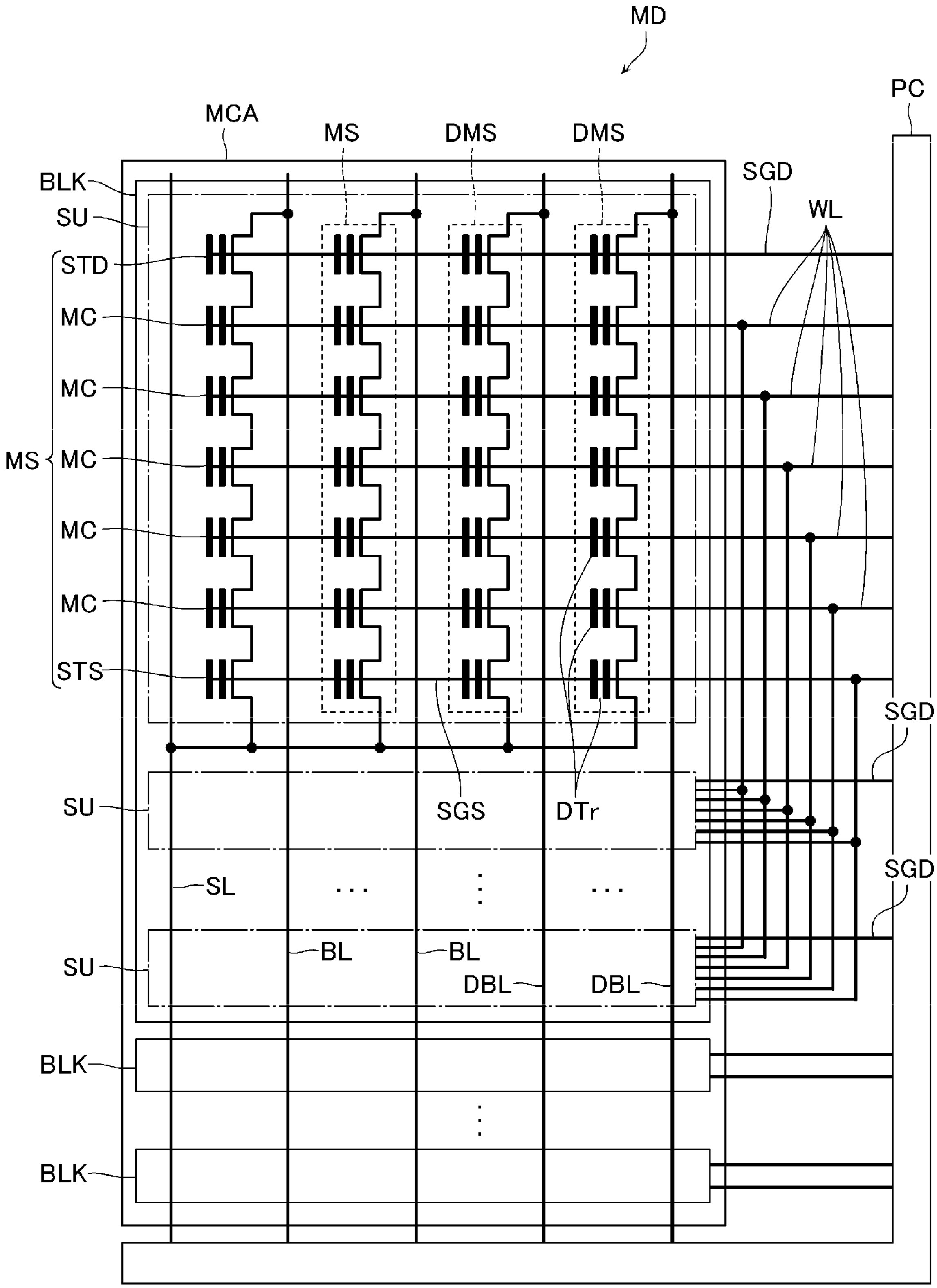
FIG. 3 is a circuit diagram schematically showing a partial configuration of a memory die.

FIG. 3 is a circuit diagram schematically showing a partial configuration of the memory die MD according to the first embodiment. As shown in FIG. 3, the memory die MD includes a memory cell array MCA and a peripheral circuit PC.

Memory Cell Array MCA

The memory cell array MCA includes a plurality of memory blocks BLK. Each of the plurality of memory blocks BLK includes a plurality of string units SU. Each of the plurality of string units SU includes a plurality of memory strings MS and a plurality of dummy strings DMS. One end of each of the plurality of memory strings MS is connected to the peripheral circuit PC through a bit line BL. One end of each of the plurality of dummy strings DMS is connected to the peripheral circuit PC through the dummy bit line DBL. In addition, the other ends of the plurality of memory strings MS and the plurality of dummy strings DMS are connected to the peripheral circuit PC through a common source line SL, respectively.

The memory string MS includes a drain-side select transistor STD, a plurality of memory cells (memory transistors) MC, and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS may be simply referred to as a select transistors STD and STS.

The memory cell MC is a field effect transistor. The memory cell MC includes a semiconductor layer, a gate insulating film, and a gate electrode. The semiconductor layer functions as a channel region. The gate insulating film includes a charge storage film. A threshold voltage of the memory cell MC is changed according to a charge quantity in the charge storage film. The memory cell MC stores data of one bit or a plurality of bits. Word lines WL are connected respectively to the gate electrodes of the plurality of memory cells MC corresponding to one memory string MS. Each of these word lines WL is commonly connected to all the memory strings MS in one memory block BLK.

The select transistors STD and STS are field effect transistors. The select transistors STD and STS include a semiconductor layer, a gate insulating film, and a gate electrode. The semiconductor layer functions as the channel region. The gate insulating film includes a charge storage film. The gate electrodes of the select transistors STD and STS are respectively connected to the select gate lines SGD and SGS. One drain-side select gate line SGD is commonly connected to all of the memory strings MS in one string unit SU. One source-side select gate line SGS is commonly connected to all of the memory strings MS in one memory block BLK.

The dummy string DMS includes a plurality of dummy transistors DTr connected in series between the dummy bit line DBL and the source line SL.

The dummy transistor DTr is a field effect transistor. The dummy transistor DTr includes a semiconductor layer, a gate insulating film, and a gate electrode. The semiconductor layer functions as a channel region. The gate insulating film includes a charge storage film. The dummy transistor DTr is not used for storing data. The word lines WL, the drain-side select gate line SGD, and the source-side select gate line SGS are respectively connected to the gate electrodes of the plurality of dummy transistors DTr corresponding to one dummy string DMS. The word lines WL and the source-side select gate line SGS are commonly connected to all of the dummy strings DMS in one memory block BLK. One drain-side select gate line SGD is commonly connected to all of the dummy strings DMS in one string unit SU.

Figure 4:
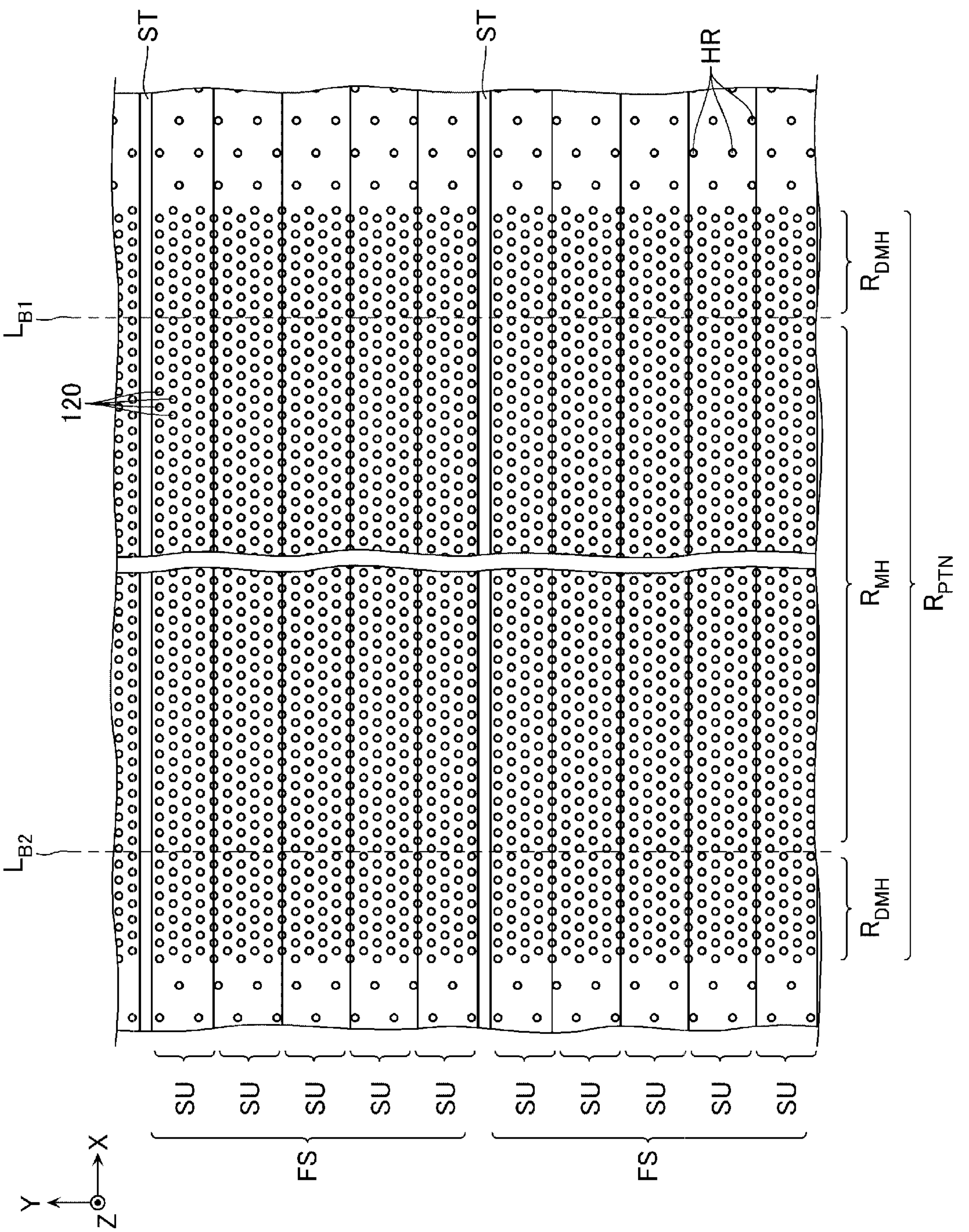
FIG. 4 is a plan view schematically showing a partial configuration of a memory cell array.
Figure 5:
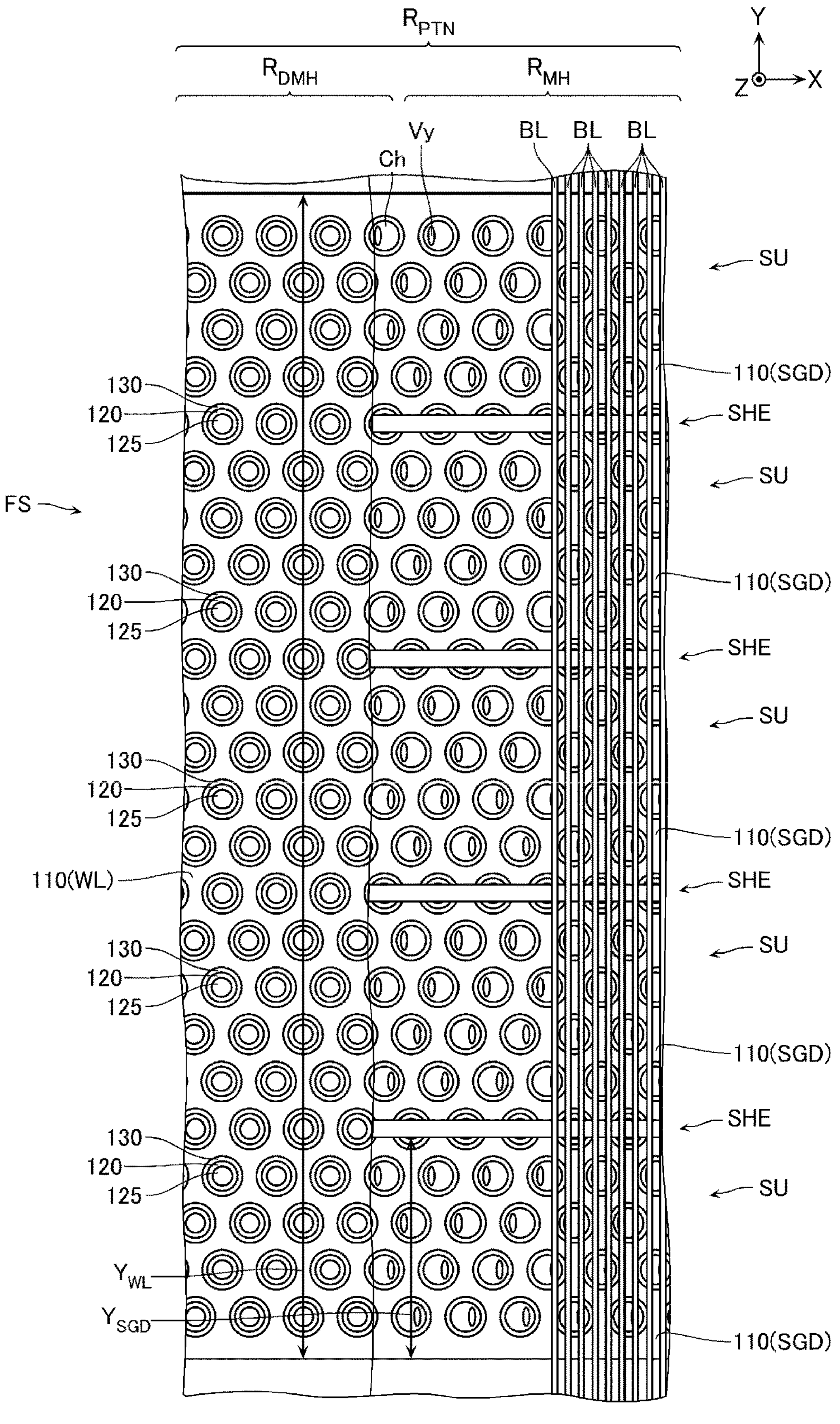
FIG. 5 is a plan view schematically showing the partial configuration of the memory cell array.
Figure 6:
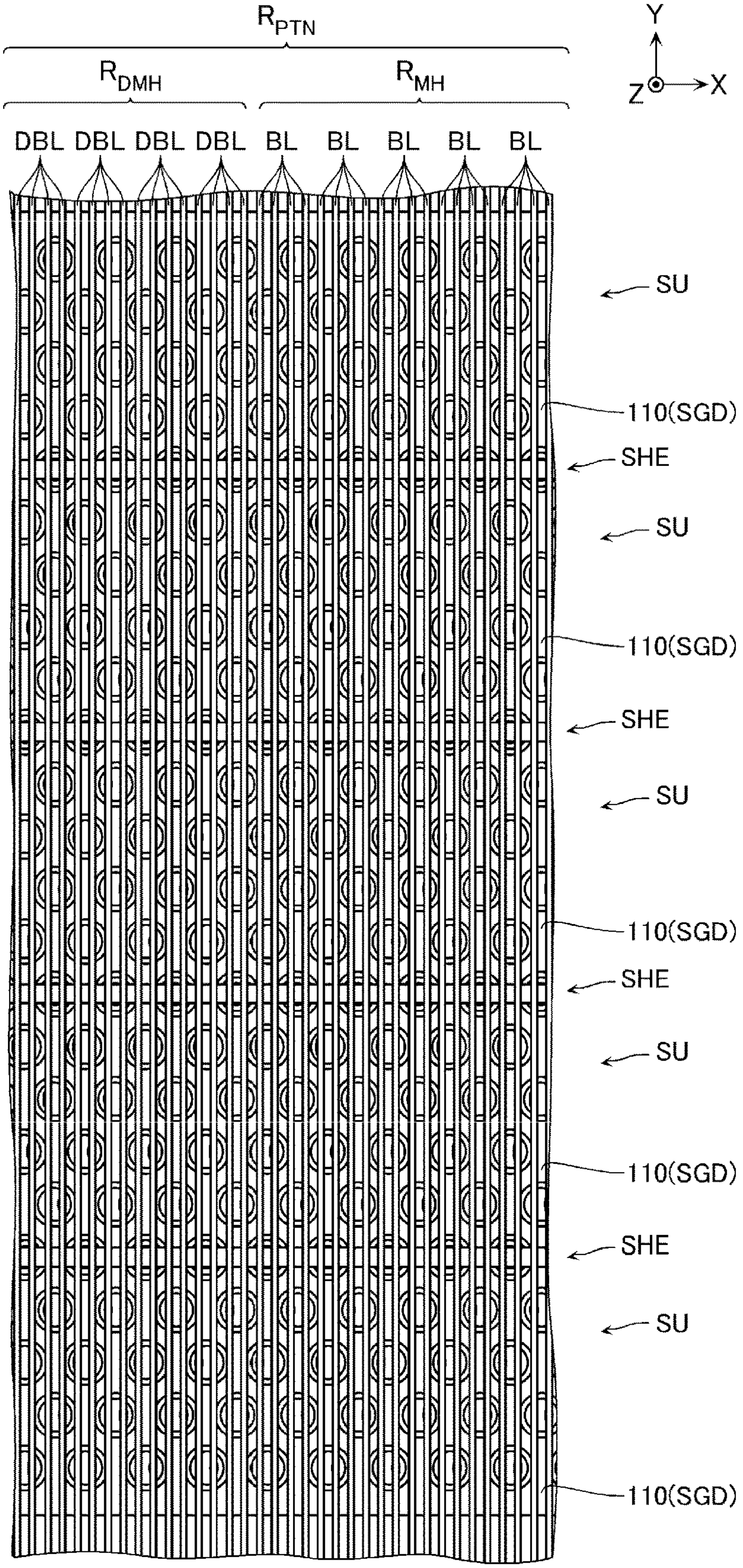
FIG. 6 is a plan view schematically showing the partial configuration of the memory cell array.
Figure 7:
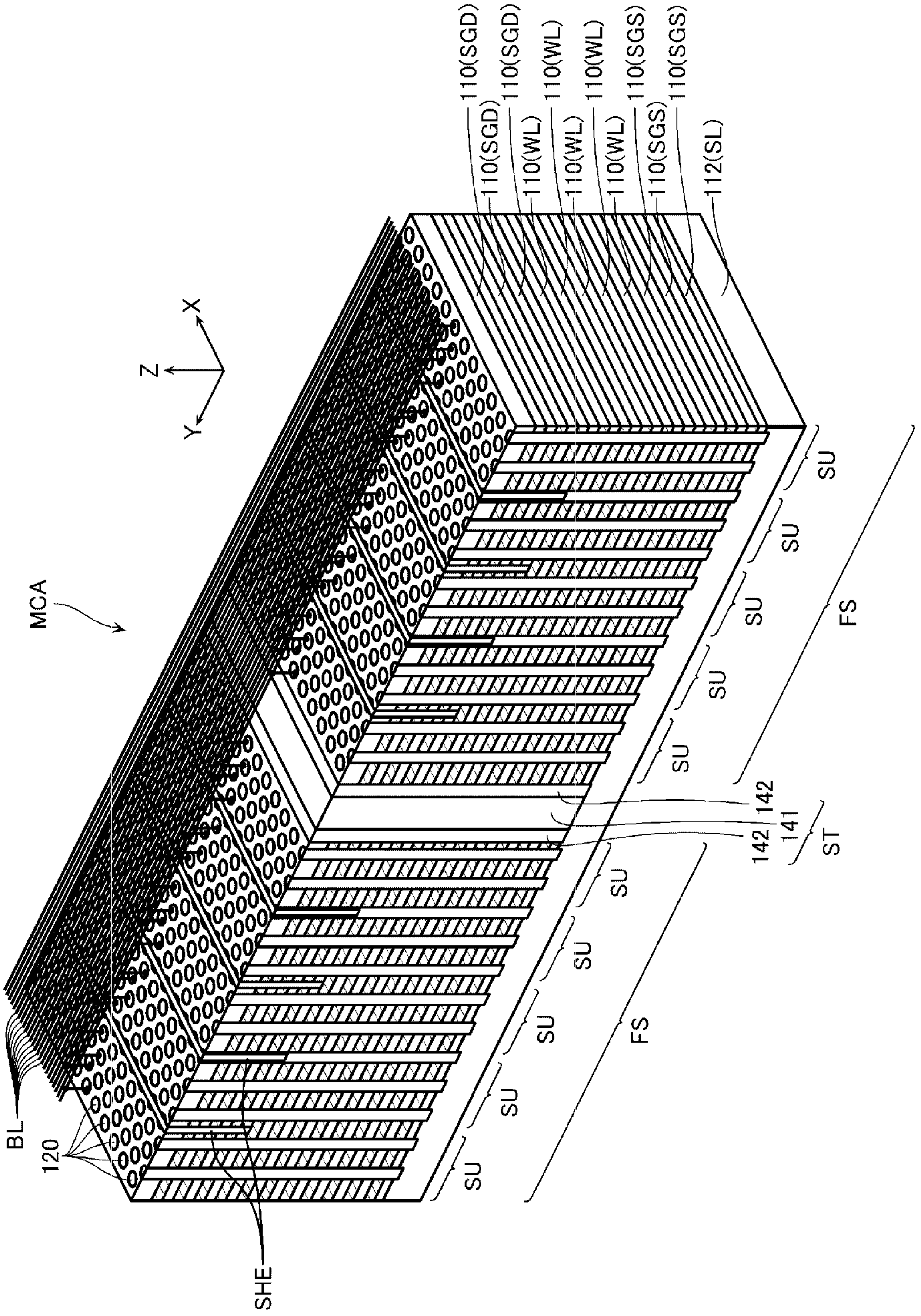
FIG. 7 is a perspective view schematically showing the partial configuration of the memory cell array.
Figure 8:
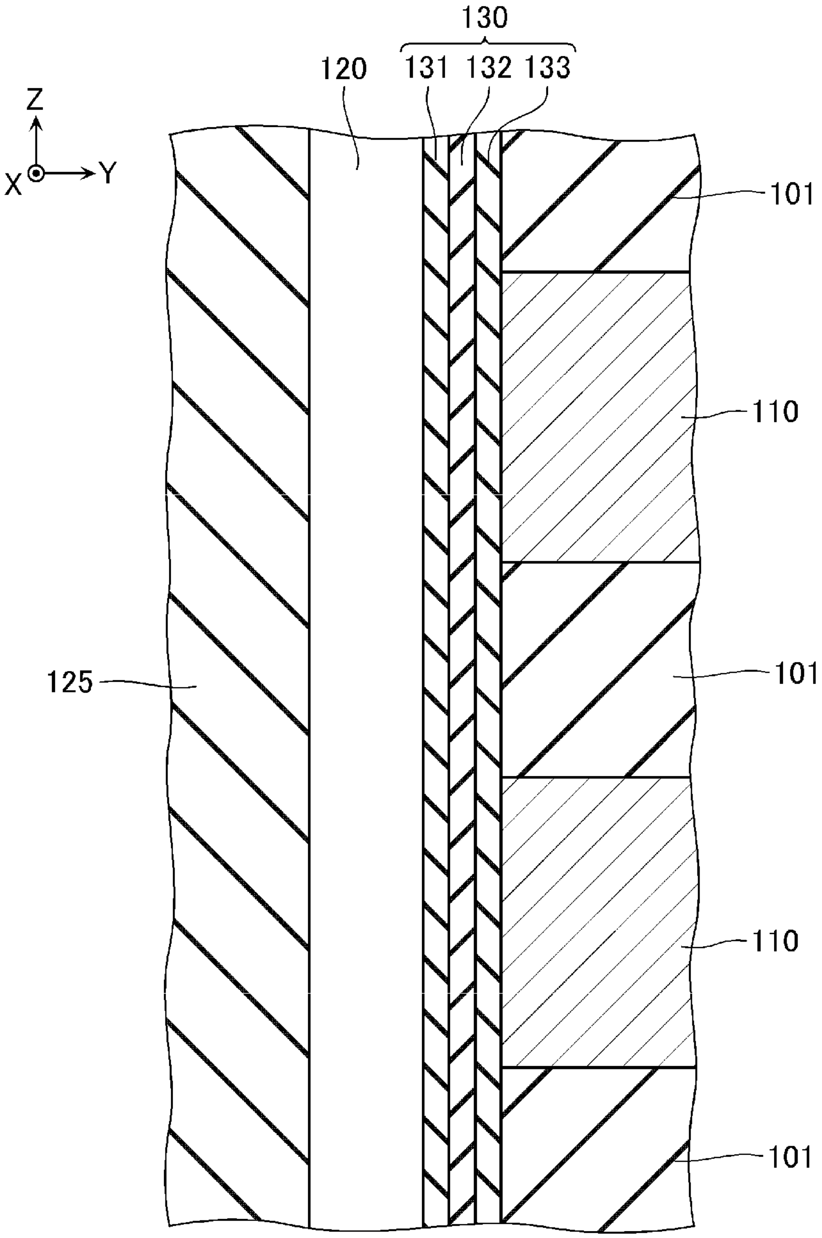
FIG. 8 is a cross-sectional view schematically showing the partial configuration of the memory cell array.

FIG. 4 is a plan view schematically showing a partial configuration of the memory cell array MCA. FIGS. 5 and 6 are plan views schematically showing the partial configuration of the memory cell array MCA, and show a structure shown in FIG. 4 in a partially enlarged manner. FIG. 7 is a perspective view schematically showing the partial configuration of the memory cell array MCA. FIG. 8 is a cross-sectional view schematically showing a partial configuration of the memory cell array MCA. Although FIG. 8 shows a YZ cross section, a structure similar to that in FIG. 8 is observed even when a cross section other than the YZ cross section (for example, an XZ cross section) along the central axis of a semiconductor column 120 is observed.

As shown in FIG. 4, the memory cell array MCA includes a pattern region $R_{PTN}$ including a memory hole region $R_{MH}$ and a dummy memory hole region $R_{DMH}$. The memory hole region $R_{MH}$ is provided with a plurality of memory strings MS (FIG. 3) and a plurality of bit lines BL (FIG. 3). A plurality of dummy strings DMS (FIG. 3) and a plurality of dummy bit lines DBL (FIG. 3) are provided in the dummy memory hole region $R_{DMH}$.

The pattern region $R_{PTN}$ is a region in which a substantially uniform pattern is formed in the manufacturing of the memory die MD, in the patterning of the semiconductor columns 120 described later, and in the patterning of the bit lines BL and the dummy bit lines DBL. Here, in the pattern region $R_{PTN}$, a relatively suitable pattern tends to be formed in a range away from the end portion in the X direction at the time of exposure. On the other hand, in the pattern region $R_{PTN}$, the shape tends to vary in a range close to the end portion in the X direction at the time of exposure. Therefore, in the present embodiment, the configuration formed in the range close to the end portion in the X direction in the pattern region $R_{PTN}$ is not used as the memory string MS or the like, but is used as the dummy string DMS.

FIG. 4 shows a boundary line $L_{B1}$ provided inside the pattern region $R_{PTN}$ from the end portion on one side of the pattern region $R_{PTN}$ in the X direction by a predetermined distance. In addition, FIG. 4 shows a boundary line $L_{B2}$ provided inside the pattern region $R_{PTN}$ from the end portion on the other side of the pattern region $R_{PTN}$ in the X direction by a predetermined distance. In the shown example, the memory hole region $R_{MH}$ is provided in a range between the boundary lines $L_{B1}$ and $L_{B2}$. In addition, the dummy memory hole region $R_{DMH}$ is provided in a range between the one end portion of the pattern region $R_{PTN}$ in the X direction and the boundary line $L_{B1}$ and in a range between the other end portion of the pattern region $R_{PTN}$ in the X direction and the boundary line $L_{B2}$.

As shown in FIG. 4, the memory cell array MCA includes a plurality of finger structures FS arranged in the Y direction. In the present embodiment, the finger structure FS corresponds to the memory block BLK described with reference to FIG. 3. However, the correspondence relationship between the finger structure FS and the memory block BLK may be appropriately changed. For example, a plurality of the finger structures FS may function as one memory block BLK. An inter-finger structure ST is provided between the two finger structures FS adjacent to each other in the Y direction.

As shown in FIG. 5, the finger structure FS includes a plurality of string units SU arranged in the Y direction. The inter-string unit insulating layer SHE is provided between the two string units SU adjacent to each other in the Y direction.

The finger structure FS includes, for example, a plurality of conductive layers 110 stacked in the Z direction, a conductive layer 112 provided below the plurality of conductive layers 110, and a plurality of semiconductor columns 120 extending in the Z direction, as shown in FIG. 7. In addition, as shown in FIG. 8, a gate insulating film 130 is provided between the plurality of conductive layers 110 and the plurality of semiconductor columns 120, respectively.

The conductive layer 110 has a substantially plate-like shape extending in the X direction. The conductive layer 110 may include a stacked film of a barrier conductive film made of titanium nitride (TiN) or the like and a metal film made of tungsten (W) or the like. The conductive layer 110 may contain, for example, polycrystalline silicon containing impurities such as phosphorus (P) or boron (B). Insulating layers 101 (FIG. 8) made of silicon oxide ($SiO_2$) or the like are provided between the plurality of conductive layers 110 arranged in the Z direction.

The plurality of conductive layers 110 function as word lines WL (FIG. 3), gate electrodes of the plurality of memory cells MC (FIG. 3) connected to the word lines WL, and gate electrodes of the dummy transistors DTr (FIG. 3) connected to the word lines WL. In the following description, such a conductive layer 110 may be referred to as a conductive layer 110 (WL). The plurality of conductive layers 110 (WL) are electrically independent for each finger structure FS. In the example of FIG. 7, the conductive layers 110 (WL) corresponding to the two finger structures FS adjacent to each other in the Y direction are insulated from each other through the inter-finger structure ST.

The one or the plurality of conductive layers 110 located below the plurality of conductive layers 110 (WL) function as the source-side select gate line SGS (FIG. 3), the gate electrodes of the plurality of source-side select transistors STS (FIG. 3) connected to the source-side select gate line SGS, and the gate electrodes of the dummy transistors DTr (FIG. 3) connected to the source-side select gate line SGS. In the following description, such a conductive layer 110 may be referred to as a conductive layer 110 (SGS). The one or plurality of conductive layers 110 (SGS) are electrically independent for each finger structure FS. In the example of FIG. 7, the conductive layers 110 (SGS) corresponding to the two finger structures FS adjacent to each other in the Y direction are insulated from each other through the inter-finger structure ST.

The one or the plurality of conductive layers 110 located above the plurality of conductive layers 110 (WL) function as the drain-side select gate line SGD (FIG. 3), the gate electrodes of the plurality of drain-side select transistors STD (FIG. 3) connected to the drain-side select gate line SGD, and the gate electrodes of the dummy transistors DTr (FIG. 3) connected to the drain-side select gate line SGD. In the following description, such a conductive layer 110 may be referred to as a conductive layer 110 (SGD). As shown in FIG. 5, a width $Y_{SGD}$ of the conductive layer 110 (SGD) in the Y direction is smaller than a width $Y_{WL}$ of the conductive layer 110 (WL) in the Y direction. In addition, the inter-string unit insulating layer SHE is provided between the two conductive layers 110 (SGD) adjacent to each other in the Y direction in one finger structure FS. Each of the plurality of conductive layers 110 (SGD) is electrically independent for each string unit SU. In each of the finger structures FS, the conductive layers 110 (SGD) corresponding to the first and fifth string units SU counted from one side in the Y direction (for example, the negative side in the Y direction) are electrically insulated from the configuration in the other finger structures FS through the inter-finger structure ST provided between the finger structures FS. In addition, in each of the finger structures FS, two conductive layers 110 (SGD) adjacent to each other in the Y direction are electrically insulated from each other through the inter-string unit insulating layer SHE.

The conductive layer 112 (FIG. 7) may contain, for example, polycrystalline silicon containing N-type impurities such as phosphorus (P) or the like. The lower surface of the conductive layer 112 is provided with, for example, a metal layer made of tungsten (W) or the like, a conductive layer made of tungsten silicide or the like, or other conductive layers. The conductive layer 112 functions as a part of the source line SL (FIG. 3).

For example, as illustrated in FIG. 5, the semiconductor columns 120 are arranged in the X direction and the Y direction in a predetermined pattern. In the shown example, the plurality of semiconductor columns 120 are provided in 24 rows corresponding to one finger structure FS. In addition, in each row, a plurality of the semiconductor columns 120 are arranged at a substantially constant pitch in the X direction. As shown in FIG. 4, the semiconductor columns 120 are provided with a regular pattern over the entire pattern region $R_{PTN}$.

The semiconductor column 120 contains, for example, polycrystalline silicon (Si). The semiconductor column 120 has a substantially cylindrical shape, and an insulating layer 125 (FIG. 5) such as silicon oxide is provided at a central portion thereof. An outer peripheral surface of each of the semiconductor columns 120 is surrounded by the conductive layer 110 and faces the conductive layer 110.

The semiconductor column 120 provided in the memory hole region $R_{MH}$ functions as channel regions of the plurality of memory cells MC and select transistors (STD and STS) in one memory string MS (FIG. 3).

The semiconductor column 120 provided in the dummy memory hole region $R_{DMH}$ functions as channel regions of the plurality of dummy transistors DTr provided in one dummy string DMS (FIG. 3).

An impurity region containing N-type impurities such as phosphorus (P) is provided at an upper end portion of the semiconductor column 120. The impurity region is electrically connected to the bit line BL or the dummy bit line DBL. The plurality of semiconductor columns 120 corresponding to one string unit SU are all connected to different bit lines BL or dummy bit lines DBL. In the example of FIG. 5, the four rows including the plurality of semiconductor columns 120 arranged in the X direction are arranged in the Y direction corresponding to one string unit SU. The plurality of semiconductor columns 120 provided in the four rows are all connected to different bit lines BL or dummy bit lines DBL.

The bit lines BL and the dummy bit lines DBL are, for example, arranged in the X direction and extend in the Y direction, respectively, as shown in FIG. 6. The bit lines BL and the dummy bit lines DBL are provided in a substantially uniform pattern over the entire pattern region $R_{PTN}$. In addition, as shown in FIG. 5, a contact electrode Ch is provided at a position overlapping the semiconductor column 120 when viewed from above. Further, a contact electrode Vy is provided at a position overlapping the contact electrode Ch and the bit line BL or the dummy bit line DBL when viewed from above. The semiconductor columns 120 are electrically connected to the bit lines BL or the dummy bit lines DBL through the contact electrodes Ch and Vy.

An impurity region containing N-type impurities such as phosphorus (P) is provided at a lower end portion of the semiconductor column 120. The impurity region is connected to the conductive layer 112 (FIG. 7). In the example shown in the drawing, the plurality of semiconductor columns 120 corresponding to one memory cell array MCA are all connected to the common conductive layer 112.

The gate insulating film 130 (FIG. 8) has a substantially cylindrical shape that covers the outer peripheral surface of the semiconductor column 120. For example, as shown in FIG. 8, the gate insulating film 130 includes a tunnel insulating film 131, a charge storage film 132, and a block insulating film 133, which are stacked between the semiconductor column 120 and the conductive layer 110. The tunnel insulating film 131 and the block insulating film 133 contain, for example, silicon oxide ($SiO_2$). The charge storage film 132 includes, for example, a film that is made of silicon nitride (SiN) or the like and is capable of storing charges. The tunnel insulating film 131, the charge storage film 132, and the block insulating film 133 have a substantially cylindrical shape, and extend in the Z direction along the outer peripheral surface of the semiconductor column 120 except for a contact portion between the semiconductor column 120 and the conductive layer 112.

FIG. 8 shows an example in which the gate insulating film 130 includes the charge storage film 132 made of silicon nitride or the like. However, the gate insulating film 130 may include, for example, a floating gate made of polycrystalline silicon containing N-type or P-type impurities.

The inter-finger structure ST extends in the X direction and the Z direction, for example, as shown in FIG. 7. The inter-finger structure ST includes a conductive layer 141 and an insulating layer 142 made of silicon oxide ($SiO_2$) provided on a side surface of the conductive layer 141 in the Y direction. The conductive layer 141 functions as a part of the source line SL (FIG. 3). The lower end of the conductive layer 141 is connected to the conductive layer 112. For example, the conductive layer 141 may include a stacked film of a barrier conductive film made of titanium nitride (TiN) or the like and a metal film made of tungsten (W) or the like. The conductive layer 141 may contain, for example, polycrystalline silicon containing impurities such as phosphorus (P) or boron (B).

In FIG. 4, a support structure HR provided outside the pattern region $R_{PTN}$ is shown. The support structure HR supports a plurality of the insulating layers 101 arranged in the Z direction in the step to be described later with reference to FIG. 20 in the manufacturing of the memory die MD. The support structure HR may include, for example, the insulating layer made of silicon oxide ($SiO_2$). In addition, the support structure HR may include the same materials as the semiconductor column 120, the insulating layer 125, and the gate insulating film 130, for example.

Peripheral Circuit PC

Figure 9:
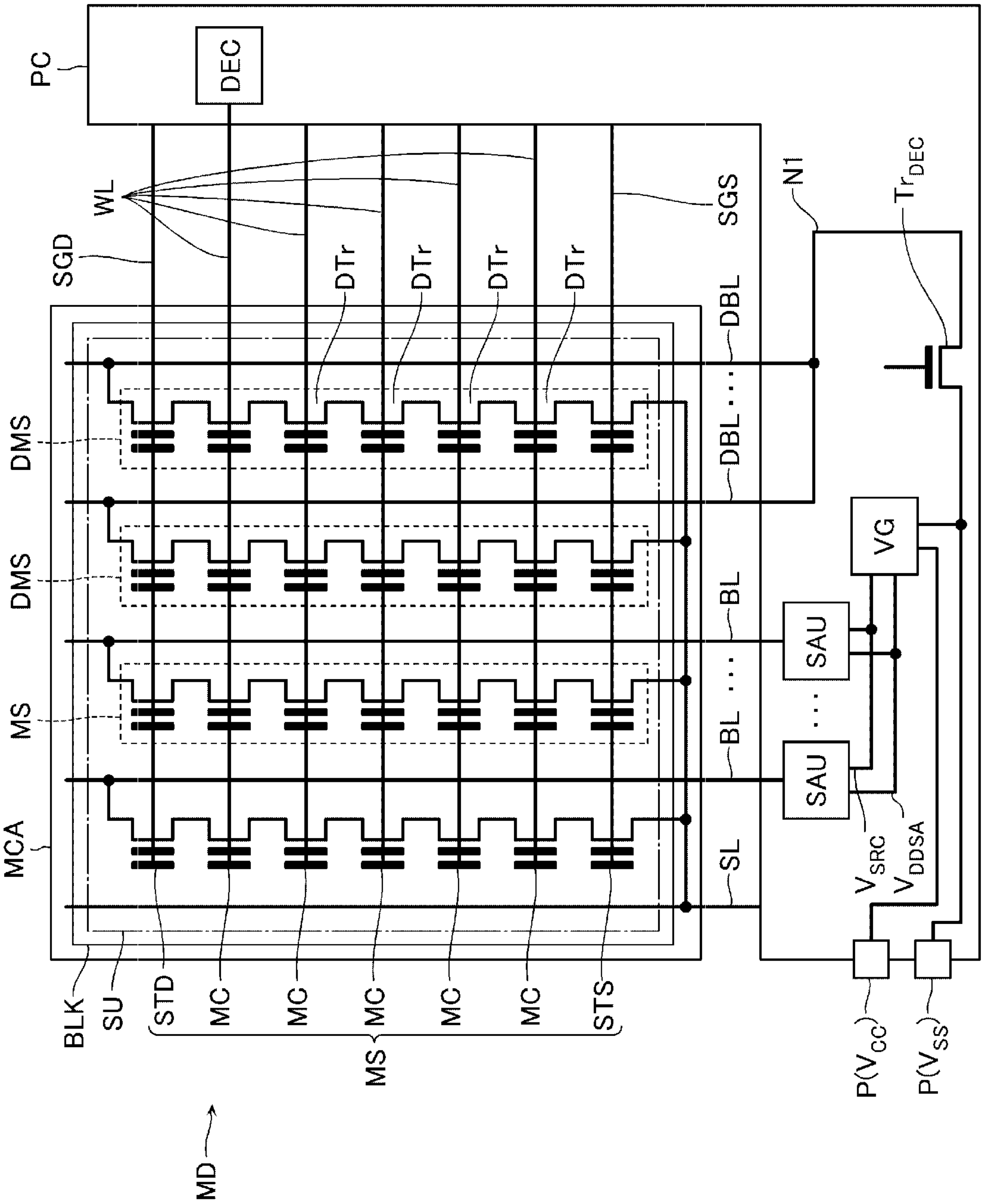
FIGS. 9-11 are circuit diagrams each schematically showing a partial configuration of a peripheral circuit.
Figure 10:
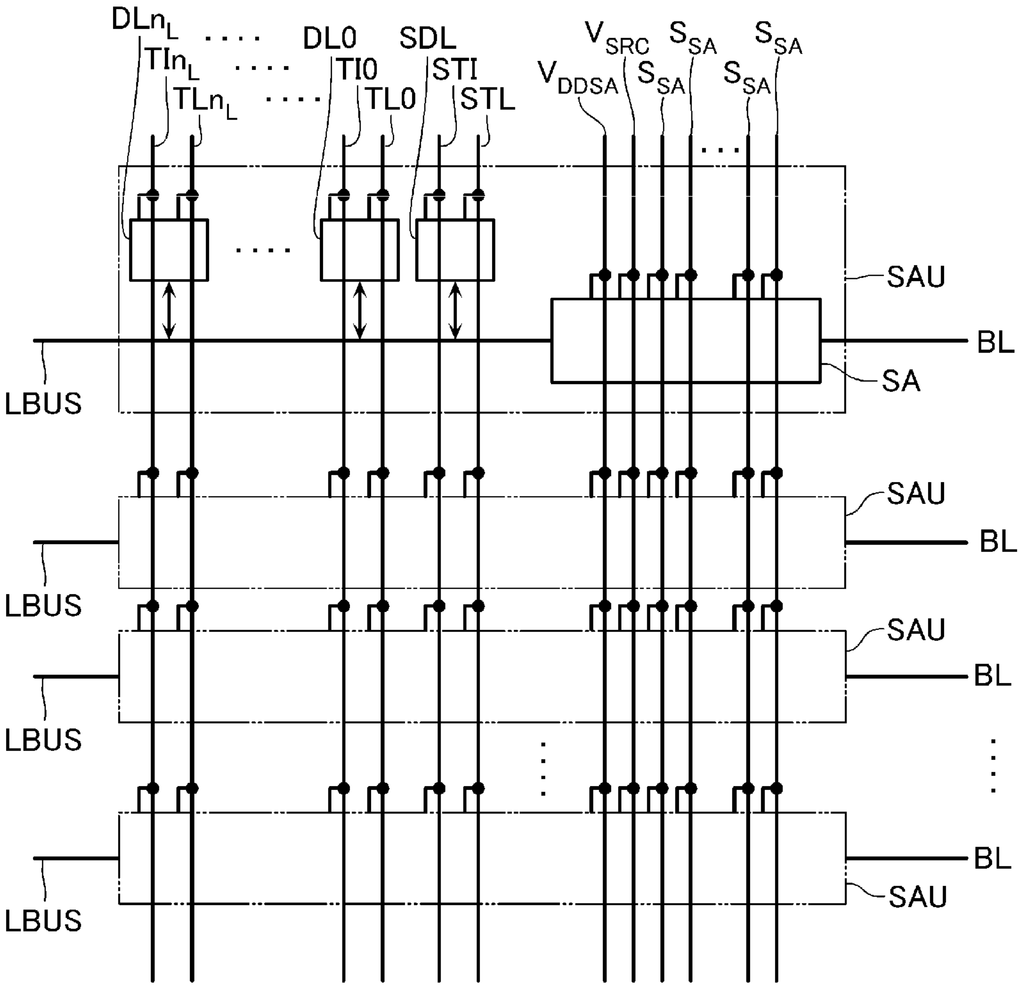
Figure 11:
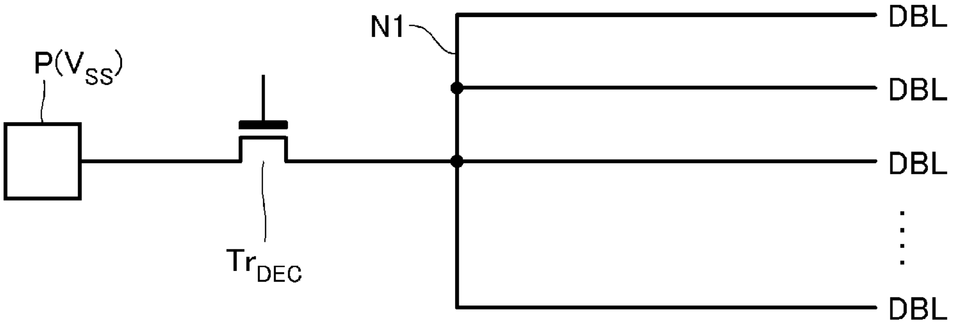

FIGS. 9 to 11 are circuit diagrams schematically showing a partial configuration of the peripheral circuit PC.

As shown in FIG. 9, the peripheral circuit PC includes, for example, a plurality of sense amplifier units SAU provided corresponding to a plurality of bit lines BL, a node N1 commonly connected to a plurality of dummy bit lines DBL, a transistor $Tr_{DEC}$ electrically connected between the node N1 and an external pad electrode P (hereinafter, referred to as an "external pad electrode $P(V_{SS})$") to which a ground voltage $V_{SS}$ is supplied, and a voltage generation circuit VG configured to generate a voltage supplied to a memory cell array MCA or the like. In addition, the peripheral circuit PC includes a current measurement circuit DEC electrically connected to the word line WL.

In addition, although not shown, the peripheral circuit PC includes a driver circuit and a decode circuit that supply the voltage generated by the voltage generation circuit VG to the configuration in the memory cell array MCA, a cache memory that temporarily stores data input to the sense amplifier unit SAU and data output from the sense amplifier unit SAU, an address register, a command register, a status register, an input and output control circuit, a sequencer, and the like.

As shown in FIG. 10, the sense amplifier unit SAU includes a sense amplifier circuit SA electrically connected to the bit line BL, a wiring LBUS electrically connected to the sense amplifier circuit SA, and a plurality of data latch circuits SDL, DL0 to $DLn_L$ ($n_L$ is an integer of 1 or more) electrically connected to the wiring LBUS.

The sense amplifier circuit SA detects a current or voltage of the bit line BL at the time of the reading operation, and outputs an "H" or "L" signal to the wiring LBUS. In addition, the sense amplifier circuit SA causes the bit line BL to be conductive with the voltage supply line $V_{SRC}$ or the voltage supply line $V_{DDSA}$ based on the data stored in the data latch circuit SDL at the time of the writing operation.

The operation voltage generated by the voltage generation circuit VG (FIG. 9) is supplied to each of the voltage supply lines $V_{SRC}$ and $V_{DDSA}$. The voltage generation circuit VG is electrically connected to the external pad electrode P (hereinafter, referred to as "external pad electrode $P(V_{CC})$") to which the power supply voltage $V_{CC}$ is supplied and the external pad electrode $P(V_{SS})$ and generates a plurality of operation voltages based on the power supply voltage $V_{CC}$ and the ground voltage $V_{SS}$.

As shown in FIG. 10, the plurality of sense amplifier circuits SA corresponding to the plurality of bit lines BL are commonly connected to the plurality of signal lines $S_{SA}$. The plurality of signal lines $S_{SA}$ are connected to a sequencer (not shown) and are collectively controlled by the sequencer.

The data latch circuits SDL, DL0 to $DLn_L$ are each configured to be able to store 1 bit of data. The data latch circuit SDL is used to control the voltage of the bit line BL at the time of a writing operation or the like. For example, the bit line BL corresponding to the data latch circuit SDL that stores the data "0" is in conduction with the voltage supply line $V_{SRC}$. In addition, the bit line BL corresponding to the data latch circuit SDL that stores the data "1" is in conduction with the voltage supply line $V_{DDSA}$. The data latch circuits DL0 to $DLn_L$ store the data read from the memory cells MC at the time of the reading operation. In addition, the data latch circuits DL0 to $DLn_L$ store the data to be written to the memory cells MC at the time of the writing operation. For example, when one memory cell MC stores data of a maximum of 3 bits, the sense amplifier unit SAU has at least three data latch circuits DL0, DL1, and DL2.

A plurality of data latch circuits SDL and DL0 to $DLn_L$, corresponding to the plurality of bit lines BL are commonly connected to the plurality of signal lines STL and TL0 to $TLn_L$. In addition, the plurality of data latch circuits SDL, DL0 to $DLn_L$ corresponding to the plurality of bit lines BL are commonly connected to the plurality of signal lines STI, TI0 to $TIn_L$. The plurality of signal lines STL, TL0 to $TLn_L$, STI, and TI0 to $TIn_L$ are connected to a sequencer (not shown), and the plurality of data latch circuits SDL, DL0 to $DLn_L$, corresponding to the plurality of bit lines BL are collectively controlled by the sequencer.

The node N1 (FIG. 11) is electrically connected to the plurality of dummy bit lines DBL without providing a switching element such as the transistor therebetween. The plurality of dummy bit lines DBL connected to the node N1 are electrically common and electrically conductive.

The transistor $Tr_{DEC}$ (FIG. 11) is, for example, a field effect transistor, and is controlled to be in an ON state in a test step before the memory die MD is shipped, and thereby transistor $Tr_{DEC}$ is used to detect a short circuit between the semiconductor layer and the gate electrode of the dummy transistor DTr.

As shown in FIG. 11, the source electrode of the transistor $Tr_{DEC}$ is electrically connected to the external pad electrode $P(V_{SS})$. The drain electrode of the transistor $Tr_{DEC}$ is commonly connected to a plurality of the dummy bit lines DBL through the node N1. The gate electrode of the transistor $Tr_{DEC}$ is connected to the sequencer (not shown) and is controlled by the sequencer.

The transistor $Tr_{DEC}$ is controlled to be in an OFF state except when the test step is performed. Therefore, for example, the dummy bit line DBL is in a floating state when the reading operation and the writing operation are performed on the memory cell MC.

The current measurement circuit DEC (FIG. 9) is configured to be able to measure the current flowing through the word line WL. The current measurement circuit DEC does not include a data latch circuit unlike the sense amplifier unit SAU.

Manufacturing Method

Next, a method for manufacturing the semiconductor memory device according to the present embodiment will be described, and based on this, one cause of a short circuit between the conductive layer 110 and the semiconductor column 120 will be described.

FIGS. 12 to 22 are cross-sectional views schematically showing manufacturing method.

Figure 12:
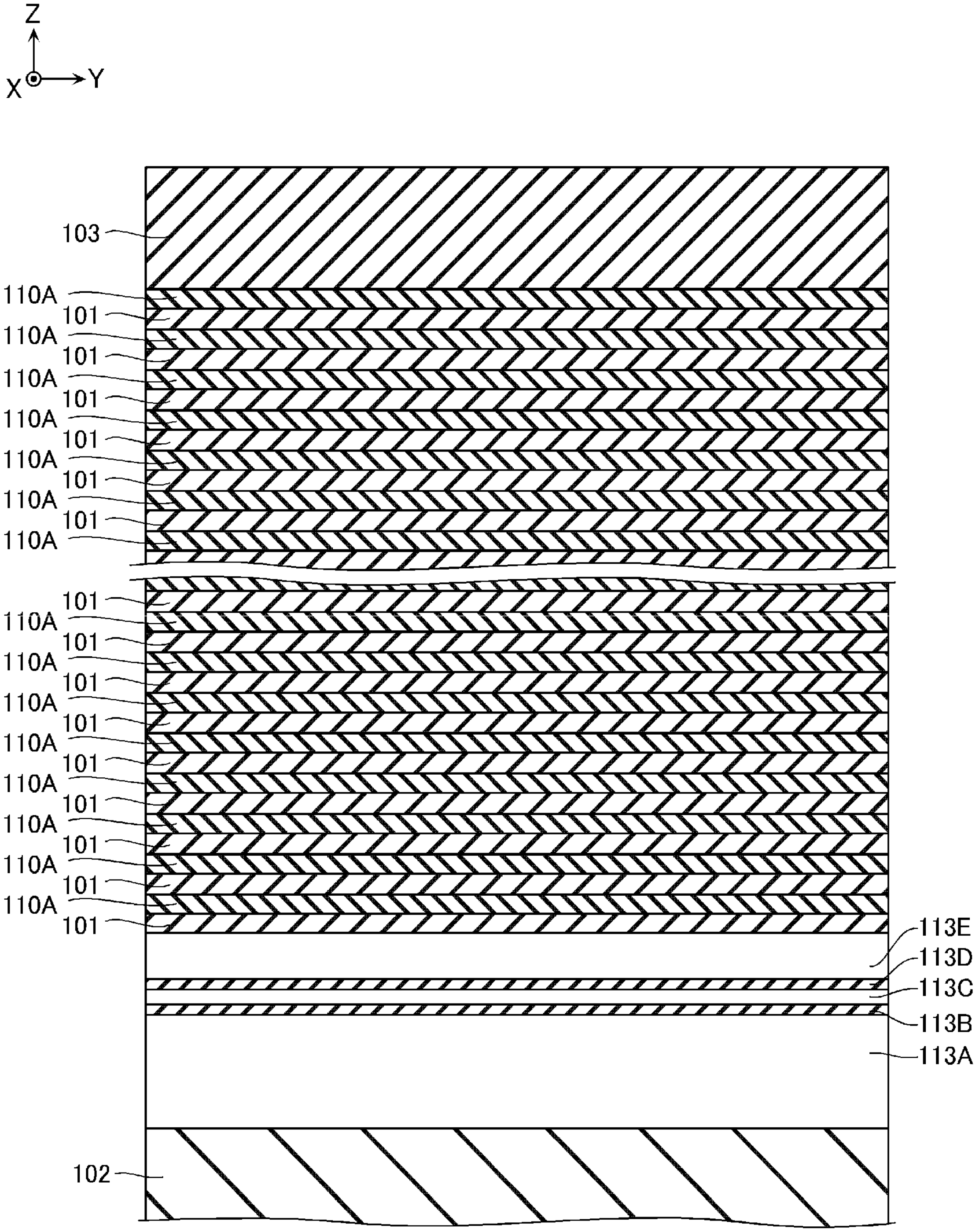
FIGS. 12-22 are cross-sectional views schematically illustrating a method of manufacturing the memory die.

In the manufacturing of the memory die MD according to the present embodiment, first, for example, as shown in FIG. 12, the semiconductor layer 113A made of silicon or the like, the sacrificial layer 113B made of silicon oxide or the like, the sacrificial layer 113C made of silicon nitride or the like, the sacrificial layer 113D made of silicon oxide or the like, and the semiconductor layer 113E made of silicon or the like are formed on the insulating layer 102. In addition, the plurality of insulating layers 101 and the plurality of insulating layers 110A, which are sacrificial layers, are alternately formed. The insulating layer 110A contains, for example, silicon nitride or the like. Furthermore, an insulating layer 103 made of silicon oxide or the like is formed above the plurality of insulating layers 101 and the plurality of insulating layers 110A. This step is performed by, for example, a method such as chemical vapor deposition (CVD).

Figure 13:
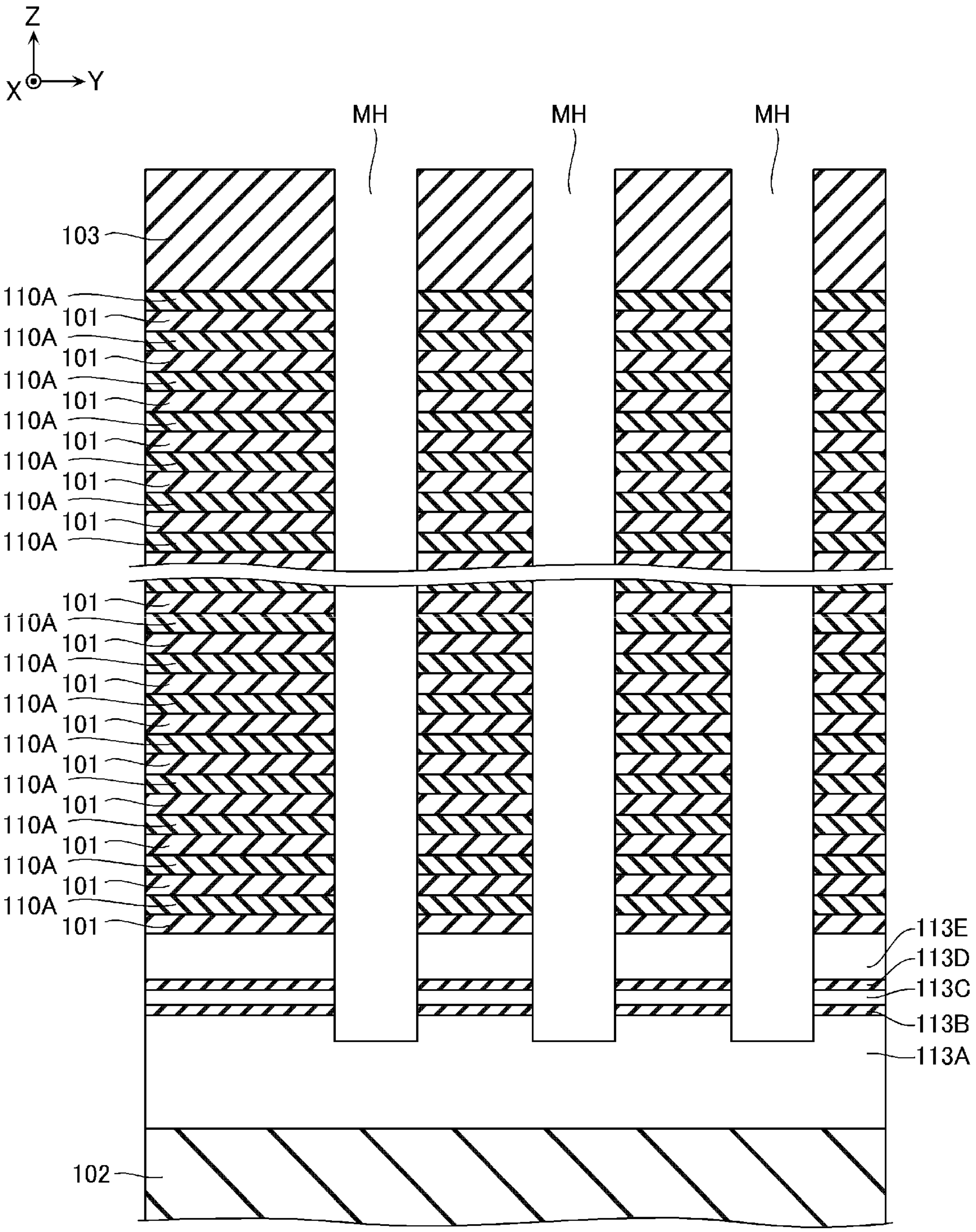

Next, for example, as shown in FIG. 13, in the pattern region $R_{PTN}$ described with reference to FIG. 4, a plurality of memory holes MH are formed at positions corresponding to the semiconductor columns 120. The memory hole MH is a through via hole that extends in the Z direction and penetrates the insulating layer 103, the plurality of insulating layers 101, the plurality of insulating layers 110A, the sacrificial layer 113B, the sacrificial layer 113C, the sacrificial layer 113D, and the semiconductor layer 113E to expose the upper surface of the semiconductor layer 113A. This step is performed by, for example, a method such as RIE.

Figure 14:
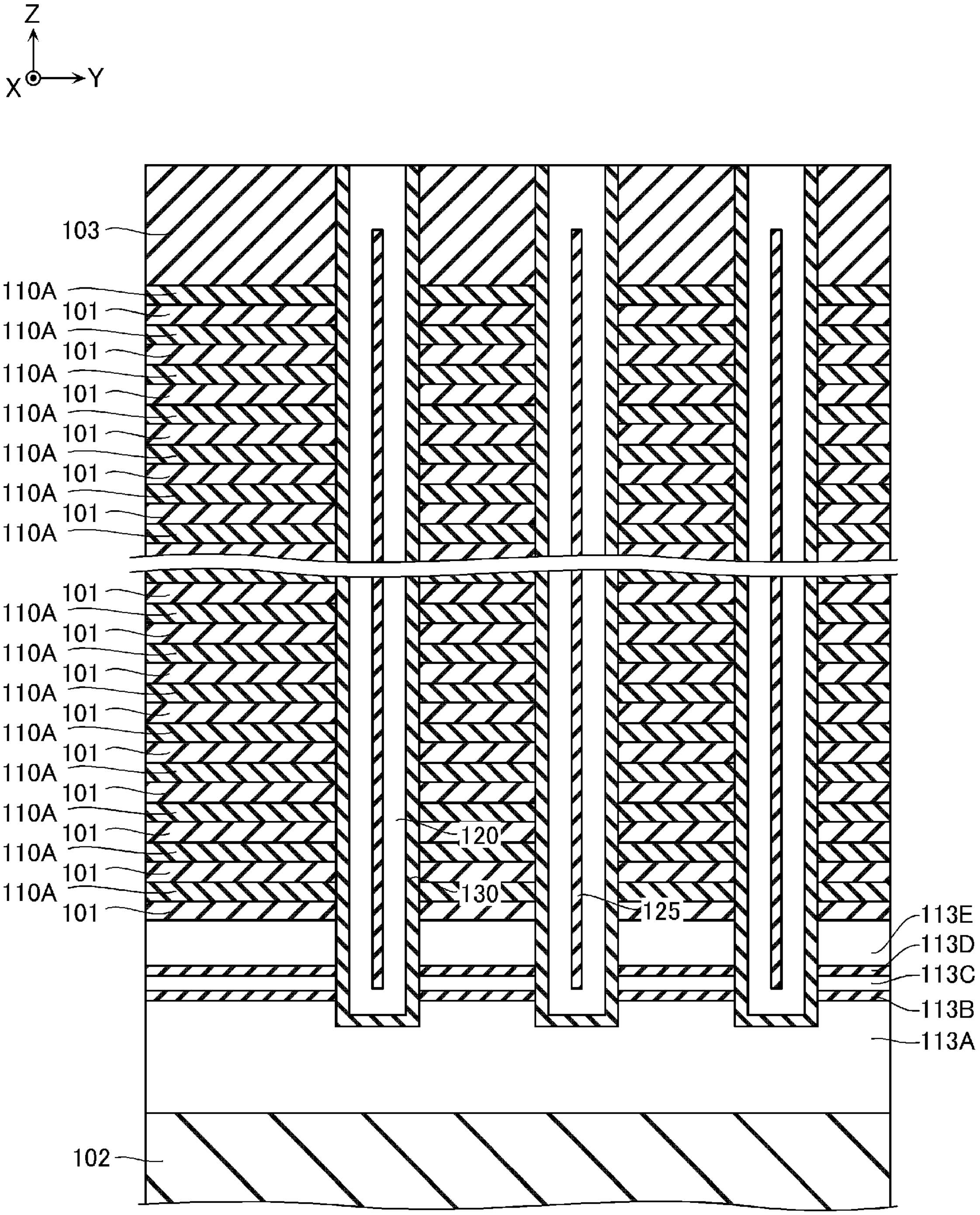

Next, for example, as shown in FIG. 14, the gate insulating film 130, the semiconductor column 120, and the insulating layer 125 are formed inside the memory hole MH. In this step, for example, a film is formed by CVD or the like, and an amorphous silicon film is formed inside the memory hole MH. In addition, for example, the crystal structure of the amorphous silicon film is modified by an annealing treatment or the like.

Figure 15:
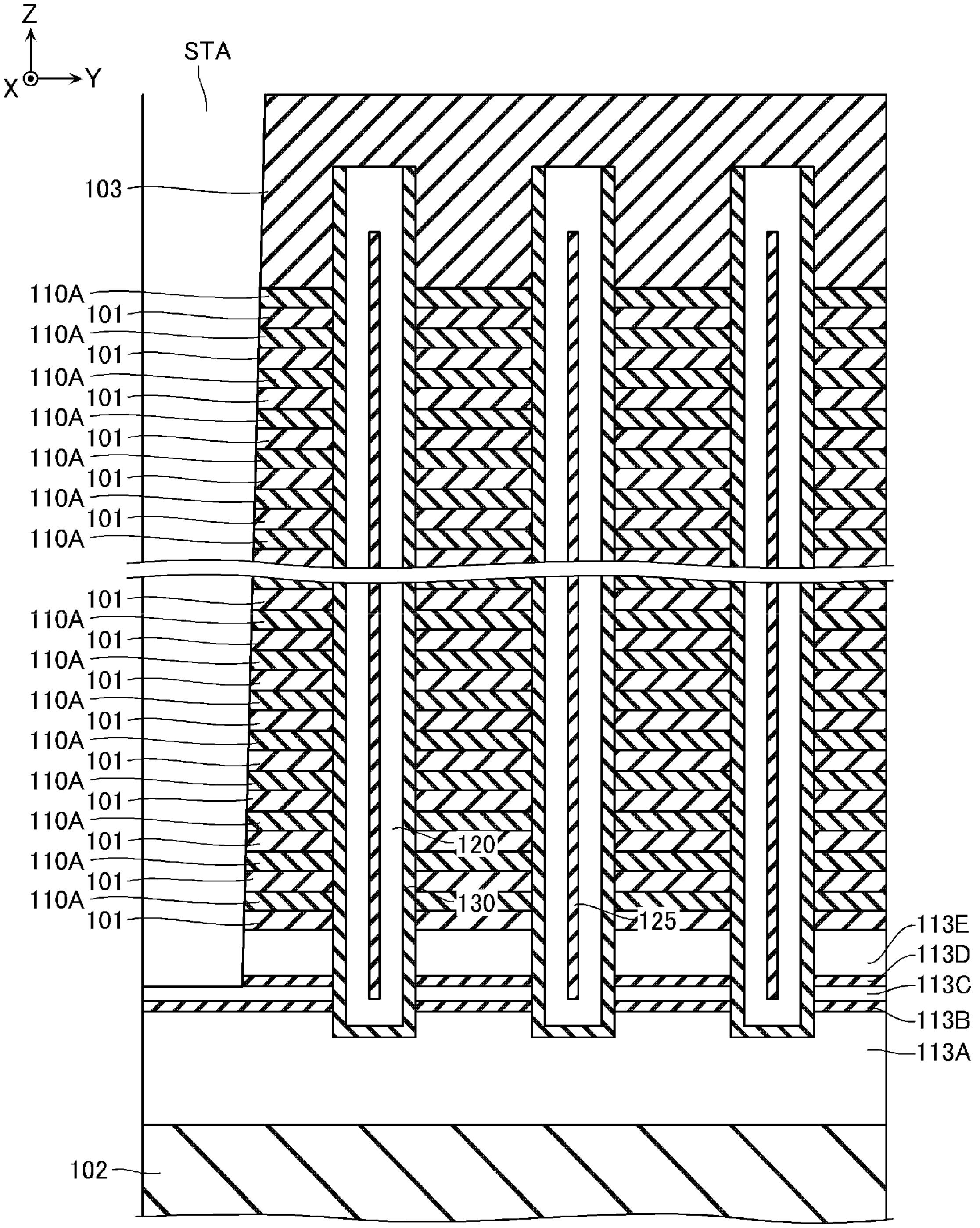

Next, for example, as shown in FIG. 15, the insulating layer 103 is further formed above the structure shown in FIG. 14. This step is performed by, for example, CVD. In addition, a groove STA is formed at a position corresponding to the inter-finger structure ST. The groove STA extends in the Z direction and the X direction, divides the insulating layer 103, the plurality of insulating layers 101, the plurality of insulating layers 110A, the semiconductor layer 113E, and the sacrificial layer 113D in the Y direction, and exposes the upper surface of the sacrificial layer 113C. This step is performed by, for example, a method such as RIE.

Figure 16:
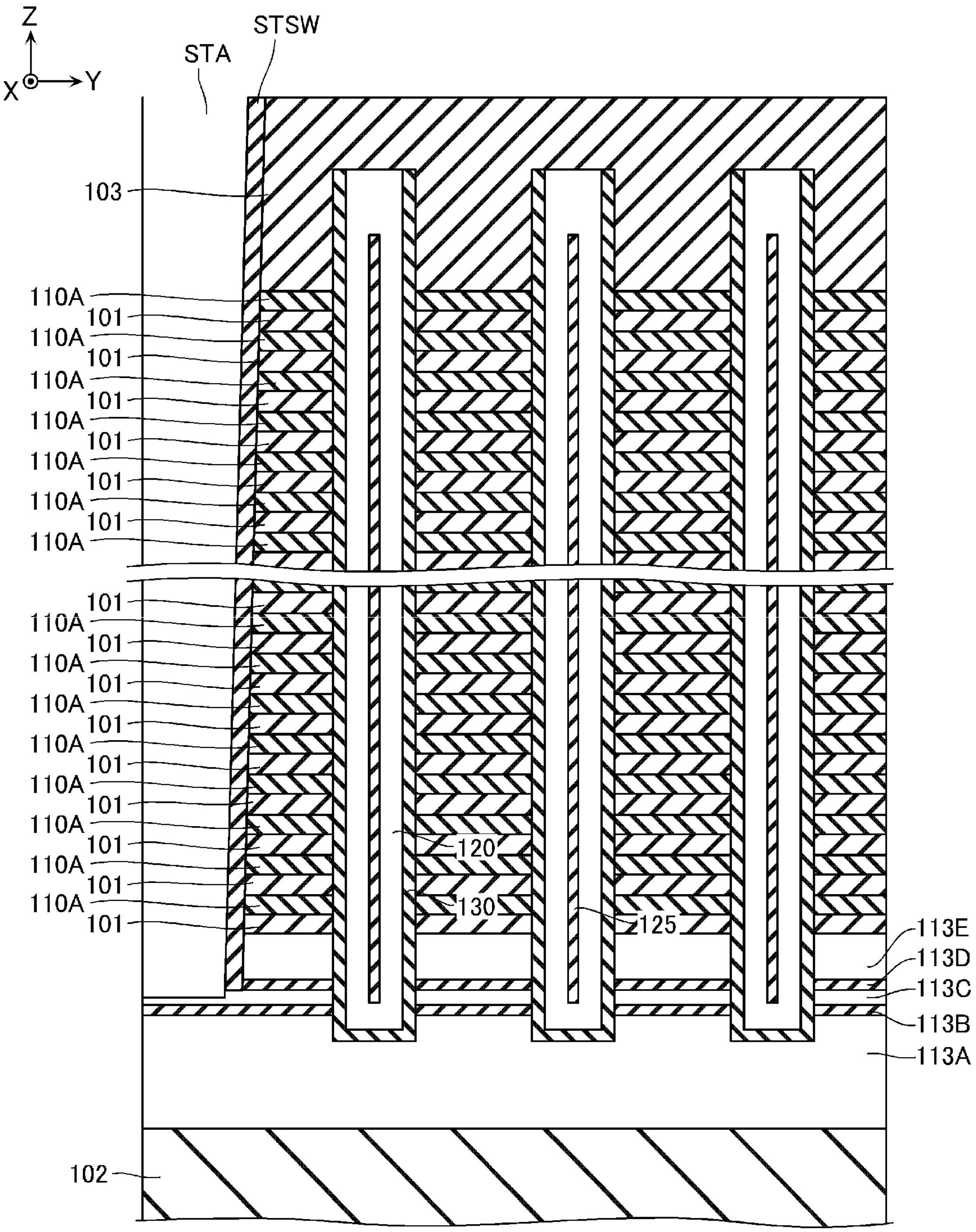

Next, for example, as shown in FIG. 16, a protective film STSW made of silicon nitride or the like is formed on the side surface of the groove STA in the Y direction. In this step, for example, an insulating film formed of silicon nitride is formed on the side surface in the Y direction and the bottom surface of the groove STA by a method such as CVD. In addition, a portion of the insulating film that covers the bottom surface of the groove STA is removed by a method such as RIE.

Figure 17:
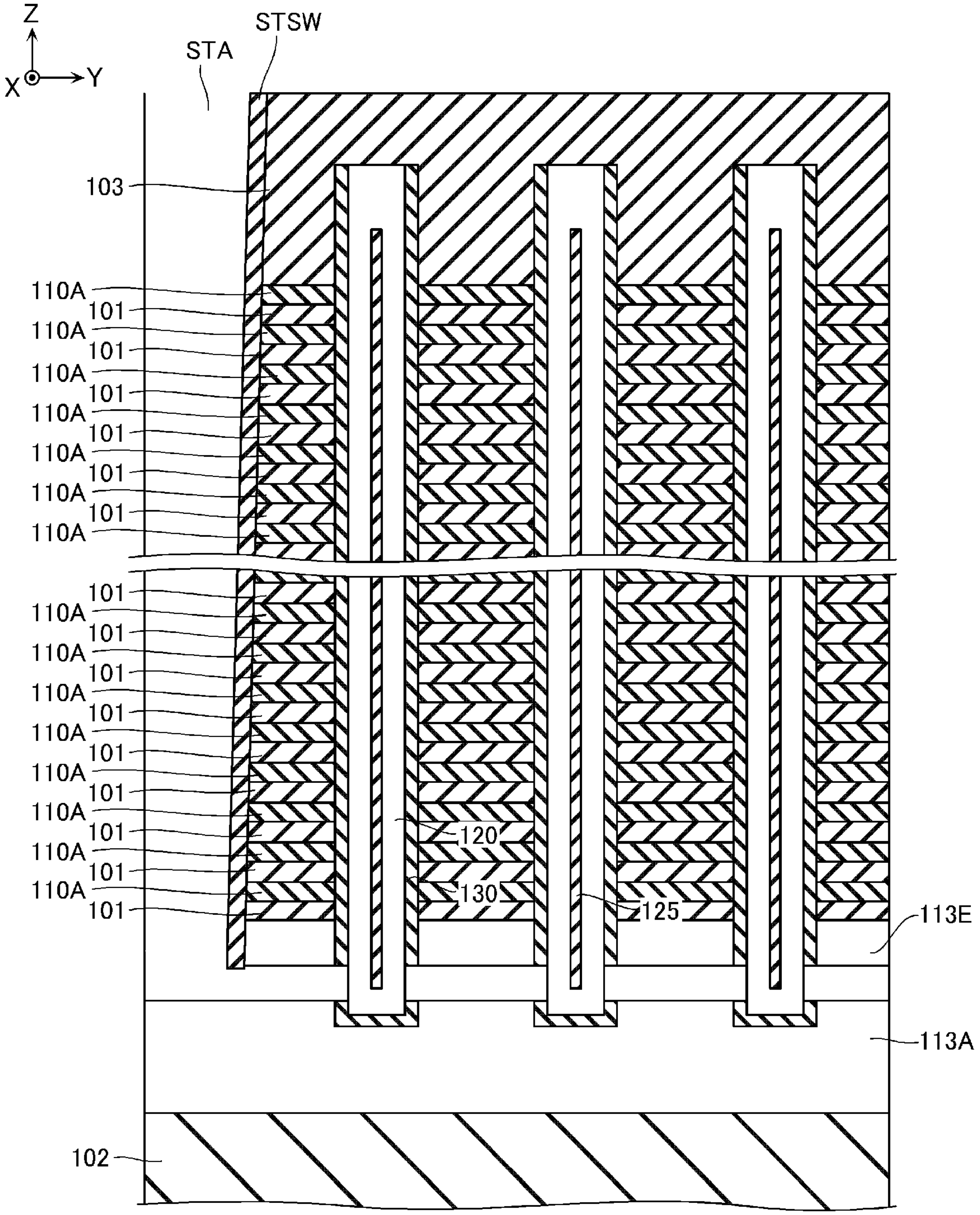

Next, for example, as shown in FIG. 17, a part of the sacrificial layer 113B, the sacrificial layer 113C, the sacrificial layer 113D, and the gate insulating film 130 is removed to expose a part of the semiconductor column 120. This step is performed by, for example, a method such as wet etching.

Figure 18:
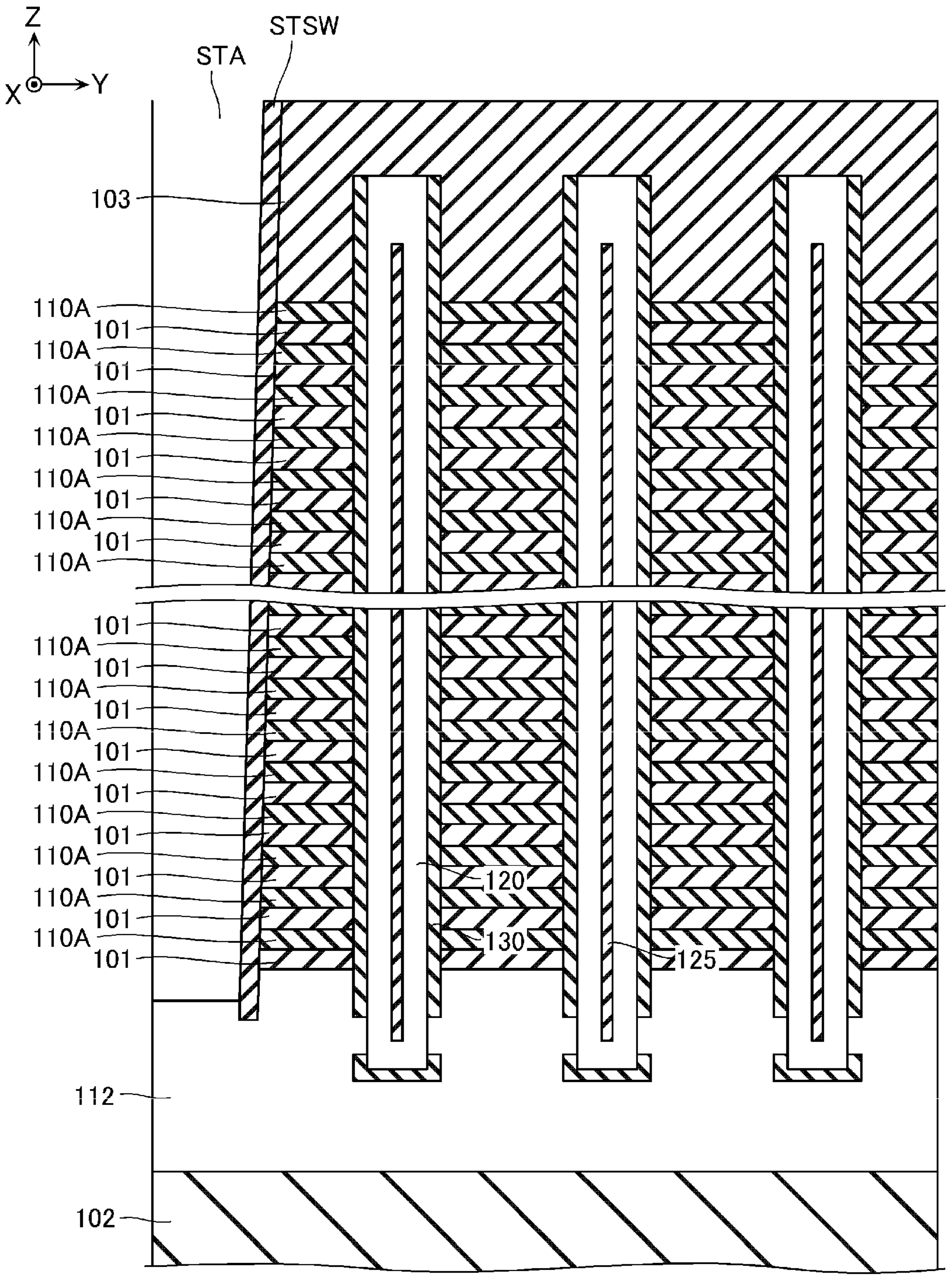

Then, for example, as shown in FIG. 18, a conductive layer 112 is formed. This step is performed by, for example, a method such as epitaxial growth.

Figure 19:
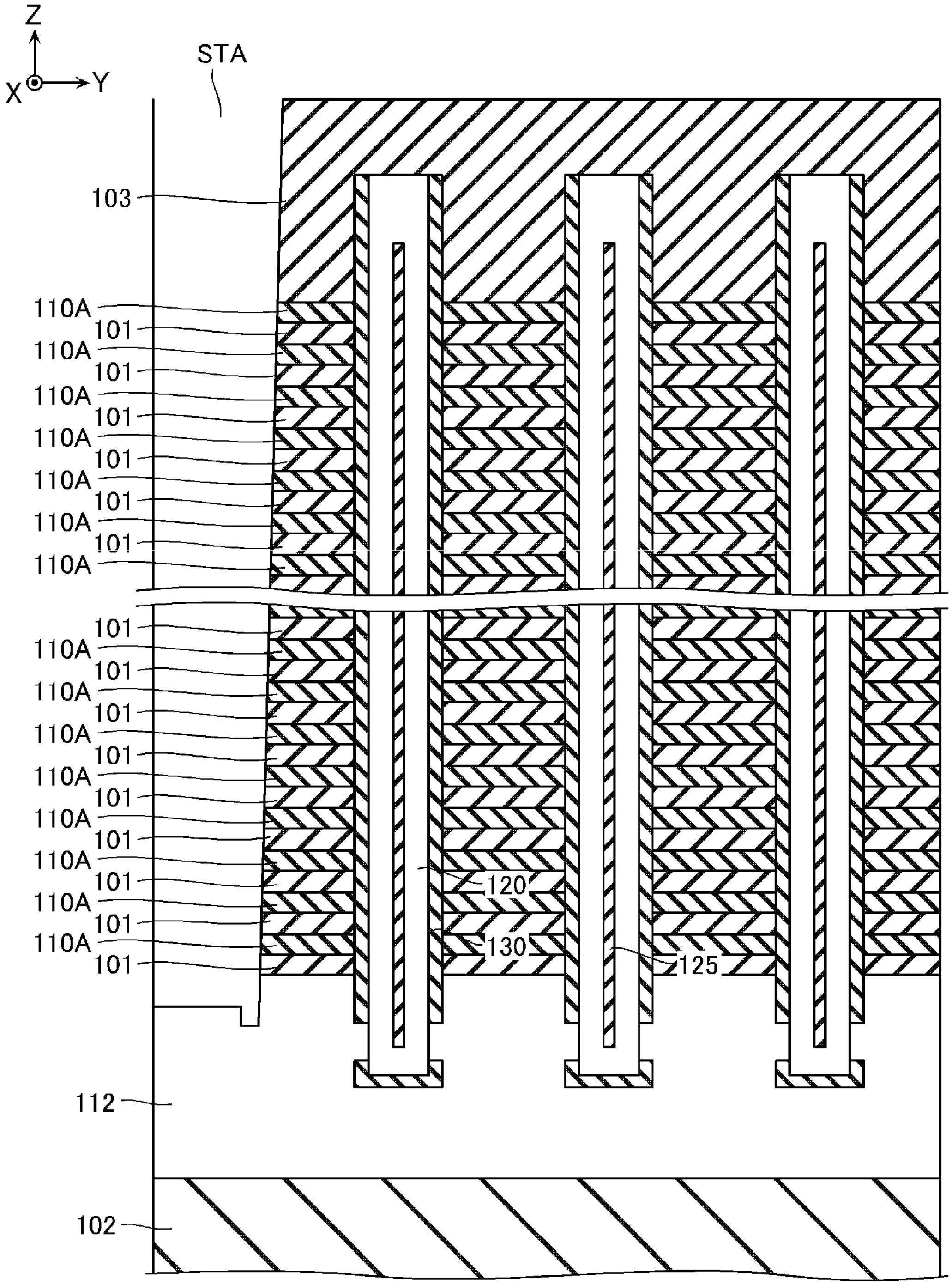

Next, for example, as shown in FIG. 19, the protective film STSW is removed. This step is performed by, for example, a method such as wet etching.

Figure 20:
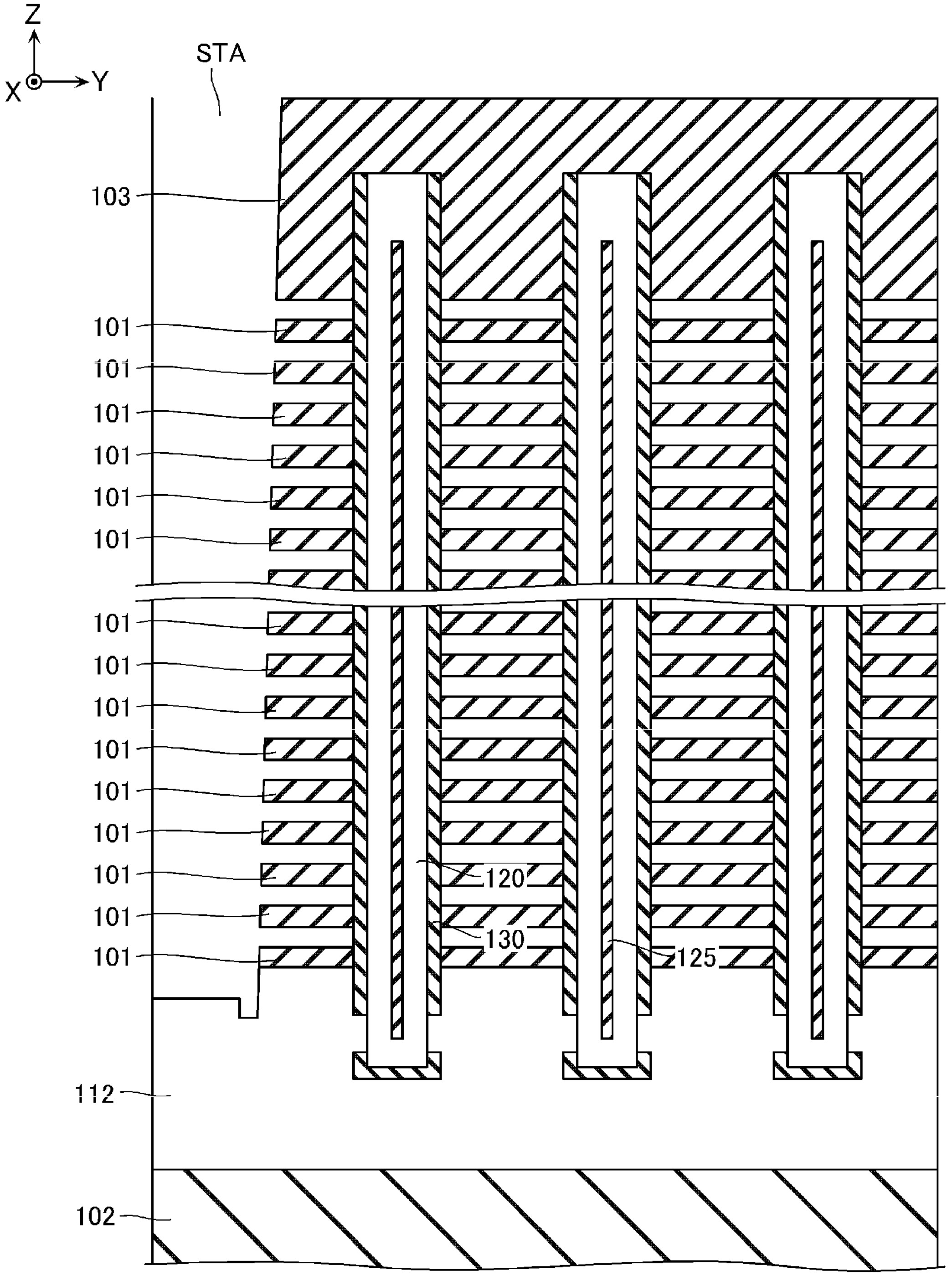

Then, as shown in FIG. 20, for example, the insulating layer 110A is removed through the groove STA. As a result, a plurality of insulating layers 101 arranged in the Z direction and a structure (the semiconductor column 120, the gate insulating film 130, and the insulating layer 125) in the memory hole MH supporting the insulating layer 101 are formed. This step is performed by, for example, a method such as wet etching.

Figure 21:
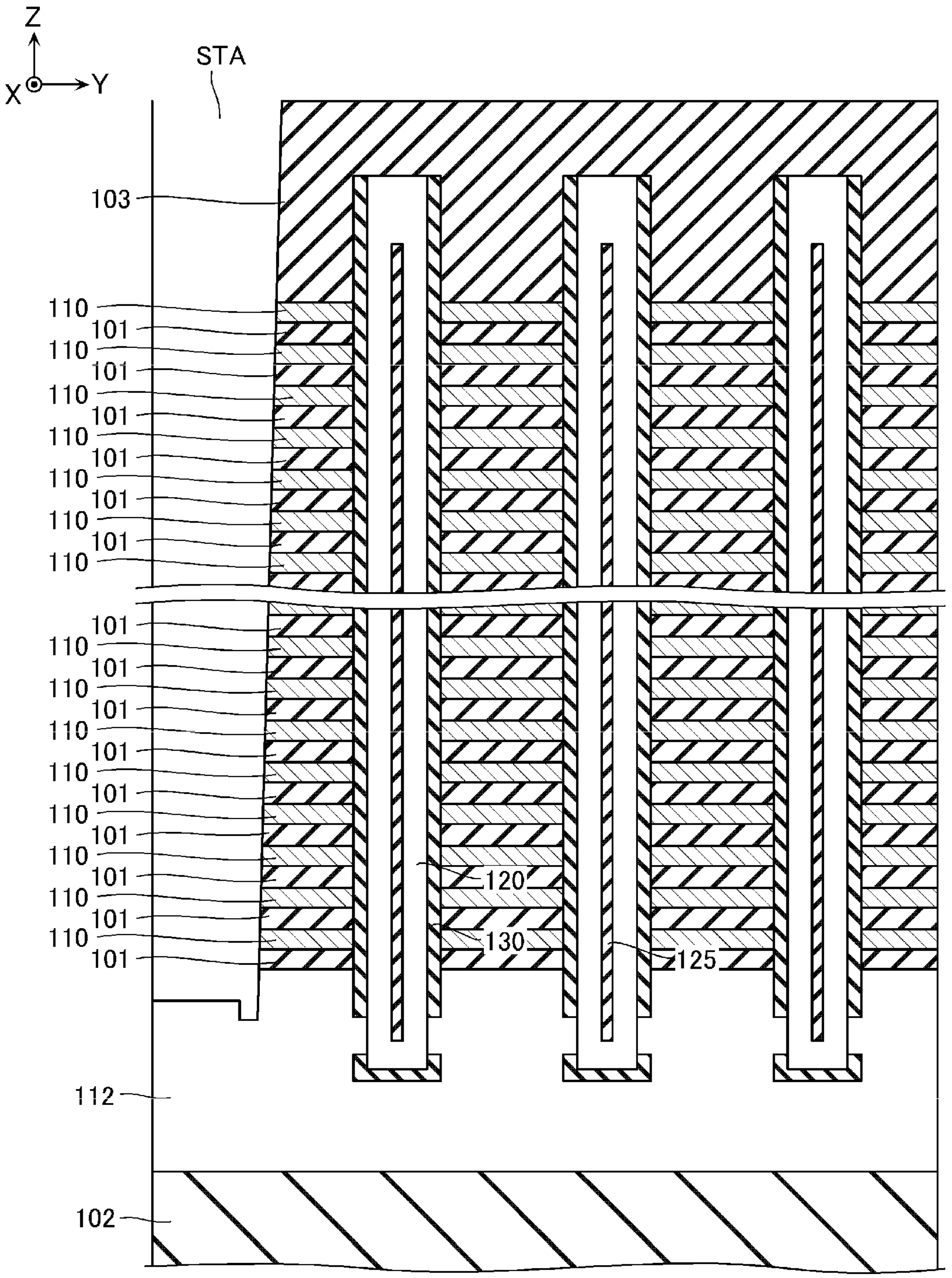

Then, for example, as shown in FIG. 21, a conductive layer 110 is formed. This step is performed by, for example, a method such as CVD.

Figure 22:
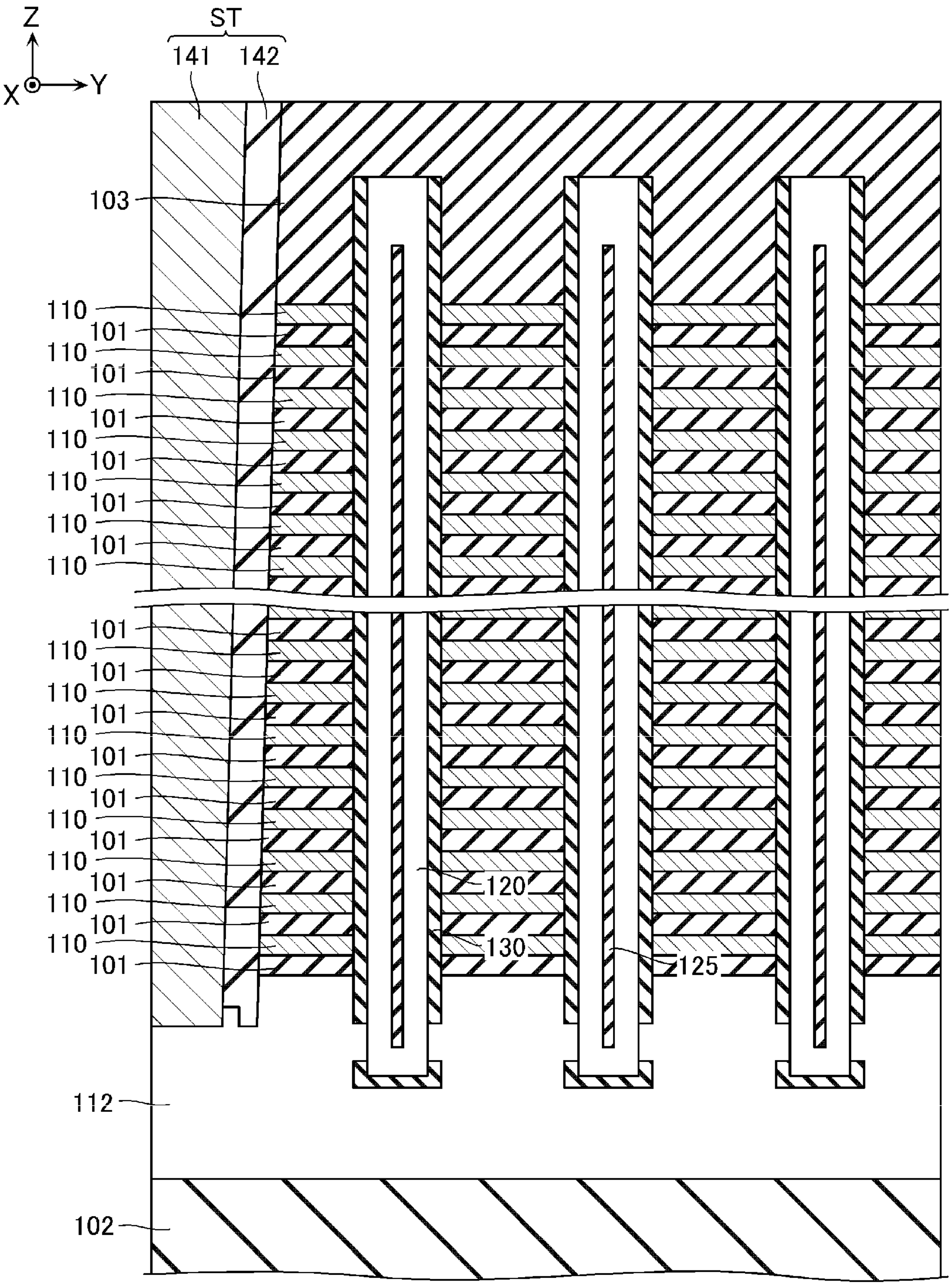

Next, for example, as shown in FIG. 22, the inter-finger structure ST is formed in the groove STA. This step is performed by, for example, methods such as CVD and RIE.

Short Circuit Between Conductive Layer 110 and Semiconductor Column 120

Figure 23:
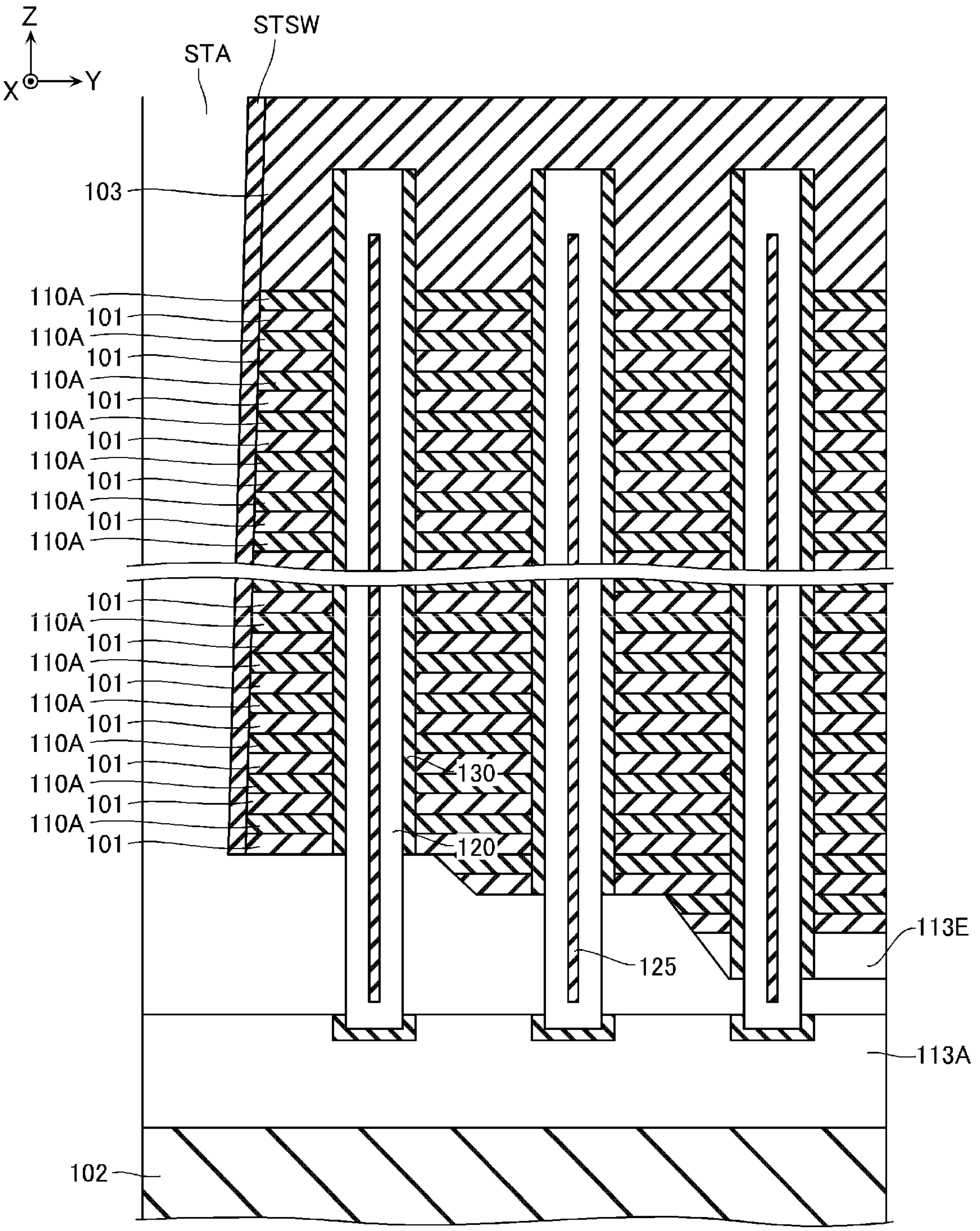
FIG. 23 is a cross-sectional view schematically illustrating one cause of a short circuit between a conductive layer and a semiconductor column.
Figure 24:
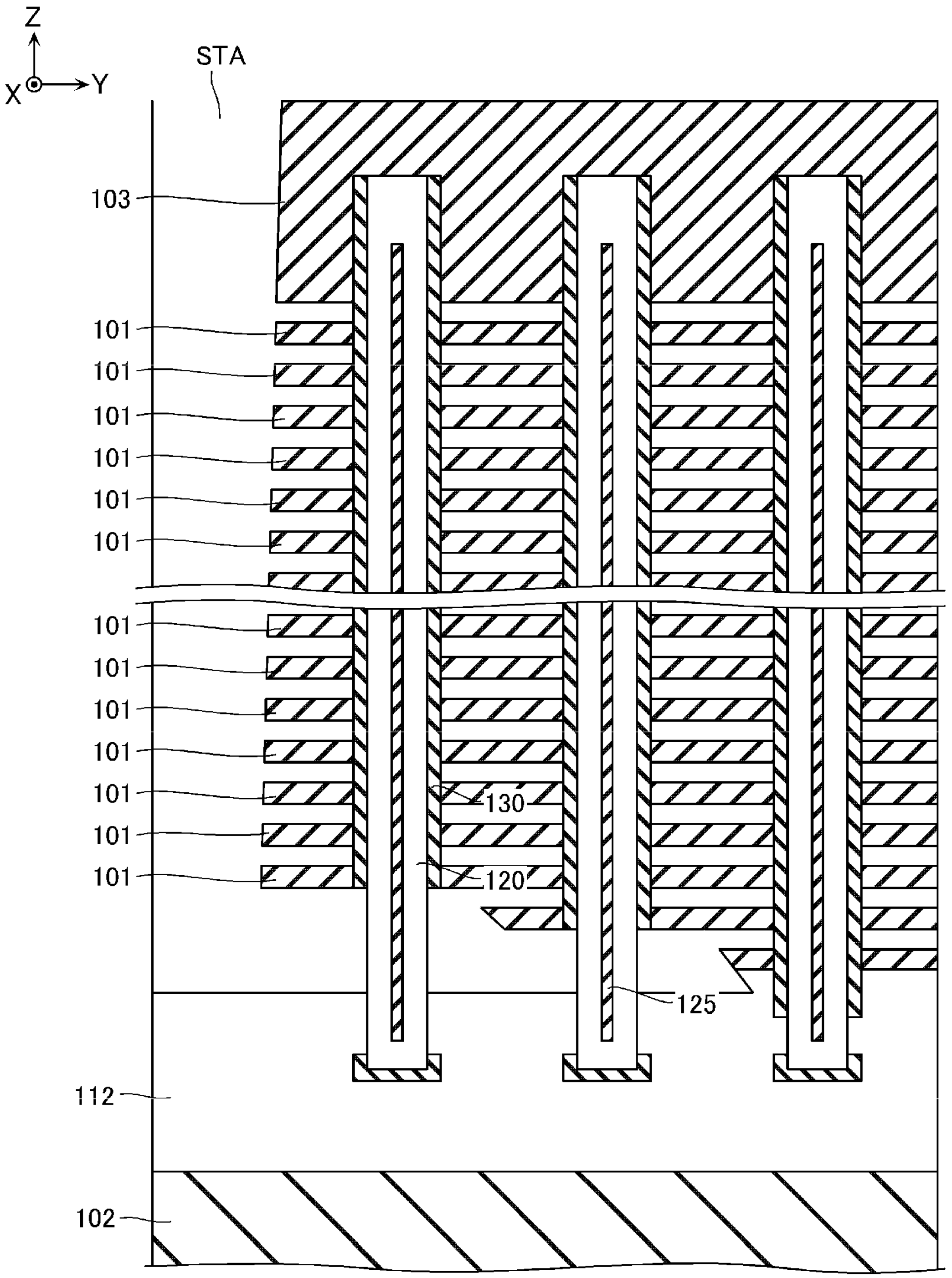
FIG. 24 is a cross-sectional view schematically illustrating another cause of the short circuit between the conductive layer and the semiconductor column.

FIGS. 23 and 24 are cross-sectional views schematically illustrating one cause of a short circuit between the conductive layer 110 and the semiconductor column 120.

For example, in the step described with reference to FIG. 17, as shown in FIG. 23, there is a concern that a part of the semiconductor layer 113E, the insulating layer 110A, the insulating layer 101, and the like is removed, and in the step described with reference to FIG. 20, as shown in FIG. 24, a part of the outer peripheral surface of the semiconductor column 120 is exposed to the groove STA. Therefore, in the step described with reference to FIG. 21, a metal such as titanium nitride or tungsten contained in the conductive layer 110 may be formed on the exposed portion of the semiconductor column 120. A metal atom may move in the Z direction along the outer peripheral surface of the semiconductor column 120 and may further diffuse in the gate insulating film 130, thereby causing a short circuit between the conductive layer 110 and the semiconductor column 120. For example, when the semiconductor column 120 disposed in the dummy memory hole region $R_{DMH}$ is short-circuited with two or more conductive layers 110, it is not possible to suitably supply a voltage to the two or more conductive layers 110.

Effects

As described with reference to FIGS. 9 and 10, the semiconductor column 120 disposed in the memory hole region $R_{MH}$ is connected to the sense amplifier unit SAU through the bit line BL. Therefore, the short circuit between the conductive layer 110 and the semiconductor column 120 may be detected by supplying a voltage to the bit line BL and the word line WL to measure the voltage or current of the bit line BL or the word line WL.

Accordingly, in order to detect the short circuit between the semiconductor column 120 and the conductive layer 110 disposed in the dummy memory hole region $R_{DMH}$, for example, a plurality of sense amplifier units SAU may be provided corresponding to the plurality of dummy bit lines DBL. However, when such a configuration is employed, the circuit area is increased.

On the other hand, when the sense amplifier unit SAU corresponding to the dummy bit line DBL is simply omitted, the voltage may not be supplied to the dummy bit line DBL, and thus the short circuit between the semiconductor column 120 and the conductive layer 110 disposed in the dummy memory hole region $R_{DMH}$ may not be detected.

Therefore, in the semiconductor memory device according to the present embodiment, the plurality of dummy bit lines DBL are electrically connected to the external pad electrode $P(V_{SS})$ through the node N1 and the transistor $Tr_{DEC}$. According to the above-described configuration, the dummy bit line DBL and the word line WL are supplied with a voltage, and the voltage or current of the dummy bit line DBL or the word line WL is measured, whereby it is possible to detect a short circuit between the semiconductor column 120 and the conductive layer 110 disposed in the dummy memory hole region $R_{DMH}$. In addition, the above-described configuration may be realized with a smaller area as compared with a configuration in which a plurality of sense amplifier units SAU are provided corresponding to the plurality of dummy bit lines DBL.

Test Step of Memory Die MD Before Shipment

In the test step before the shipment of the memory die MD, for example, a voltage higher than the threshold voltage of the dummy transistor DTr is supplied to the plurality of word lines WL (FIG. 9) and the drain-side select gate line SGD (FIG. 9). As a result, the plurality of dummy transistors DTr connected to the plurality of word lines WL (FIG. 9) and the drain-side select gate line SGD (FIG. 9) are turned into an ON state. In addition, a voltage smaller than the threshold voltage of the dummy transistor DTr is supplied to the source-side select gate line SGS (FIG. 9). As a result, the plurality of dummy transistors DTr connected to the source-side select gate line SGS (FIG. 9) are turned into an OFF state.

In addition, in this test step, a voltage higher than the threshold voltage of the transistor $Tr_{DEC}$ is supplied to the gate electrode of the transistor $Tr_{DEC}$ (FIG. 9). As a result, the transistor $Tr_{DEC}$ is turned into the ON state, and the ground voltage $V_{SS}$ is supplied to the plurality of dummy bit lines DBL. In addition, the ground voltage $V_{SS}$ is supplied to the channel regions of the plurality of dummy transistors DTr in the dummy string DMS.

Here, when the semiconductor layer and the gate electrode of the dummy transistor DTr are not short-circuited, no current flows through the word line WL. On the other hand, when the semiconductor layer and the gate electrode of the dummy transistor DTr are short-circuited, a current flows through the word line WL. Therefore, for example, the current flowing through the word line WL is measured by the current measurement circuit DEC (FIG. 9), and thus it is possible to detect the short circuit between the semiconductor layer and the gate electrode of the dummy transistor DTr. When a short circuit is detected, for example, the memory block BLK corresponding to the dummy transistor DTr may be set as a defective block, and the use of the memory block BLK set as the defective block may be prohibited.

Second Embodiment

As described with reference to FIG. 11, in the first embodiment, one transistor $Tr_{DEC}$ is connected to the plurality of dummy bit lines DBL through the node N1. However, such a configuration is merely an example, and for example, a plurality of transistors may be provided corresponding to the plurality of dummy bit lines DBL. Hereinafter, such an example will be described as a second embodiment.

Figure 25:
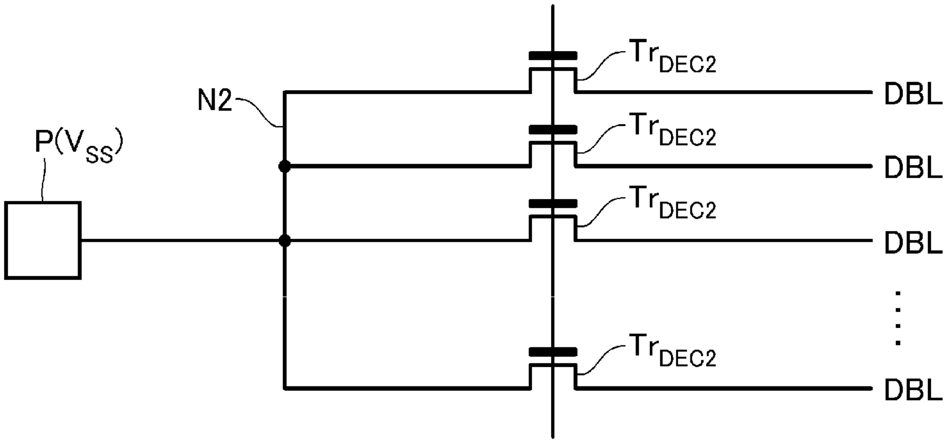
FIG. 25 is a circuit diagram schematically showing a partial configuration of a semiconductor memory device according to a second embodiment.

FIG. 25 is a circuit diagram schematically showing a partial configuration of the semiconductor memory device according to the second embodiment. The semiconductor memory device according to the second embodiment is basically configured in the similar manner to the semiconductor memory device according to the first embodiment. However, as shown in FIG. 25, the semiconductor memory device according to the second embodiment includes the node N2 and the plurality of transistors $Tr_{DEC2}$ instead of the node N1 and the transistor $Tr_{DEC}$.

The source electrode of the transistor $Tr_{DEC2}$ is electrically connected to the external pad electrode $P(V_{SS})$ through the node N2. The drain electrode of the transistor $Tr_{DEC2}$ is connected to one dummy bit line DBL. Gate electrodes of a plurality of transistors $Tr_{DEC2}$ are commonly connected to a sequencer (not shown) and are collectively controlled by the sequencer.

The node N2 is electrically connected to the plurality of dummy bit lines DBL through the plurality of transistors $Tr_{DEC2}$.

Even with such a configuration, it is possible to achieve the same effect as the semiconductor memory device according to the first embodiment.

In addition, when the plurality of semiconductor columns 120 are short-circuited with the conductive layer 110 in the dummy memory hole region $R_{DMH}$, a relatively large current may flow to the external pad electrode $P(V_{SS})$. In this regard, in the second embodiment, since one transistor $Tr_{DEC2}$ is provided corresponding to one dummy bit line DBL, it is possible to reduce the maximum value of the current flowing through one transistor $Tr_{DEC2}$.

In the second embodiment, since a plurality of transistors $Tr_{DEC2}$ are provided in correspondence to the plurality of dummy bit lines DBL, the circuit area may be increased as compared with the first embodiment. However, for example, it is possible to realize a smaller area as compared to a case where a plurality of sense amplifier units SAU are provided corresponding to the plurality of dummy bit lines DBL.

Third Embodiment

As described with reference to FIG. 11, in the first embodiment, the dummy bit line DBL is electrically connected to the external pad electrode $P(V_{SS})$ through the transistor $Tr_{DEC}$. However, such a configuration is merely an example, and the dummy bit line DBL may be electrically connected to other configurations. Hereinafter, such an example will be described as a third embodiment.

Figure 26:
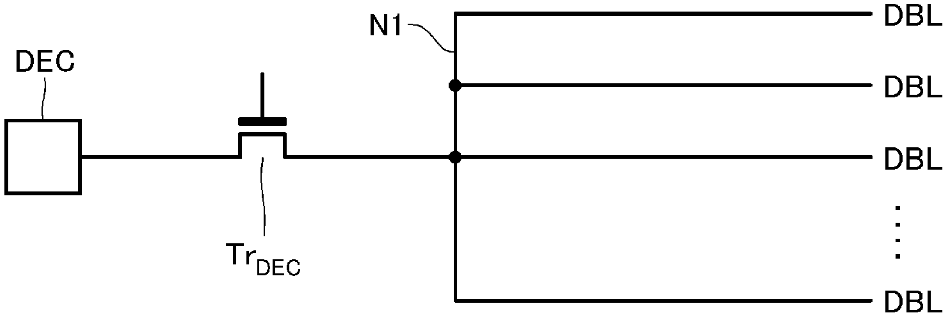
FIG. 26 is a circuit diagram schematically showing a partial configuration of a semiconductor memory device according to a third embodiment.

FIG. 26 is a circuit diagram schematically showing a partial configuration of the semiconductor memory device according to the third embodiment. The semiconductor memory device according to the third embodiment is basically configured in the similar manner to the semiconductor memory device according to the first embodiment.

However, in the third embodiment, the plurality of dummy bit lines DBL are electrically connected to the current measurement circuit DEC described with reference to FIG. 9 through the node N1 and the transistor $Tr_{DEC}$. The current measurement circuit DEC does not include a data latch circuit.

Even with such a configuration, it is possible to achieve the same effect as the semiconductor memory device according to the first embodiment.

In addition, in the first embodiment, the current flowing through the word line WL is measured by the current measurement circuit DEC (FIG. 9), and thus, the short circuit between the semiconductor layer and the gate electrode is detected. In such a method, it is not possible to directly distinguish between the short circuit in the memory hole region $R_{MH}$ and the short circuit in the dummy memory hole region $R_{DMH}$. Therefore, for example, there is a concern that it takes time to specify a defective portion.

On the other hand, in the third embodiment, the current flowing through the dummy bit line DBL is measured by the current measurement circuit DEC, and thus, it is possible to detect the short circuit between the semiconductor layer and the gate electrode. Therefore, in the third embodiment, it is possible to directly distinguish between the short circuit in the memory hole region $R_{MH}$ and the short circuit in the dummy memory hole region $R_{DMH}$. Therefore, for example, it is possible to specify a defective portion relatively easily.

Fourth Embodiment

Figure 27:
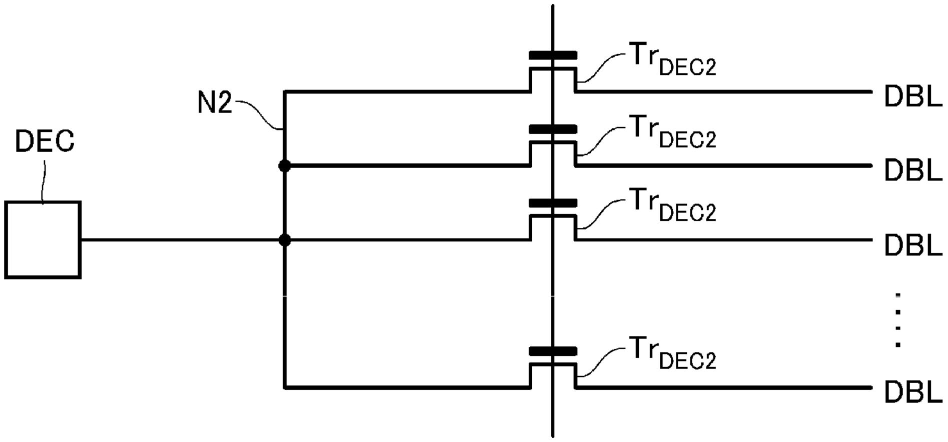
FIG. 27 is a circuit diagram schematically showing a partial configuration of a semiconductor memory device according to a fourth embodiment.

FIG. 27 is a circuit diagram schematically showing a partial configuration of the semiconductor memory device according to the fourth embodiment. The semiconductor memory device according to the fourth embodiment is basically configured in the similar manner to the semiconductor memory device according to the second embodiment.

However, in the fourth embodiment, the plurality of dummy bit lines DBL are electrically connected to the current measurement circuit DEC described with reference to FIG. 9 through the plurality of transistors $Tr_{DEC2}$ and the node N2.

Even with such a configuration, it is possible to achieve the same effects as those of the semiconductor memory devices according to the first to third embodiments.

Fifth Embodiment

Figure 28:
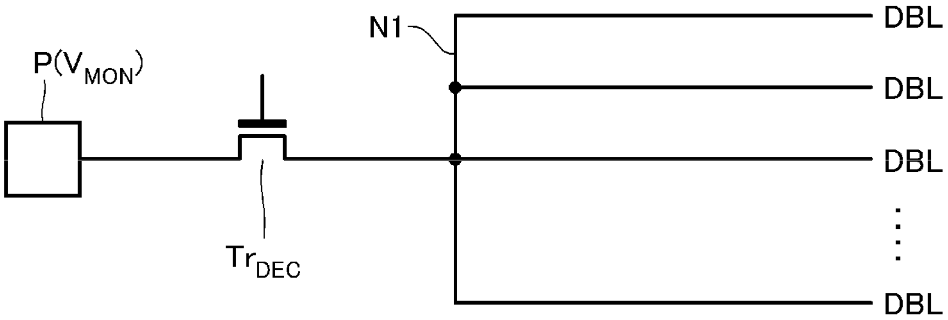
FIG. 28 is a circuit diagram schematically showing a partial configuration of a semiconductor memory device according to a fifth embodiment.

FIG. 28 is a circuit diagram schematically showing a partial configuration of the semiconductor memory device according to the fifth embodiment. The semiconductor memory device according to the fifth embodiment is basically configured in the similar manner to the semiconductor memory device according to the first embodiment.

However, in the semiconductor memory device according to the fifth embodiment, the dummy bit line DBL is electrically connected to the external pad electrode $P(V_{MON})$ through the node N1 and the transistor $Tr_{DEC}$. The external pad electrode $P(V_{MON})$ is one of the plurality of external pad electrodes P described with reference to FIG. 2 and is capable of measuring a voltage of another internal node and the like in the circuit configuration of the semiconductor memory device.

In the test step of the semiconductor memory device according to the fifth embodiment, the tester probe is brought into contact with the external pad electrode $P(V_{MON})$, a voltage is supplied by the tester, and a leakage current is measured.

Even with such a configuration, it is possible to achieve the same effects as those of the semiconductor memory devices according to the first embodiment and the third embodiment.

In addition, in the fifth embodiment, in the test step, since the voltage of the dummy bit line DBL is controlled by the tester, it is possible to freely control the supplied voltage.

Sixth Embodiment

Figure 29:
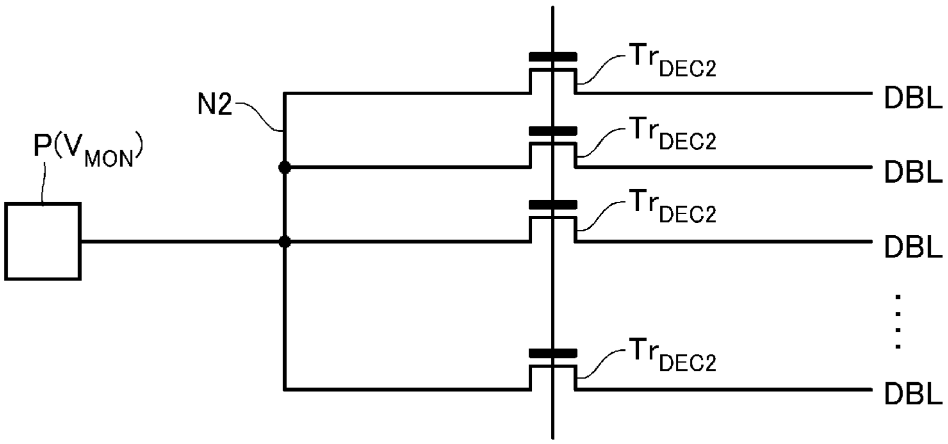
FIG. 29 is a circuit diagram schematically showing a partial configuration of a semiconductor memory device according to a sixth embodiment.

FIG. 29 is a circuit diagram schematically showing a partial configuration of the semiconductor memory device according to the sixth embodiment. The semiconductor memory device according to the sixth embodiment is basically configured in the similar manner to the semiconductor memory device according to the second embodiment.

However, in the semiconductor memory device according to the sixth embodiment, the plurality of dummy bit lines DBL are electrically connected to the external pad electrode $P(V_{MON})$ through the plurality of transistors $Tr_{DEC2}$ and the node N2.

Even with such a configuration, it is possible to achieve the same effects as those of the semiconductor memory devices according to the first to fifth embodiments.

Seventh Embodiment

Figure 30:
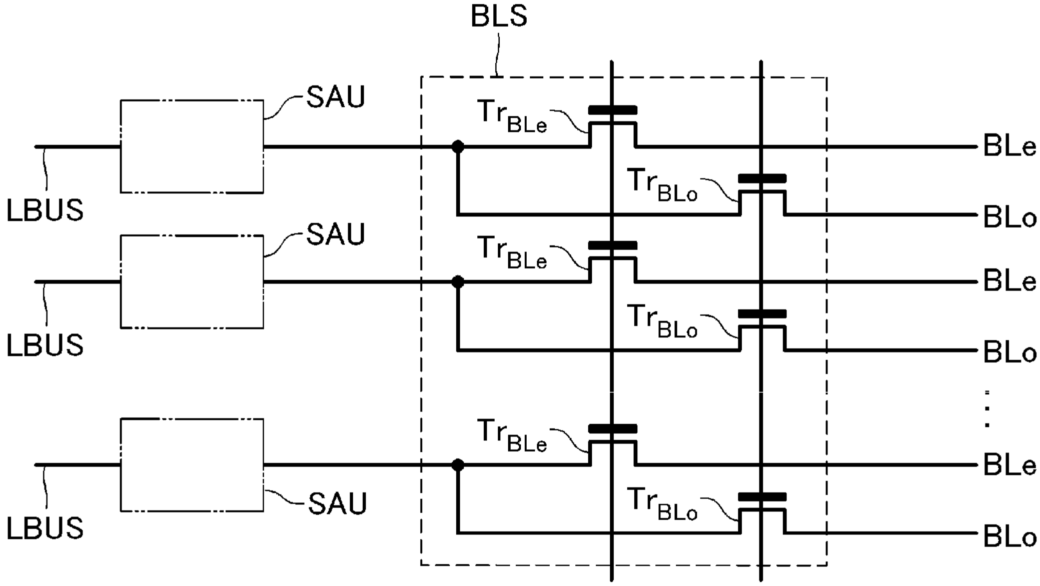
FIG. 30 is a circuit diagram schematically showing a partial configuration of a semiconductor memory device according to a seventh embodiment.

FIG. 30 is a circuit diagram schematically showing a partial configuration of the semiconductor memory device according to the seventh embodiment. The semiconductor memory device according to the seventh embodiment is basically configured in the similar manner to the semiconductor memory device according to the first embodiment.

However, as shown in FIG. 30, the semiconductor memory device according to the seventh embodiment includes a bit line selection circuit BLS. Here, as described with reference to FIG. 6, the bit lines BL are arranged in the X direction. The bit line selection circuit BLS selects one of the even-numbered bit line BLe (FIG. 30) counted from one side in the X direction and the odd-numbered bit line BLo (FIG. 30) counted from one side in the X direction, and causes only the selected one to be conductive with the corresponding sense amplifier unit SAU.

The bit line selection circuit BLS includes a plurality of transistors $Tr_{BLe}$ provided corresponding to the plurality of bit lines BLe and a plurality of transistors $Tr_{BLo}$ provided corresponding to the plurality of bit lines BLo.

The source electrode of the transistor $Tr_{BLe}$ is connected to the sense amplifier unit SAU. The drain electrode of the transistor $Tr_{BLe}$ is connected to the bit line BLe. Gate electrodes of a plurality of transistors $Tr_{BLe}$ in the bit line selection circuit BLS are commonly connected to a sequencer (not shown) and are collectively controlled by the sequencer.

The source electrode of the transistor $Tr_{BLO}$ is connected to the sense amplifier unit SAU. The drain electrode of the transistor $Tr_{BLO}$ is connected to the bit line BLo. Gate electrodes of a plurality of transistors $Tr_{BLo}$ in the bit line selection circuit BLS are commonly connected to a sequencer (not shown) and are collectively controlled by the sequencer.

In the example in FIG. 30, two bit lines BL (bit lines BLe and BLo) are electrically connected to one common sense amplifier unit SAU through a bit line selection circuit BLS. However, three or more bit lines BL may be electrically connected to one common sense amplifier unit SAU through the bit line selection circuit BLS.

In the above described embodiments, when the number of bit lines BL electrically connected to one sense amplifier unit SAU is K1 (where K1 is an integer of 1 or more), and the number of dummy bit lines DBL electrically connected to the node N1 (FIG. 11) is K2 (where K2 is an integer of 2 or more greater than K1), K2 is larger than K1.

The semiconductor memory device according to the second embodiment to sixth embodiment may include the bit line selection circuit BLS as in the semiconductor memory device according to the seventh embodiment. In any case, when the number of bit lines BL electrically connected to one sense amplifier unit SAU is set to K1 (where K1 is an integer of 1 or more), and the number of dummy bit lines DBL electrically connected to the node N1 (FIG. 11) or the node N2 (FIG. 25) is set to K2 (where K2 is an integer of 2 or more), K2 is larger than K1.

Eighth Embodiment

Next, as an eighth embodiment, an application example to a more specific structure will be described. The semiconductor memory device according to the eighth embodiment includes, for example, the peripheral circuit PC according to the first embodiment.

Figure 31:
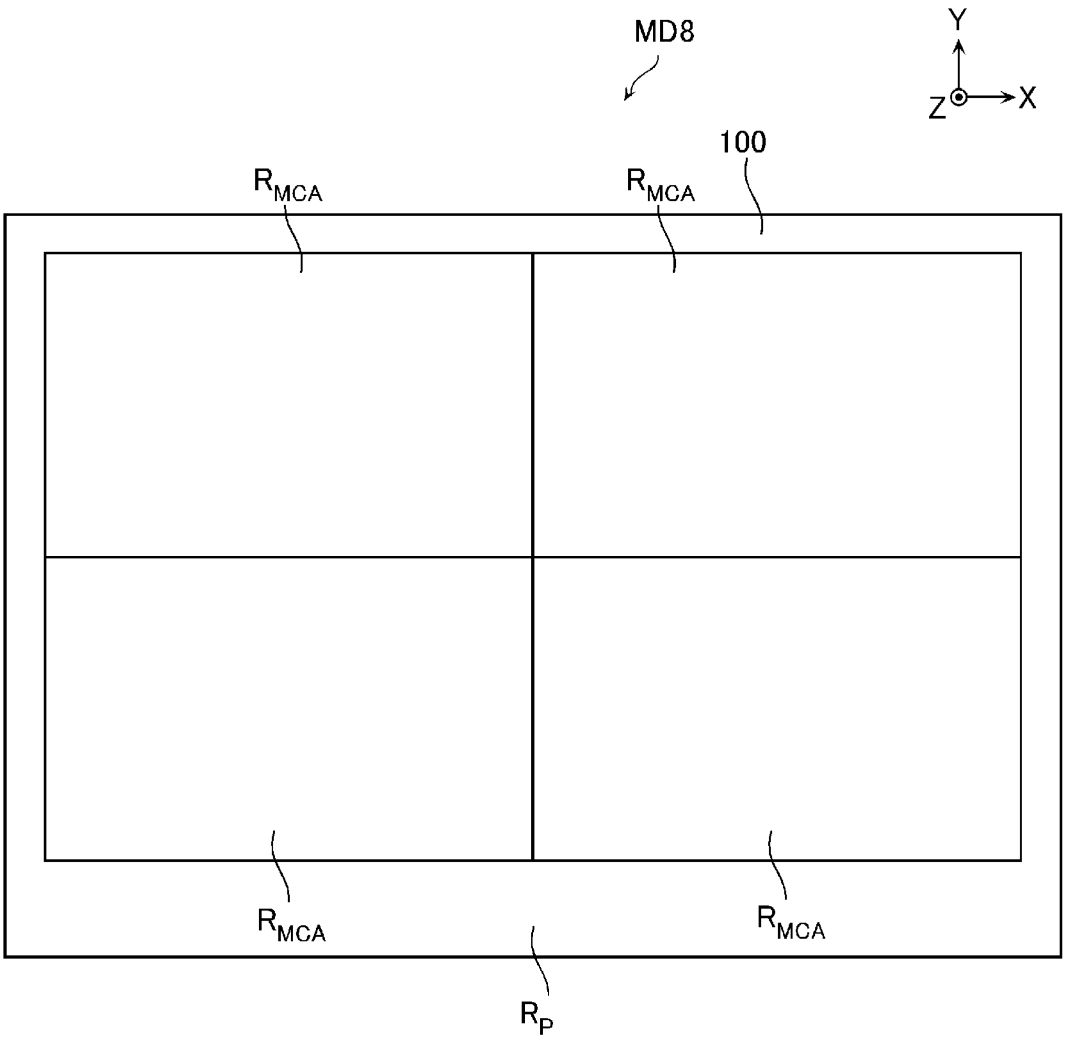
FIG. 31 is a schematic plan view of a memory die according to an eighth embodiment.
Figure 32:
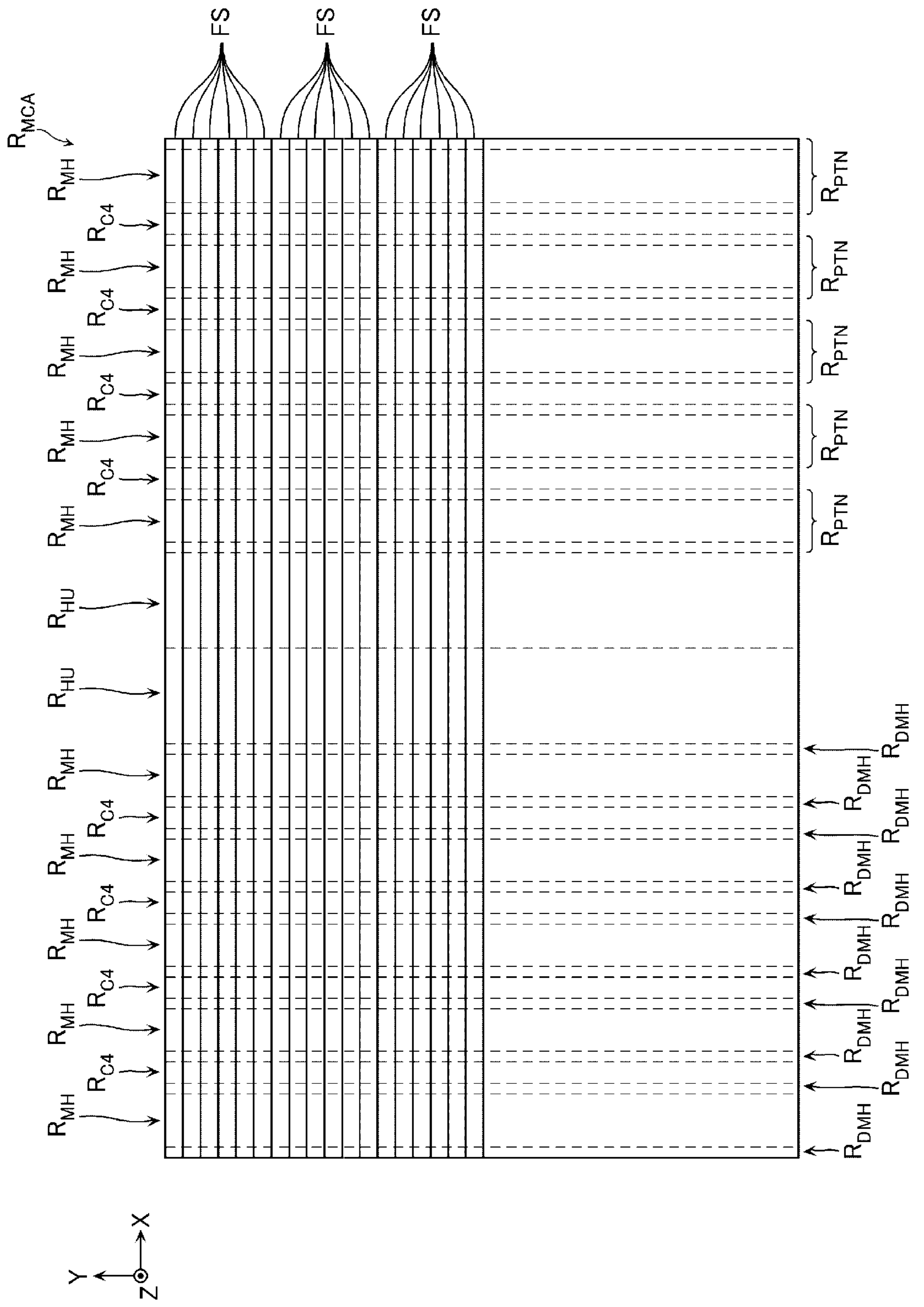
FIG. 32 is a plan view schematically showing a partial configuration of the memory die.
Figure 33:
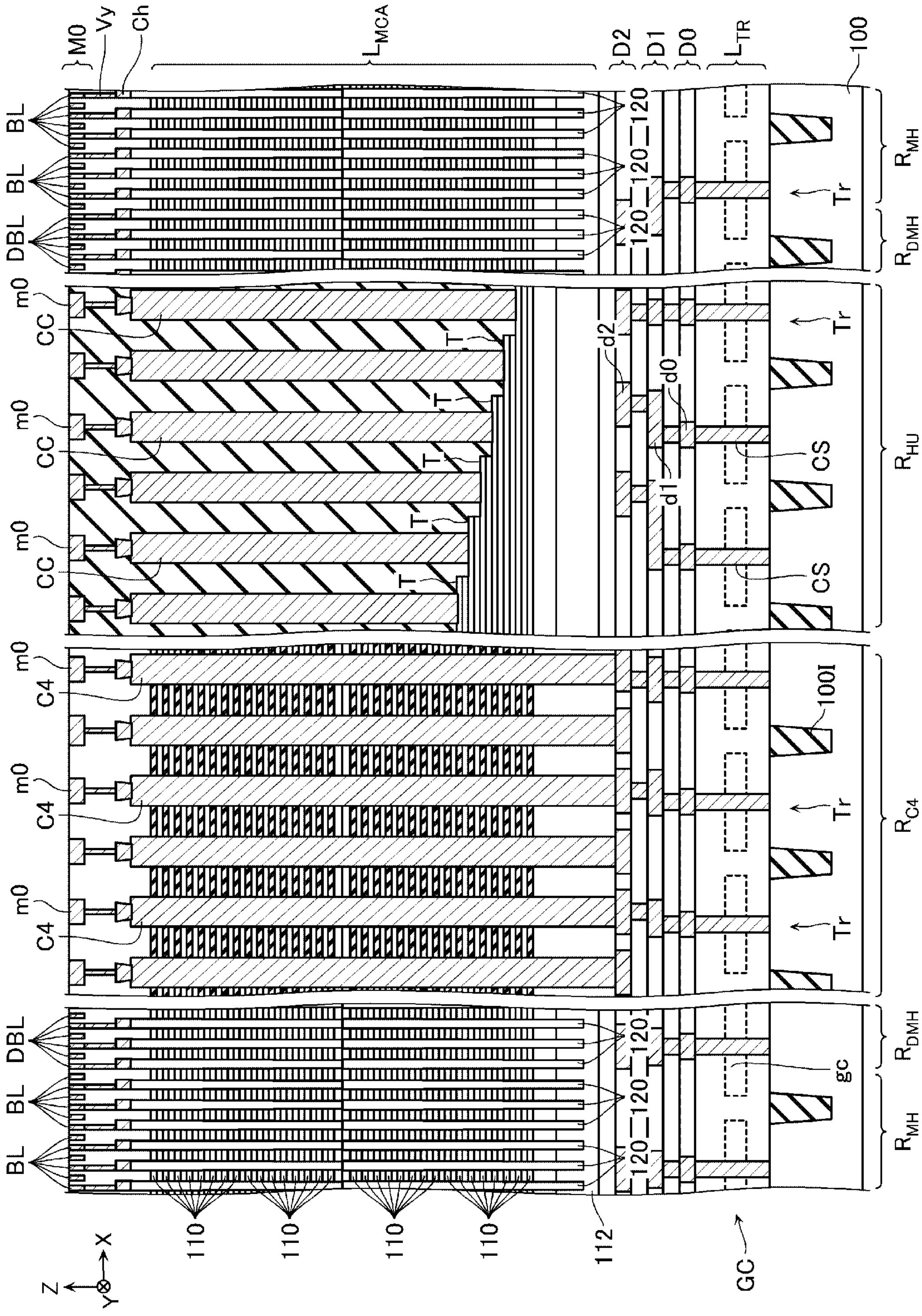
FIG. 33 is a cross-sectional view schematically showing the partial configuration of the memory die.
Figure 34:
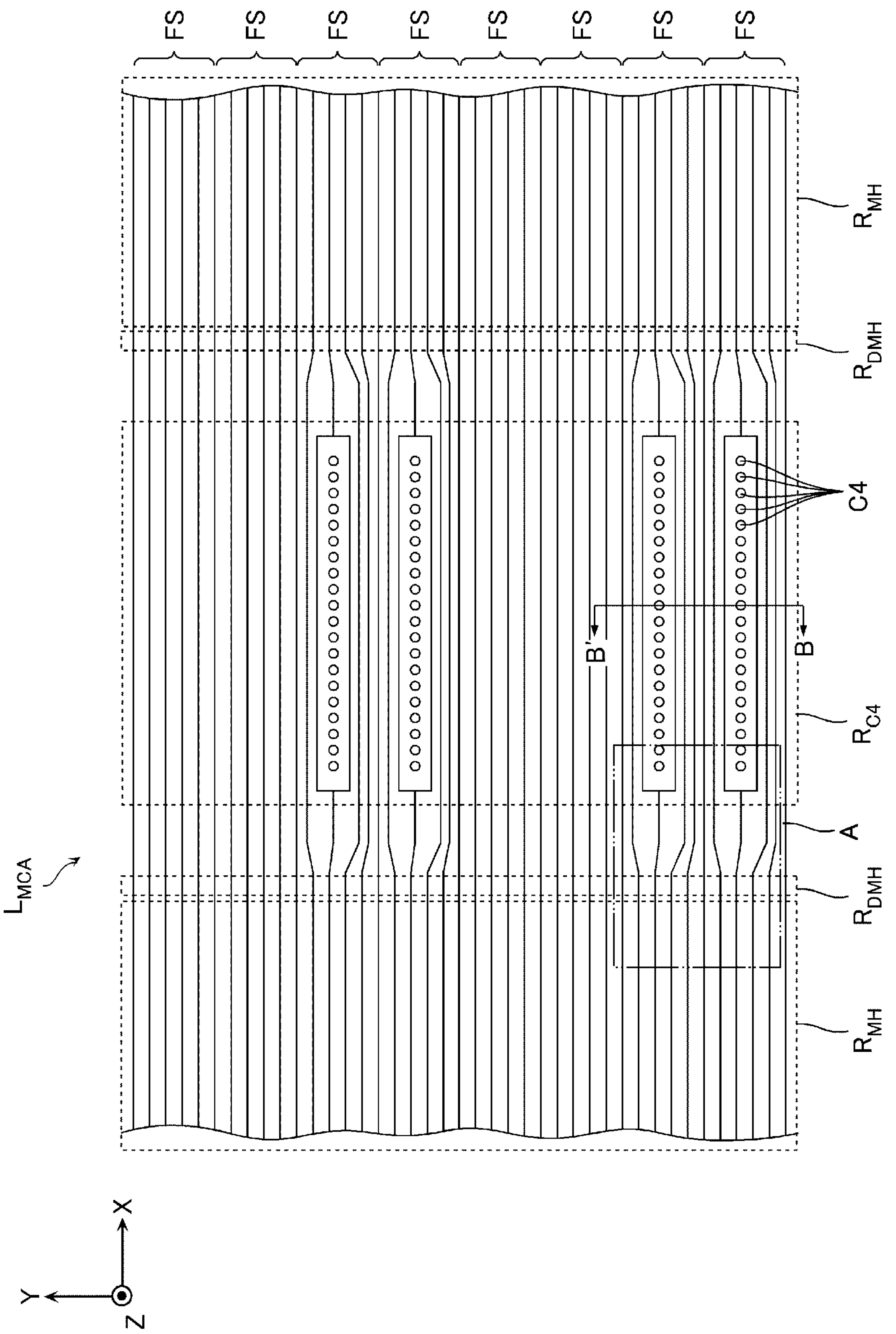
FIG. 34 is a plan view schematically showing the partial configuration of the memory die.
Figure 35:
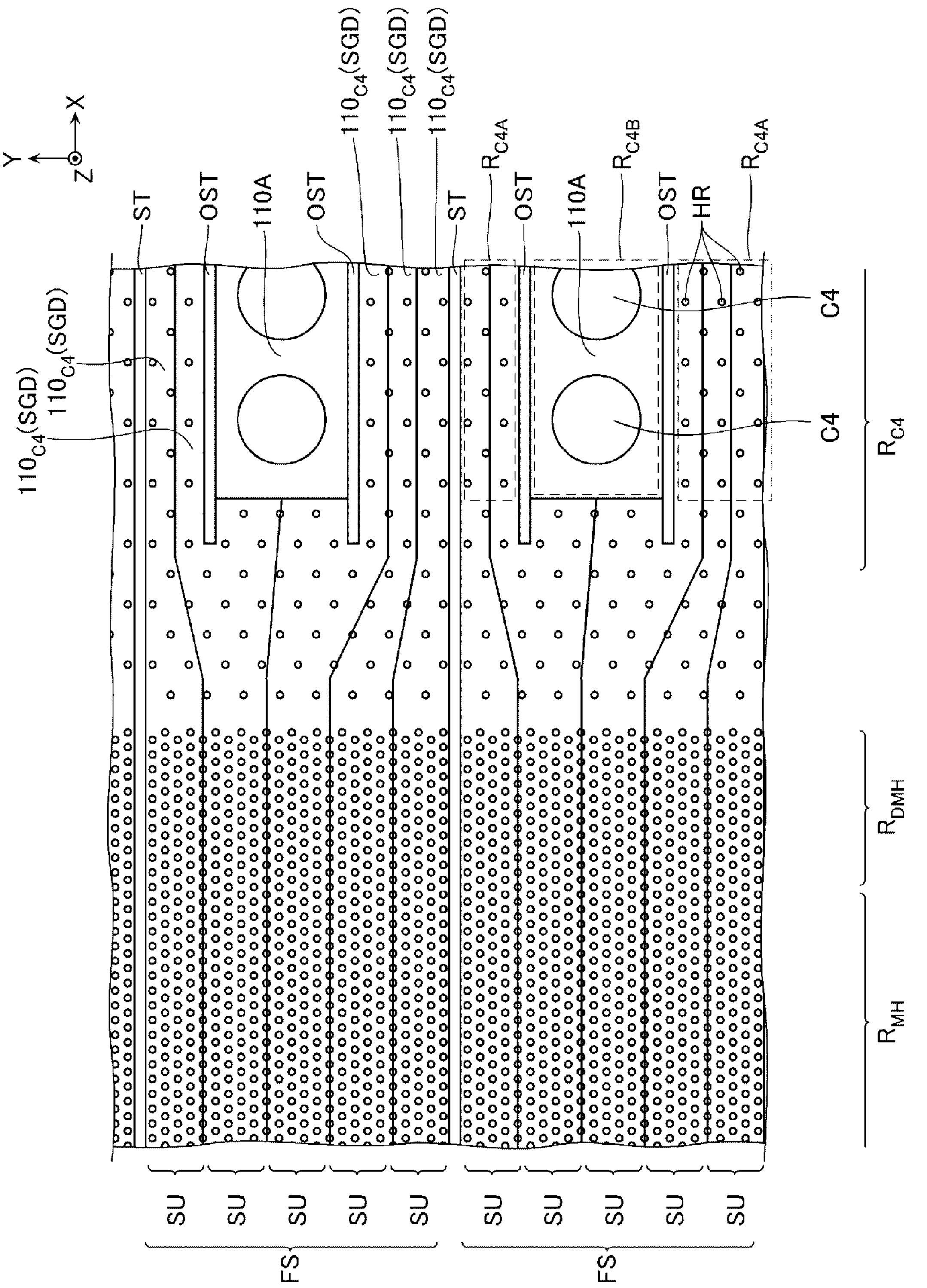
FIG. 35 is a plan view schematically showing the partial configuration of the memory die.
Figure 36:
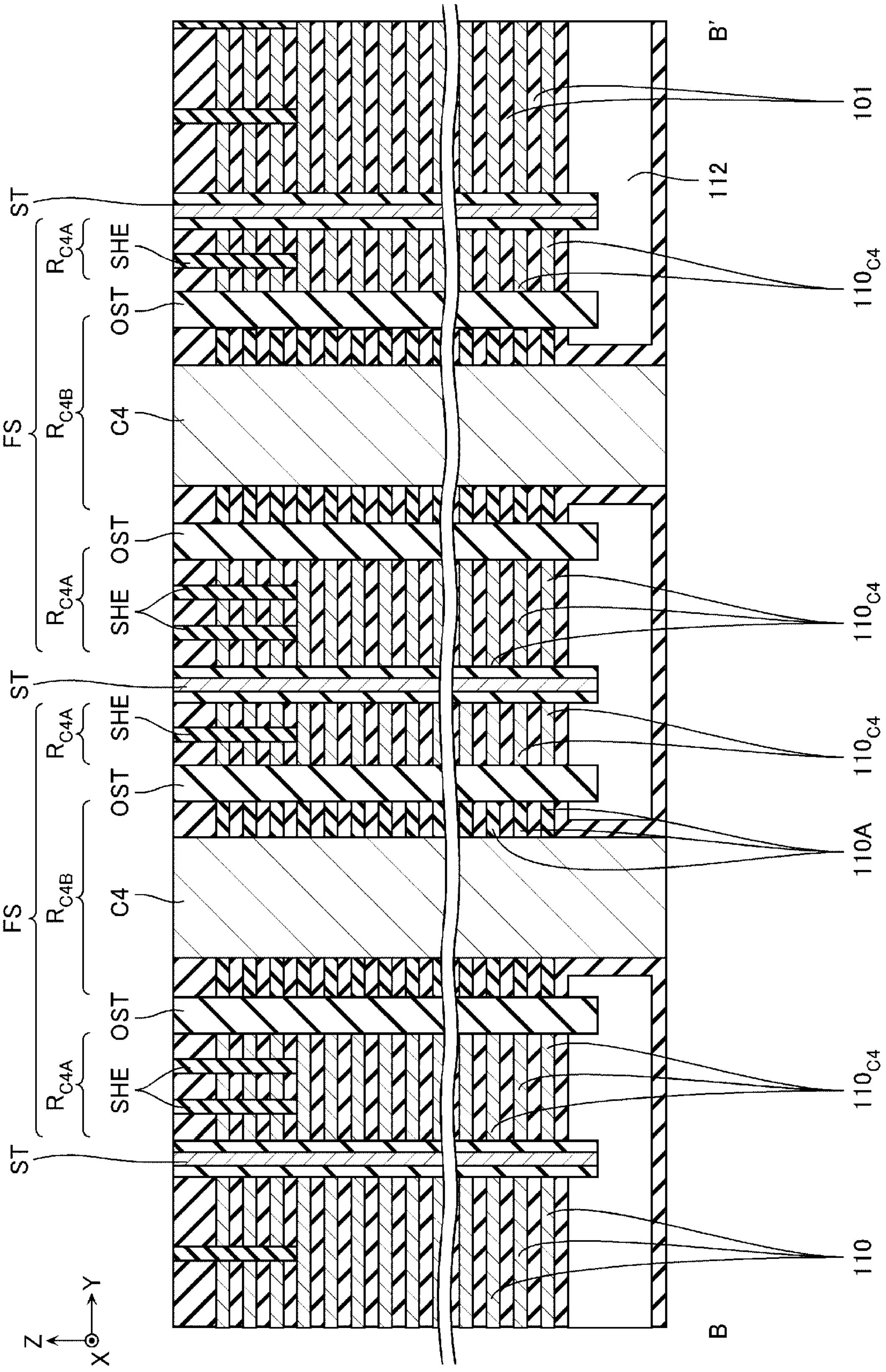
FIG. 36 is a cross-sectional view schematically showing the partial configuration of the memory die.
Figure 37:
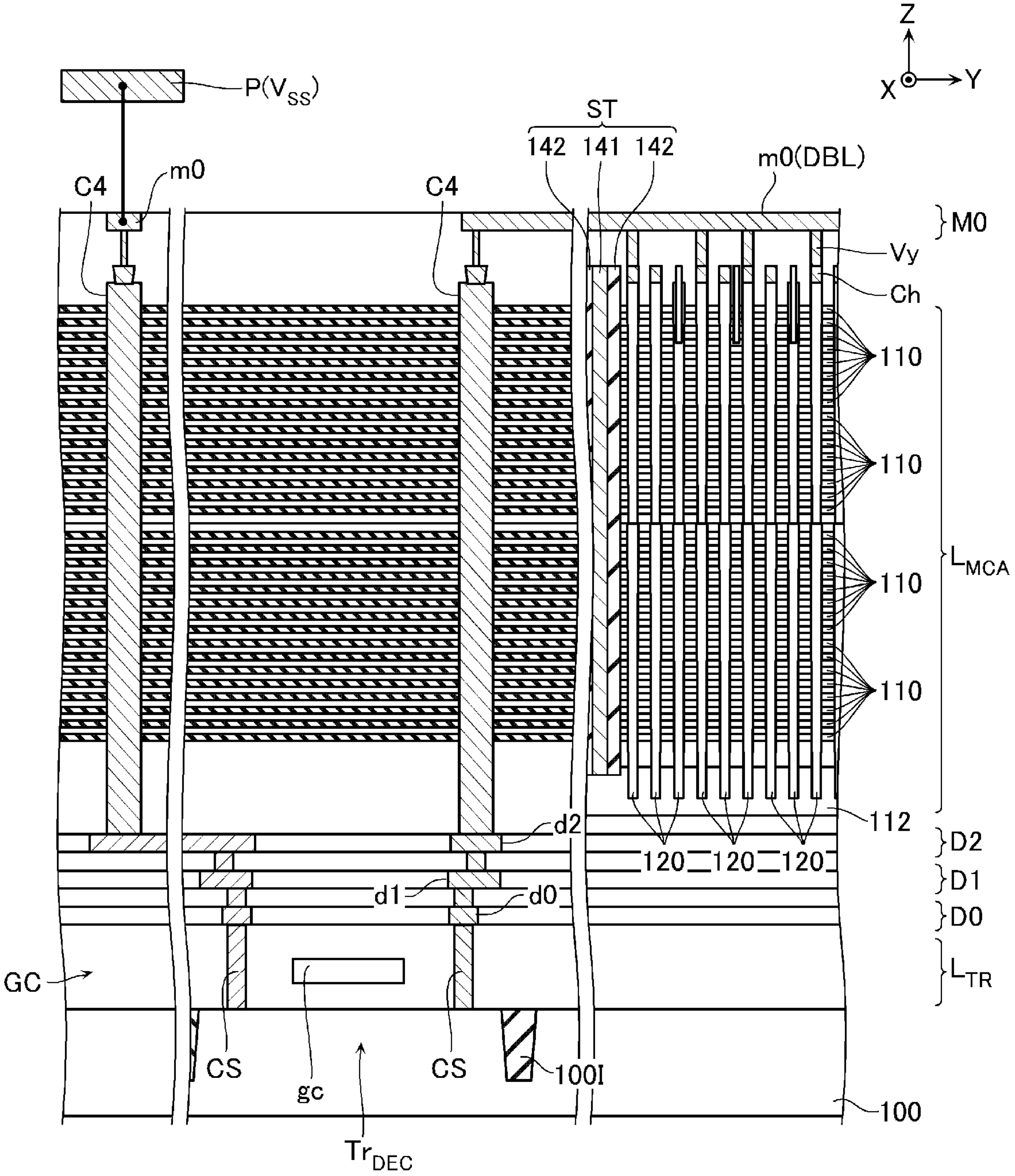
FIG. 37 is a cross-sectional view schematically showing the partial configuration of the memory die.
Figure 38:
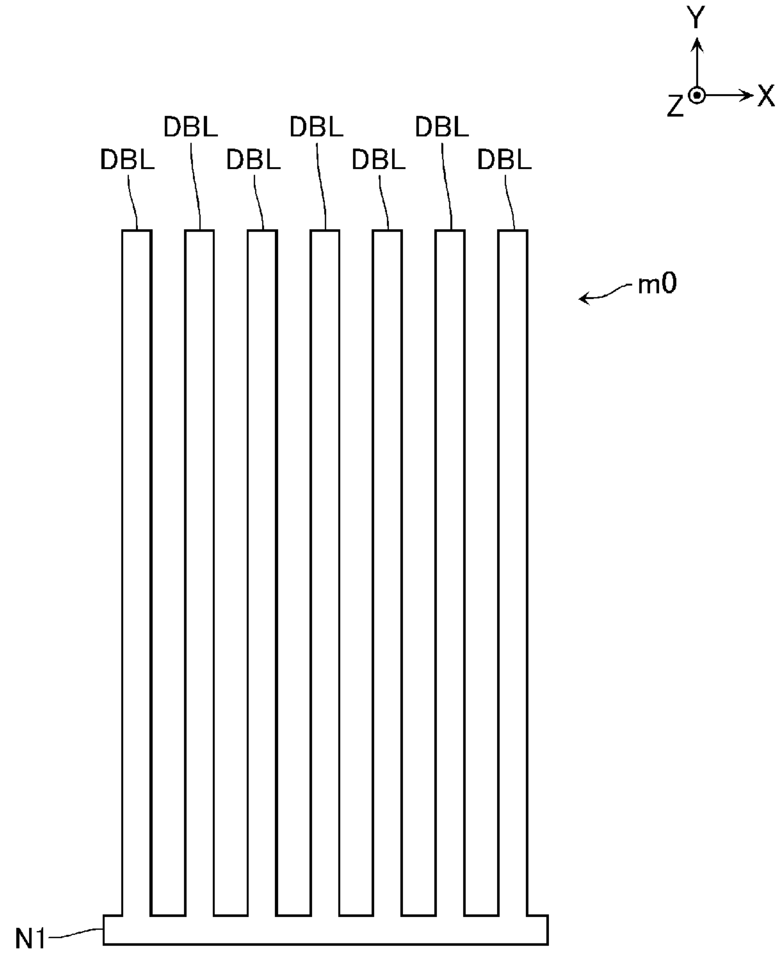
FIG. 38 is a plan view schematically showing the partial configuration of the memory die.

FIG. 31 is a schematic plan view of a memory die MD8 according to an eighth embodiment. FIG. 32 is a plan view schematically showing a partial configuration of the memory die MD8, and showing an enlarged partial configuration of FIG. 31. FIG. 33 is a cross-sectional view schematically showing the partial configuration of the memory die MD8. FIG. 34 is a plan view schematically showing the partial configuration of the memory die MD8. FIG. 35 is a plan view schematically showing a partial configuration of the memory die MD8, and is a schematic enlarged view of a portion indicated by A in FIG. 34. FIG. 36 is a cross-sectional view schematically showing a partial configuration of the memory die MD8, and showing a schematic cross section of the structure shown in FIG. 34 cut along the line B-B' and viewed along the direction of the arrow. FIG. 37 is a cross-sectional view schematically showing the partial configuration of the memory die MD8. FIG. 38 is a plan view schematically showing the partial configuration of the memory die MD8.

The memory die MD8 includes the semiconductor substrate 100, for example, as shown in FIG. 31. In the example illustrated in FIG. 31, the semiconductor substrate 100 is provided with four memory cell array regions $R_{MCA}$ arranged in the X direction and the Y direction. In addition, a peripheral region $R_P$ is provided at an end portion of the semiconductor substrate 100 in the Y direction.

The memory cell array region $R_{MCA}$ includes, for example, a plurality of finger structures FS arranged in the Y direction as shown in FIG. 32.

In addition, the memory cell array region $R_{MCA}$ includes a plurality of memory hole regions $R_{MH}$ arranged in the X direction and a plurality of contact connection regions $R_{C4}$ provided between the memory hole regions $R_{MH}$, respectively. Further, two hook-up regions $R_{HU}$ arranged in the X direction are provided at the central position of the memory cell array region $R_{MCA}$ in the X direction.

Here, as will be described later with reference to FIG. 33, in the memory die MD8 according to the eighth embodiment, the wiring layers D0 to D2 are provided below each configuration (conductive layer 110, semiconductor column 120, and the like) forming the memory cell array MCA, and the wiring layer M0 is provided above each configuration forming the memory cell array MCA. The contact connection region $R_{C4}$ electrically connects the wiring layers D0 to D2 to the wiring layer M0.

In addition, the hook-up region $R_{HU}$ electrically connects the plurality of conductive layers 110 stacked in the Z direction to the peripheral circuit PC through the wiring layer M0.

Here, the semiconductor column 120 and the bit line BL are not formed in the contact connection region $R_{C4}$ and the hook-up region $R_{HU}$. Therefore, in the eighth embodiment, a range between the end portion of the memory cell array region $R_{MCA}$ and the contact connection region $R_{C4}$, a range between the two contact connection regions $R_{C4}$ adjacent to each other in the X direction, and a range between the contact connection region Rea and the hook-up region $R_{HU}$ make up the pattern regions $R_{PTN}$ described with reference to FIG. 4. Thus, a dummy memory hole region $R_{DMH}$ is provided at the end portions of each pattern region $R_{PTN}$ on one side and the other side in the X direction.

The memory die MD8 includes, for example, the semiconductor substrate 100, a transistor layer $L_{TR}$ provided on the semiconductor substrate 100, a wiring layer D0 provided above the transistor layer $L_{TR}$, a wiring layer D1 provided above the wiring layer D0, a wiring layer D2 provided above the wiring layer D1, a memory cell array layer $L_{MCA}$ provided above the wiring layer D2, a wiring layer M0 provided above the memory cell array layer $L_{MCA}$, as shown in FIG. 33, for example.

The semiconductor substrate 100 is configured with P-type silicon (Si) containing P-type impurities such as boron (B), for example. An N-type well region containing N-type impurities such as phosphorus (P), a P-type well region containing P-type impurities such as boron (B), a semiconductor substrate region in which the N-type well region and the P-type well region are not provided, and an insulating region 1001 are provided on the front surface of the semiconductor substrate 100.

The transistor layer $L_{TR}$ includes an insulating layer (not shown) provided on the upper surface of the semiconductor substrate 100 and an electrode layer GC provided on the upper surface of the insulating layer. The electrode layer GC includes a plurality of electrodes gc that face the front surface of the semiconductor substrate 100. Each of the regions of the semiconductor substrate 100 and the plurality of electrodes gc, which are provided in the electrode layer GC, is connected to a contact electrode CS.

Each of the N-type well region, the P-type well region, and the semiconductor substrate region of the semiconductor substrate 100 functions as a channel region or the like of the plurality of transistors Tr that make up the peripheral circuit PC. The insulating layer (not shown) provided on the upper surface of the semiconductor substrate 100 functions as a gate insulating film or the like of the plurality of transistors Tr constituting the peripheral circuit PC. The plurality of electrodes gc provided in the electrode layer GC function as the gate electrodes or the like of the plurality of transistors Tr constituting the peripheral circuit PC, respectively.

The contact electrode CS extends in the Z direction and is connected at the lower end thereof to the upper surface of the semiconductor substrate 100 or the upper surface of the electrode gc. An impurity region containing N-type impurities or P-type impurities is provided at a portion at which the contact electrode CS and the semiconductor substrate 100 are connected to each other. The contact electrode CS may include, for example, a stacked film of a barrier conductive film made of titanium nitride (TiN) or the like and a metal film made of tungsten (W) or the like.

For example, as shown in FIG. 33, the wiring layer D0, the wiring layer D1, and the wiring layer D2 each include a plurality of wirings d0, wirings d1, and wirings d2. The plurality of wiring d0, wiring d1, and wiring d2 may include, for example, a stacked film of a barrier conductive film made of titanium nitride (TiN) or the like and a metal film made of tungsten (W) or the like. The plurality of wiring d0, wiring d1, and wiring d2 are electrically connected to at least one of the configuration in the memory cell array MCA and the configuration in the peripheral circuit PC.

In addition, in the memory hole region $R_{MH}$ and the dummy memory hole region $R_{DMH}$ of the memory cell array layer $L_{MCA}$, the finger structure FS has a structure as described with reference to FIGS. 4 to 8.

Meanwhile, for example, as shown in FIG. 35, in the contact connection region $R_{C4}$ of the memory cell array layer $L_{MCA}$, the finger structure FS includes two regions $R_{C4A}$ arranged in the Y direction and a region $R_{C4B}$ provided between the two regions $R_{C4A}$. The configuration in the region $R_{C4B}$ is electrically connected to the configuration provided below the memory cell array layer $L_{MCA}$ and the configuration provided above the memory cell array layer $L_{MCA}$. The configuration in the region $R_{C4A}$ causes the conductive layer 110 to be conductive between the memory hole region $R_{MH}$ provided on one side in the X direction with respect to the region $R_{C4B}$ and the memory hole region $R_{MH}$ provided on the other side in the X direction. In addition, an insulating layer OST such as silicon oxide ($SiO_2$) is provided between the regions $R_{C4A}$ and $R_{C4B}$.

The region $R_{C4A}$ includes, for example, a plurality of the conductive layers $\mathbf{110}_{C4}$ arranged in the Z direction, as shown in FIG. 36. The conductive layer $\mathbf{110}_{C4}$ is a substantially plate-shaped layer extending in the X direction. As shown in FIG. 35, the conductive layer $\mathbf{110}_{C4}$ is continuously formed to include the same material as the conductive layer 110 provided in the memory hole region $R_{MH}$. That is, the conductive layer 110 including a portion of the conductive layer $\mathbf{110}_{C4}$ disposed in the contact connection region $R_{C4}$ extends in the X direction to straddle the plurality of memory hole regions $R_{MH}$, the plurality of the dummy memory hole regions $R_{DMH}$, and the plurality of contact connection regions $R_{C4}$ arranged in the X direction. A width of at least a part of the conductive layer $\mathbf{110}_{C4}$ in the Y direction is smaller than a width of the conductive layer 110 in the memory hole region $R_{MH}$ in the Y direction. As shown in FIG. 36, the insulating layers 101 made of silicon oxide ($SiO_2$) or the like are provided between the plurality of conductive layers $\mathbf{110}_{C4}$ arranged in the Z direction.

In addition, as shown in FIG. 35, a plurality of support structures HR arranged in a predetermined pattern in the X direction and the Y direction are provided in the region $R_{C4A}$.

As shown in FIG. 36, the region $R_{C4B}$ includes, for example, a plurality of insulating layers 110A arranged in the Z direction, an insulating layer 101 provided between the plurality of insulating layers 110A, and a plurality of contact electrodes C4 extending in the Z direction.

The insulating layer 110A is a substantially plate-shaped layer extending in the X direction. The insulating layer 110A may contain silicon nitride (SiN) or the like. The side surface of the insulating layer 110A in the Y direction is in contact with the insulating layer OST. In addition, as shown in FIG. 35, the side surface of the insulating layer 110A in the X direction is in contact with the conductive layer $\mathbf{110}_{C4}$.

The plurality of contact electrodes C4 are arranged in the X direction, for example, as shown in FIG. 34. The contact electrode C4 may include, for example, a stacked film of a barrier conductive film made of titanium nitride (TiN) or the like and a metal film made of tungsten (W) or the like. For example, as shown in FIG. 36, the outer peripheral surface of the contact electrode C4 is surrounded by the insulating layer 110A and the insulating layer 101, and is connected to the insulating layer 110A and the insulating layer 101. As shown in FIG. 33, the contact electrode C4 extends in the Z direction, is connected to the wiring m0 in the wiring layer M0 through the contact electrodes Ch and Vy at the upper end, and is connected to the wiring d2 in the wiring layer D2 at the lower end.

The insulating layer OST extends in the Z direction, for example, as shown in FIG. 36. One side surface of the insulating layer OST in the Y direction is in contact with the plurality of insulating layers 110A and the plurality of insulating layers 101 arranged in the Z direction. The other side surface of the insulating layer OST in the Y direction is in contact with the plurality of conductive layers $\mathbf{110}_{C4}$ and the plurality of insulating layers 101 arranged in the Z direction. The lower end of the insulating layer OST is connected to the conductive layer 112.

For example, as shown in FIG. 33, the hook-up region $R_{HU}$ is provided with a terrace portion T of the plurality of conductive layers 110 arranged in the Z direction. The terrace portion T is a region of the upper surface of the conductive layer 110 that does not overlap with the other conductive layer 110 when viewed from above. In addition, for example, as shown in FIG. 33, the hook-up region $R_{HU}$ includes a plurality of contact electrodes CC. The contact electrode CC may include, for example, a stacked film of a barrier conductive film made of titanium nitride (TiN) or the like and a metal film made of tungsten (W) or the like. The contact electrode CC extends in the Z direction, is connected to the wiring m0 in the wiring layer M0 through the contact electrodes Ch and Vy at the upper end, and is connected to the conductive layer 110 at the lower end.

For example, as shown in FIG. 33, the plurality of wirings m0 provided in the wiring layer M0 are electrically connected to at least one of the configuration in the memory cell array layer $L_{MCA}$ and the configuration in the transistor layer $L_{TR}$. The plurality of wirings m0 may include, for example, a stacked film of a barrier conductive film made of titanium nitride (TiN) or the like and a metal film made of copper (Cu) or the like. Among the plurality of wirings m0, the wiring provided in the memory hole region $R_{MH}$ functions as the bit line BL (FIG. 3). In addition, among the plurality of wirings m0, the wiring provided in the dummy memory hole region $R_{DMH}$ functions as the dummy bit lines DBL (FIG. 3).

Here, for example, as shown in FIG. 37, the dummy bit lines DBL are electrically connected to the wiring d0, d1, and d2 provided below the memory cell array layer $L_{MCA}$ through the contact electrodes C4, and are electrically connected to the drain electrode of the transistor $Tr_{DEC}$ provided on the semiconductor substrate 100 through the wiring d0, d1, and d2. In addition, the source electrode of the transistor $Tr_{DEC}$ is connected to the contact electrode C4 through the wirings d0, d1, and d2, and is electrically connected to the external pad electrode $P(V_{SS})$ through the contact electrode C4.

In such a configuration, the node N1 may be provided in the wiring layer M0 or may be provided in any of the wiring layers D0, D1, and D2. When the node N1 is provided in the wiring layer M0, for example, as shown in FIG. 38, it is possible to form a plurality of dummy bit lines DBL and the node N1 connected to the end portions of the dummy bit lines DBL in the Y direction, as one wiring m0. According to such a configuration, the number of contact electrodes C4 for electrically connecting the plurality of dummy bit lines DBL and the transistor $Tr_{DEC}$ may be reduced.

The memory die MD8 according to the eighth embodiment has been described as including the peripheral circuit PC according to the first embodiment, but in the same configuration, it is also possible to implement the peripheral circuits PC according to the second embodiment to the seventh embodiment. Here, when the peripheral circuit PC according to the second embodiment, the fourth embodiment, or the sixth embodiment is implemented, the node N2 is implemented with any of the wirings m0, do, d1 and d2 provided in the current path between the source electrode of the transistor $Tr_{DEC2}$ and the external pad electrode P or the current measurement circuit DEC.

Ninth Embodiment

Next, as a ninth embodiment, an application example to another structure will be described. The semiconductor memory device according to the ninth embodiment includes, for example, the peripheral circuit PC according to the first embodiment.

Figure 39:
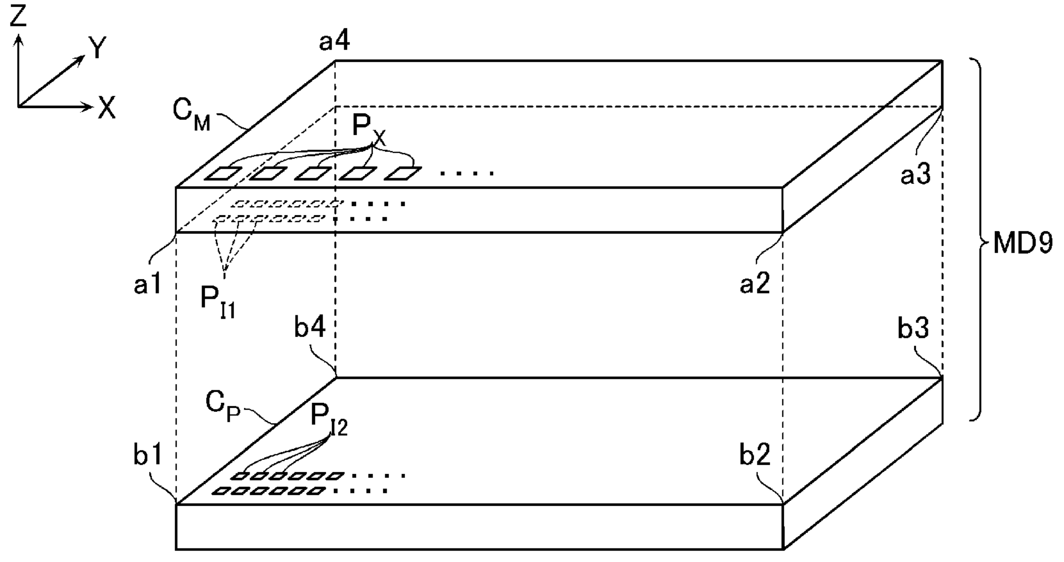
FIG. 39 is a schematic exploded perspective view of a memory die according to a ninth embodiment.
Figure 40:
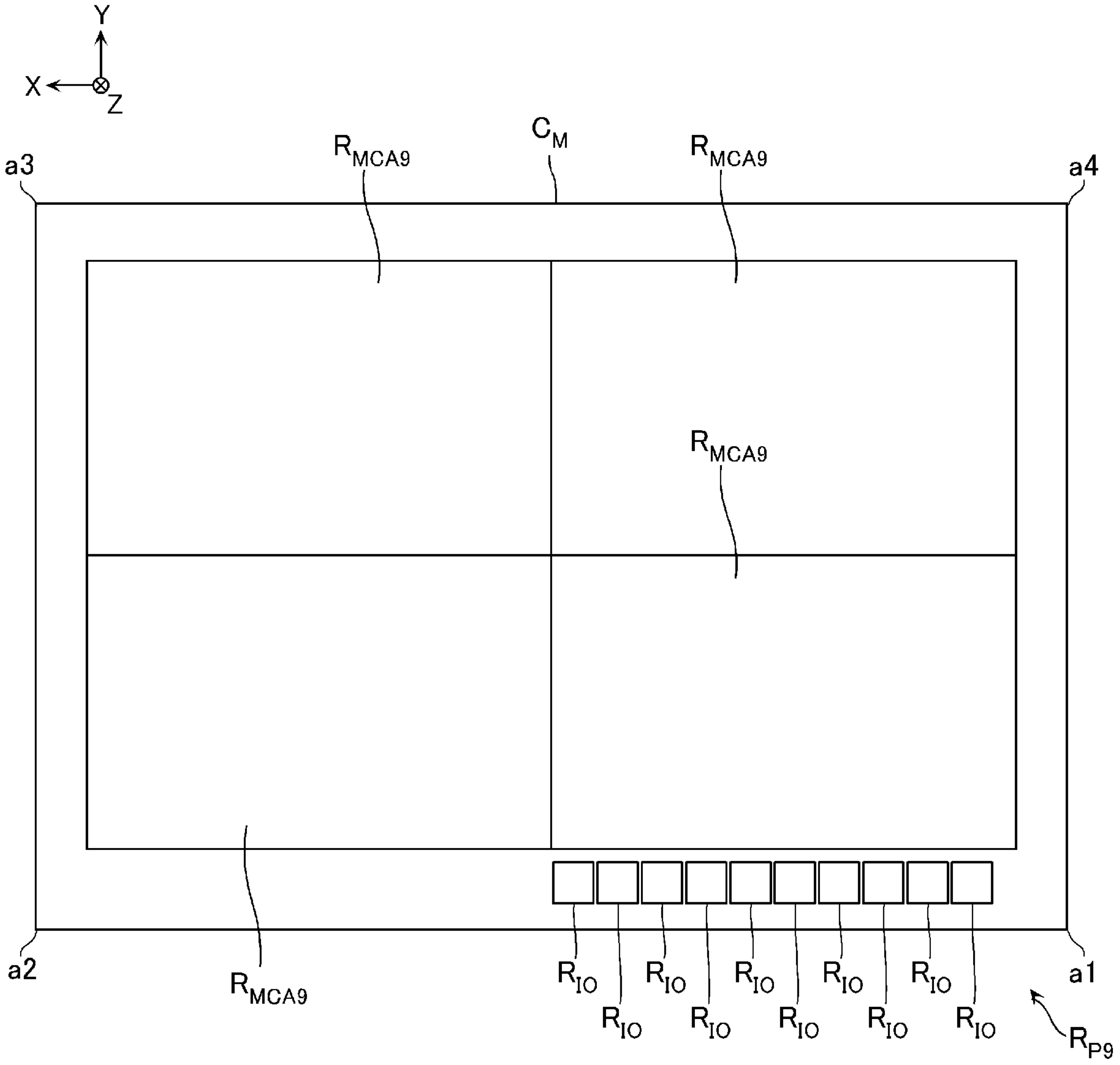
FIG. 40 is a bottom view schematically showing a partial configuration of the memory die.
Figure 41:
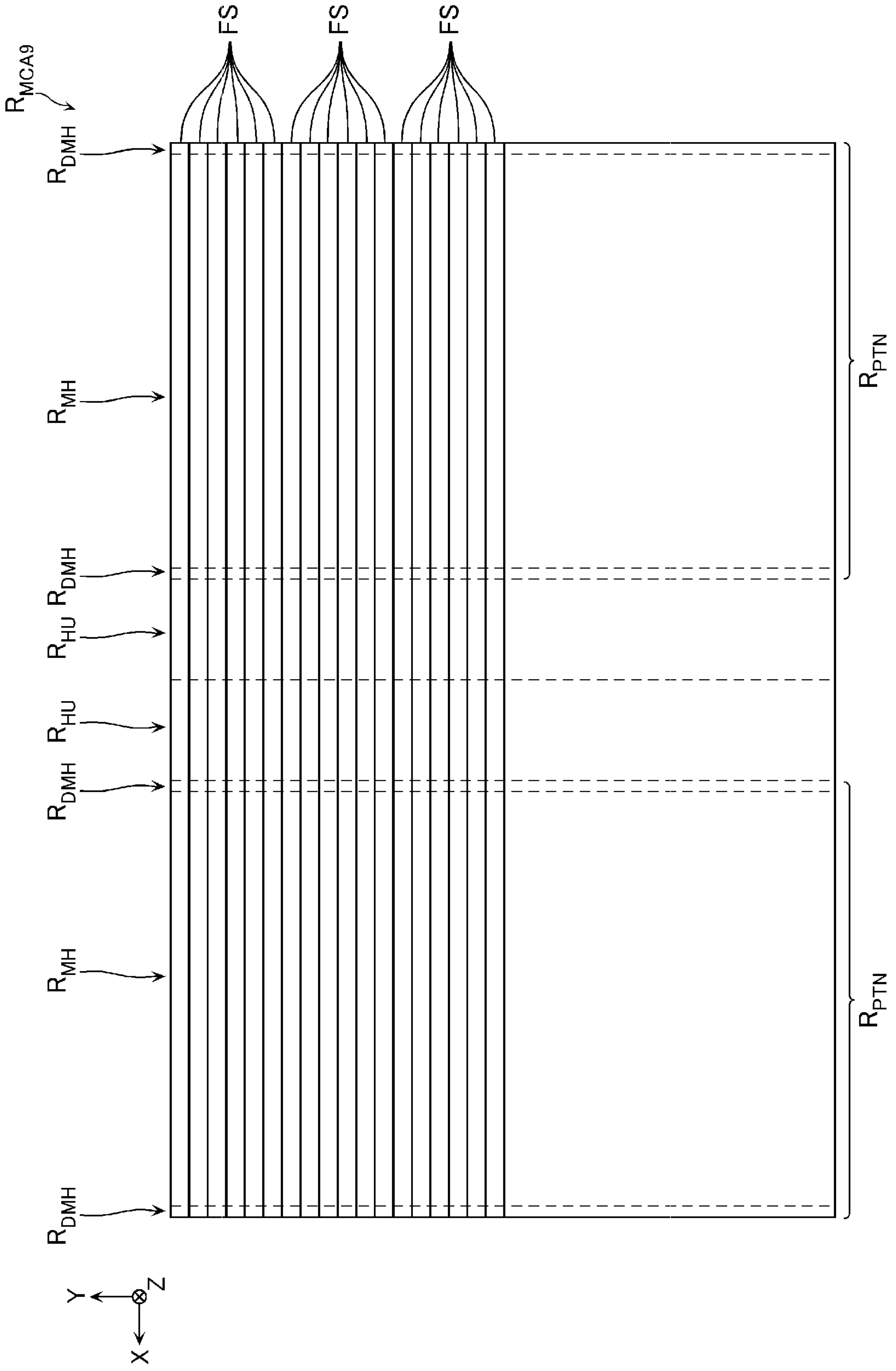
FIG. 41 is a bottom view schematically showing the partial configuration of the memory die.
Figure 42:
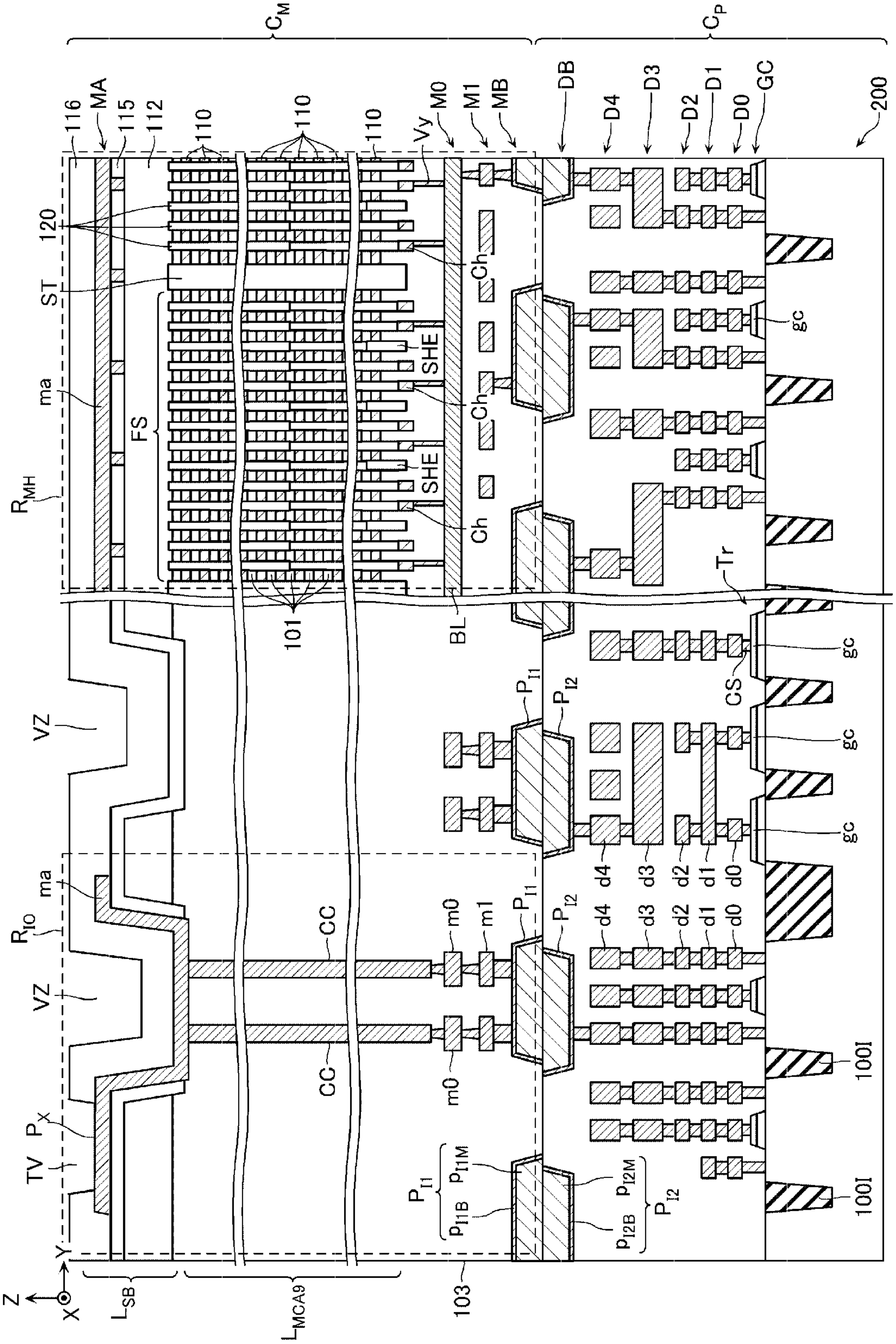
FIG. 42 is a cross-sectional view schematically showing the partial configuration of the memory die.
Figure 43:
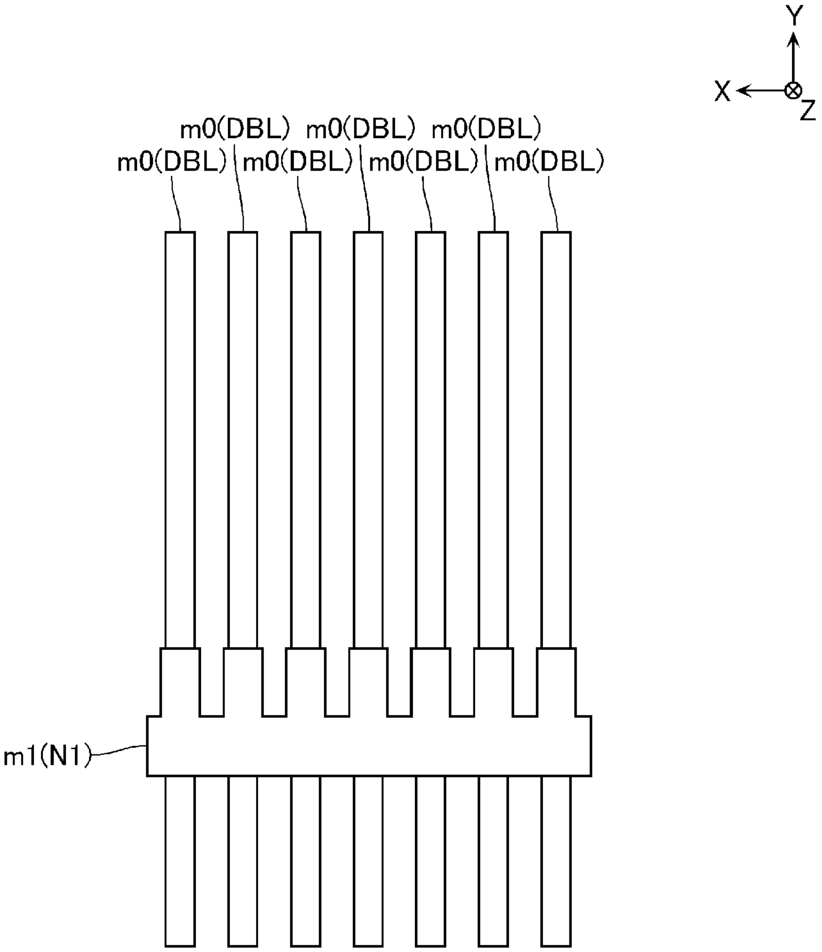
FIG. 43 is a bottom view schematically showing the partial configuration of the memory die.

FIG. 39 is a schematic exploded perspective view of a memory die MD9 according to a ninth embodiment. FIG. 40 is a bottom view schematically showing the partial configuration of the memory die MD9. FIG. 41 is a bottom view schematically showing a partial configuration of the memory die MD9, and showing an enlarged partial configuration of FIG. 40. FIG. 42 is a cross-sectional view schematically showing the partial configuration of the memory die MD9. FIG. 43 is a bottom view schematically showing the partial configuration of the memory die MD9.

As shown in FIG. 39, the memory die MD9 includes a chip $C_M$ including a configuration in the memory cell array MCA (FIG. 3) and a chip $C_P$ including a configuration in the peripheral circuit PC (FIG. 3).

A plurality of external pad electrodes $P_X$ to which a bonding wire (not shown) may be connected are provided on the upper surface of the chip $C_M$. The plurality of external pad electrodes $P_X$ correspond to the plurality of external pad electrodes P described with reference to FIG. 2 and the like. A plurality of bonding electrodes $P_{I1}$ are provided on the lower surface of the chip $C_M$. A plurality of bonding electrodes $P_{I2}$ are provided on the upper surface of the chip $C_P$. Hereinafter, regarding the chip $C_M$, a surface on which the plurality of bonding electrodes $P_{I1}$ are provided is referred to as a front surface, and a surface on which the plurality of external pad electrode $P_X$ are provided is referred to as a rear surface. Regarding the chip $C_P$, a surface on which the plurality of bonding electrodes $P_{I2}$ are provided is referred to as a front surface, and a surface on the opposite side of the front surface is referred to as a rear surface. In the example shown in drawing, the front surface of the chip $C_P$ is provided above the rear surface of the chip $C_P$, and the rear surface of the chip $C_M$ is the provided above the front surface of the chip $C_M$.

The chip $C_M$ and the chip $C_P$ are disposed so that the front surface of the chip $C_M$ faces the front surface of the chip $C_P$. The plurality of bonding electrodes $P_{I1}$ are provided respectively corresponding to the plurality of bonding electrodes $P_{I2}$, and are arranged at positions bondable to the plurality of bonding electrodes $P_{I2}$. The bonding electrodes $P_{I1}$ and the bonding electrodes $P_{I2}$ function as members for bonding the chip $C_M$ and the chip $C_P$ to each other and causing the chip $C_M$ and the chip $C_P$ to be electrically conductive to each other.

In the example of FIG. 39, corners a1, a2, a3, and a4 of the chip $C_M$ correspond to corners b1, b2, b3, and b4 of the chip $C_P$, respectively.

For example, as shown in FIG. 40, the chip $C_M$ includes four memory cell array regions $R_{MCA9}$ arranged in the X direction and the Y direction. In addition, a peripheral region $R_{P9}$ is provided at an end portion of the chip $C_M$ in the Y direction. The peripheral region $R_{P9}$ includes a plurality of input/output regions $R_{IO}$ arranged in the X direction.

The memory cell array region $R_{MCA9}$ includes, for example, a plurality of finger structures FS arranged in the Y direction as shown in FIG. 41.

Further, the memory cell array region $R_{MCA9}$ includes two memory hole regions $R_{MH}$ arranged in the X direction and two hook-up regions $R_{HU}$ provided between the memory hole regions $R_{MH}$.

In the ninth embodiment, a range between the end portion of the memory cell array region $R_{MCA}$ and the hook-up region $R_{HU}$ is a pattern region $R_{PTN}$ described with reference to FIG. 4. In addition, a dummy memory hole region $R_{DMH}$ is provided at the end portions of each pattern region $R_{PTN}$ on one side and the other side in the X direction.

As shown in FIG. 42, the chip $C_M$ includes a base structure $L_{SB}$, a memory cell array layer $L_{MCA9}$ provided below the base structure $L_{SB}$, and a plurality of wiring layers M0, M1, and MB provided below the memory cell array layer $L_{MCA9}$.

In the memory hole region $R_{MH}$ and the dummy memory hole region $R_{DMH}$ of the memory cell array layer $L_{MCA9}$, the finger structure FS has a structure as described with reference to FIGS. 4 to 8. The configuration of the finger structure FS according to the present embodiment is formed, for example, in the opposite direction to the configuration of the finger structure FS according to the eighth embodiment. In addition, in the example in FIG. 42, the conductive layer 112 is provided in the base structure $L_{SB}$ instead of the memory cell array layer $L_{MCA9}$.

The input/output region $R_{IO}$ of the memory cell array layer $L_{MCA9}$ includes an insulating layer 103 made of silicon oxide ($SiO_2$) and a contact electrode CC extending in the Z direction through the insulating layer 103.

The base structure $L_{SB}$ includes a conductive layer 112 provided on the upper surface of the memory cell array layer $L_{MCA9}$. In addition, the base structure $L_{SB}$ includes an insulating layer 115 provided on the upper surface of the conductive layer 112, a rear surface wiring layer MA provided on the upper surface of the insulating layer 115, and an insulating layer 116 provided on the upper surface of the rear surface wiring layer MA.

In the present embodiment, four conductive layers 112 are provided corresponding to four memory cell array regions $R_{MCA9}$ (FIG. 40) arranged in the X direction and the Y direction. A region VZ including no conductive layer 112 is provided at the end portions of the memory cell array region $R_{MCA9}$ in the X direction and the Y direction.

The insulating layer 115 contains, for example, silicon oxide ($SiO_2$) and the like.

The rear surface wiring layer MA includes a plurality of wirings ma. The plurality of wirings ma may include, for example, aluminum (Al) or the like.

In the memory cell array region $R_{MCA9}$, a part of the plurality of wiring ma may be electrically connected to the conductive layer 112 to function as a part of the source line SL (FIG. 3) of the NAND flash memory. Four such wirings ma may be provided corresponding to the four memory cell array regions $R_{MCA9}$ (FIG. 40) arranged in the X direction and the Y direction.

In the input/output region $R_{IO}$, a part of the plurality of wirings ma function as the external pad electrode $P_X$. A part of the wiring ma is provided above the conductive layer 112 through the insulating layer 115 and is exposed to the outside of the memory die MD9 through the opening TV provided in the insulating layer 116. In addition, the other part of the wiring ma is provided in the region VZ that does not include the conductive layer 112 and is connected to the upper surface of the insulating layer 103 and the upper end of the contact electrode CC.

The insulating layer 116 is, for example, a passivation layer including a resin material such as polyimide in the upper layer portion.

The plurality of wirings and electrodes provided in the wiring layers M0, M1, and MB are electrically connected to at least one of the configuration in the memory cell array layer $L_{MCA9}$ and the configuration in the chip $C_P$, for example.

The wiring layer M0 is configured in the same manner as the wiring layer M0 described with reference to FIG. 33 and the like.

For example, as shown in FIG. 42, the wiring layer M1 includes a plurality of wirings m1. The plurality of wirings m1 may include, for example, a stacked film of a barrier conductive film made of titanium nitride (TiN) or the like and a metal film made of tungsten (W) or the like.

The wiring layer MB includes the plurality of bonding electrodes $P_{I1}$. The plurality of bonding electrodes $P_{I1}$ may include, for example, a stacked film of a barrier conductive film $p_{I1B}$ made of titanium nitride (TiN), or the like and a metal film $p_{I1M}$ made of copper (Cu), or the like.

The chip $C_P$ includes, for example, the semiconductor substrate 200, the electrode layer GC provided above the semiconductor substrate 200, and the wiring layers D0, D1, D2, D3, D4, and DB provided above the electrode layer GC, as shown in FIG. 42.

The semiconductor substrate 200 is configured in the same manner as the semiconductor substrate 100 described with reference to FIG. 33 and the like.

The electrode layer GC is configured in the same manner as the electrode layer GC described with reference to FIG. 33 and the like.

For example, as shown in FIG. 42, a plurality of wirings and electrodes provided in the wiring layers D0, D1, D2, D3, D4, and DB are electrically connected to at least one of the configuration in the memory cell array layer $L_{MCA9}$ and the configuration in the chip $C_{P9}$.

The wiring layers D0, D1, and D2 are configured in the same manner as the wiring layers D0, D1, and D2 described with reference to FIG. 33 and the like.

Each of the wiring layers D3 and D4 includes a plurality of wirings d3 and d4. The plurality of wirings d3 and d4 may include, for example, a stacked film of a barrier conductive film made of titanium nitride (TiN) or the like and a metal film made of copper (Cu) or the like.

The wiring layer DB includes the plurality of bonding electrodes $P_{I2}$. The plurality of bonding electrodes $P_{I2}$ may include, for example, a stacked film of a barrier conductive film $P_{I2B}$ made of titanium nitride (TiN), or the like and a metal film $p_{I2M}$ made of copper (Cu), or the like.

When the metal films prim and pre of copper (Cu) or the like are used for the bonding electrode $P_{I1}$ and bonding electrode $P_{I2}$, the metal films $p_{I1M}$ and $p_{I2M}$ are integrated with each other, and it is difficult to confirm the boundary therebetween. However, the bonded structure may be confirmed by the distortion of the bonded shape of the bonding electrode $P_{I1}$ and the bonding electrode $P_{I2}$ due to the positional misalignment and the positional misalignment (generation of a discontinuous portion on the side surface) of the barrier conductive films $p_{I1B}$ and $p_{I2B}$. In addition, when the bonding electrode $P_{I1}$ and the bonding electrode $P_{I2}$ are formed by the damascene method, each of the side surfaces has a tapered shape. Therefore, in the cross section along the Z direction of the portion where the bonding electrode $P_{I1}$ and the bonding electrode $P_{I2}$ are bonded, sidewall of the portion does not have a linear shape, but the portion forms a non-rectangular shape. In addition, when each Cu forming the bonding electrode PI1 and the bonding electrode PI2 are bonded and integrated, the structure of the integrated electrode is such that the bottom surface, the side surface, and the upper surface of each Cu forming the bonding electrode $P_{I1}$ and the bonding electrode $P_{I2}$ are covered with the barrier metal. In contrast, in a wiring layer using general Cu, an insulating layer (SiN, SiCN, or the like) having an oxidation preventing function of Cu is provided on the upper surface of Cu, and the barrier metal is not provided. Therefore, it is possible to distinguish the integrated electrode from a general wiring layer even when there is no positional misalignment in bonding.

In the present embodiment, the dummy bit line DBL is electrically connected to the drain electrode of the transistor $Tr_{DEC}$ provided on the semiconductor substrate 200 through the wiring m1, the bonding electrodes $P_{I1}$ and $P_{I2}$, and the wirings d0 to d4. In addition, the source electrode of the transistor $Tr_{DEC}$ is electrically connected to the external pad electrode $P(V_{SS})$ through the wirings d0 to d4, the bonding electrodes $P_{I2}$ and $P_{I1}$, the wirings m1 and m0, and the contact electrodes CC.

In such a configuration, the node N1 may be provided in any of the wiring layers M0 and M1, or may be provided in any of the wiring layers D0 to D4. When the node N1 is provided in the wiring layer M0, for example, as described with reference to FIG. 38, it is possible to form a plurality of dummy bit lines DBL and the node N1 connected to the end portions of the dummy bit lines DBL in the Y direction as one wiring m0. According to such a configuration, the number of bonding electrodes $P_{I1}$ and $P_{I2}$ for electrically connecting the plurality of dummy bit lines DBL and the transistor $Tr_{DEC}$ may be reduced. In addition, when the node N1 is provided in the wiring layer M1, for example, as shown in FIG. 43, it is possible to provide a wiring m1 extending in the X direction and provided at a position overlapping the plurality of dummy bit lines DBL in the wiring layer M1 and to provide the wiring m1 as the node N1.

The memory die MD9 according to the ninth embodiment has been described as including the peripheral circuit PC according to the first embodiment, but it is also possible to implement the peripheral circuit PC according to the second embodiment to the seventh embodiment with the same configuration. Here, when the peripheral circuit PC according to the second embodiment, the fourth embodiment, or the sixth embodiment is implemented, the node N2 is implemented with any of the wirings m0, m1, d0, d1, d2, d3, and d4 provided in the current path between the source electrode of the transistor $Tr_{DEC2}$ and the external pad electrode $P_X$ or the current measurement circuit DEC.

Other Embodiments

Hitherto, the semiconductor memory device according to the first embodiment to ninth embodiment has been described. However, the semiconductor memory device according to these embodiments is merely an example, and a specific configuration, operation, and the like can be appropriately adjusted.

For example, in the first embodiment to ninth embodiment, the number of conductive layers 110 arranged in the Z direction, the number of semiconductor columns 120 provided in the finger structure FS, and the like may be appropriately adjusted. In addition, the number and the like of the wiring layers (for example, the wiring layers D0, D1, D2, and M0 shown in FIG. 33 or the wiring layers D0, D1, D2, D3, D4, DB, M0, M1, and MB shown in FIG. 42) provided in the memory dies MD, MD8, and MD9 according to the first embodiment to ninth embodiment may also be appropriately adjusted.

Further, for example, in the configuration as shown in FIG. 11, FIG. 26, or FIG. 28, the plurality of dummy bit lines DBL may be divided into a plurality of groups, and the dummy bit lines DBL belonging to the common group may be electrically connected to the common node N1 and the transistor $Tr_{DEC}$. As a result, it is possible to reduce the circuit area while reducing the maximum value of the current flowing through one transistor $Tr_{DEC}$.

In addition, for example, in the configuration as shown in FIG. 11 or any one of FIGS. 25 to 29, it is also possible to employ a configuration in which a plurality of dummy bit lines DBL are divided into a plurality of groups, and the signals of the transistors $Tr_{DEC}$ and $Tr_{DEC2}$ may be independently controlled between different groups. Therefore, it is possible to specify a defective portion relatively easily.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
- a substrate;
- a plurality of conductive layers stacked in a stacking direction intersecting a surface of the substrate, and extending in a first direction intersecting the stacking direction;
- a plurality of semiconductor columns extending in the stacking direction and facing the plurality of conductive layers;
- a plurality of charge storage films provided between the plurality of conductive layers and the plurality of semiconductor columns;
- a plurality of first and second wirings provided on one side in the stacking direction with respect to the plurality of conductive layers, arranged in the first direction, and electrically connected to the plurality of semiconductor columns;
- a plurality of sense amplifier units electrically connected to the plurality of first wirings;
- a memory hole region in which the plurality of semiconductor columns are provided in a regular pattern; and
- a node electrically and commonly connected to the plurality of second wirings,
- wherein one of the plurality of sense amplifier units is electrically connected to K1 first wirings (where K1 is an integer of 1 or more), and
- the node is electrically connected to K2 second wirings (where K2 is an integer of 2 or more and is greater than K1), and
- the memory hole region includes
  - a first range provided between a first boundary line provided on an inner side of the memory hole region from one end portion of the memory hole region in the first direction, and a second boundary line provided on an inner side of the memory hole region from the other end portion of the memory hole region in the first direction,
  - a second range provided between the one end portion of the memory hole region in the first direction and the first boundary line, and
  - a third range provided between the other end portion of the memory hole region in the first direction and the second boundary line, and
- the plurality of first wirings are provided in the first range, and the plurality of second wirings are provided in one or both of the second range and the third range.

2. The semiconductor memory device according to claim 1,
- wherein the node is electrically connected to the plurality of second wirings without a switching element therebetween.

3. The semiconductor memory device according to claim 1, further comprising:
- a first transistor that is electrically and commonly connected to the plurality of second wirings through the node.

4. The semiconductor memory device according to claim 3, further comprising:
- an external pad electrode that is electrically connected to the plurality of second wirings through the first transistor.

5. The semiconductor memory device according to claim 4,
- wherein the external pad electrode is used to supply a ground voltage.

6. The semiconductor memory device according to claim 4,
- wherein a voltage of an internal node other than the node is measurable through the external pad electrode.

7. The semiconductor memory device according to claim 3, further comprising:
- a current measurement circuit that is electrically connected to the plurality of second wirings through the first transistor.

8. The semiconductor memory device according to claim 7,
- wherein each of the plurality of sense amplifier units includes a data latch circuit, and
- the current measurement circuit does not include a data latch circuit.

9. The semiconductor memory device according to claim 1, further comprising:
- a plurality of second transistors electrically connected to the plurality of second wirings,
- wherein the node is electrically and commonly connected to the plurality of second wirings through the plurality of second transistors.

10. The semiconductor memory device according to claim 9,
- wherein gate electrodes of the plurality of second transistors are electrically and commonly connected.

11. The semiconductor memory device according to claim 9, further comprising:
- an external pad electrode that is electrically connected to the plurality of second wirings through the plurality of second transistors.

12. The semiconductor memory device according to claim 11,
- wherein the external pad electrode is used to supply a ground voltage.

13. The semiconductor memory device according to claim 11,
- wherein a voltage of an internal node other than the node is measurable through the external pad electrode.

14. The semiconductor memory device according to claim 9, further comprising:

a current measurement circuit that is electrically connected to the plurality of second wirings through the plurality of second transistors.

15. The semiconductor memory device according to claim 14, wherein each of the plurality of sense amplifier units includes a data latch circuit, and the current measurement circuit does not include a data latch circuit.

16. The semiconductor memory device according to claim 1, further comprising:

a plurality of contact electrodes that extend in the stacking direction and are connected to the plurality of conductive layers, wherein the plurality of second wirings are provided between the plurality of first wirings and the plurality of contact electrodes when viewed from above.

17. A semiconductor memory device comprising:

a substrate;

a plurality of conductive layers stacked in a stacking direction intersecting a surface of the substrate, and extending in a first direction intersecting the stacking direction;

a plurality of semiconductor columns extending in the stacking direction and facing the plurality of conductive layers;

a plurality of charge storage films provided between the plurality of conductive layers and the plurality of semiconductor columns;

a plurality of first and second wirings provided on one side in the stacking direction with respect to the plurality of conductive layers, arranged in the first direction, and electrically connected to the plurality of semiconductor columns;

a sense amplifier unit electrically connected to one of the first wirings; and a current measurement circuit electrically connected to one of the second wirings, wherein the sense amplifier unit includes a data latch circuit, and the current measurement circuit does not include a data latch circuit.

18. A semiconductor memory device comprising:

a substrate;

a plurality of conductive layers stacked in a stacking direction intersecting a surface of the substrate, and extending in a first direction intersecting the stacking direction;

a plurality of semiconductor columns extending in the stacking direction and facing the plurality of conductive layers;

a plurality of charge storage films provided between the plurality of conductive layers and the plurality of semiconductor columns;

a plurality of wirings provided on one side in the stacking direction with respect to the plurality of conductive layers, arranged in the first direction, and electrically connected to the plurality of semiconductor columns;

a memory hole region in which the plurality of semiconductor columns are provided in a regular pattern; and a node electrically and commonly connected to a subset of the plurality of wirings, wherein the node is electrically connected to the plurality of wirings of the subset without providing a switching element therebetween, and the memory hole region includes a first range provided between a first boundary line provided on an inner side of the memory hole region from one end portion of the memory hole region in the first direction, and a second boundary line provided on an inner side of the memory hole region from the other end portion of the memory hole region in the first direction, a second range provided between the one end portion of the memory hole region in the first direction and the first boundary line, and a third range provided between the other end portion of the memory hole region in the first direction and the second boundary line, and the subset of the plurality of wirings is provided in one or both of the second range and the third range and another subset of the plurality of wirings is provided in the first range.

19. The semiconductor memory device according to claim 18, further comprising:

a plurality of sense amplifier units electrically connected to said another subset of the plurality of wirings.

* * * * *